US012613618B2

(12) United States Patent
Alberry et al.

(10) Patent No.: US 12,613,618 B2
(45) Date of Patent: *Apr. 28, 2026

(54) METHOD AND SYSTEM FOR DISPLAYING MULTIPLE ROUTING DIAGRAMS

(71) Applicant: Mitchell Repair Information Company, LLC, San Diego, CA (US)

(72) Inventors: Michel B. Alberry, Lakeside, CA (US); Lester B. Johnson, Escondido, CA (US); Thomas A. Southward, San Diego, CA (US); Thomas W. Tipps, San Diego, CA (US); Michael S. Knize, Oceanside, CA (US); John P. McGraw, Cardiff by the Sea, CA (US); Robert Pilz, Santee, CA (US)

(73) Assignee: Mitchell Repair Information Company, LLC, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/325,166

(22) Filed: May 19, 2021

(65) Prior Publication Data

US 2022/0374114 A1 Nov. 24, 2022

(51) Int. Cl.
*G06F 3/0484* (2022.01)
*G06F 3/04817* (2022.01)
(Continued)

(52) U.S. Cl.
CPC ........ *G06F 3/0484* (2013.01); *G06F 3/04817* (2013.01); *G06F 3/0482* (2013.01);
(Continued)

(58) Field of Classification Search
CPC .. G06F 3/0484; G06F 3/04817; G06F 3/0482; G06F 30/18; G06F 30/30; G06T 11/206
See application file for complete search history.

(56) References Cited

U.S. PATENT DOCUMENTS 5,831,618 A * 11/1998 Fuji .......................... G06F 9/451
715/969
6,606,731 B1 * 8/2003 Baum .................. G06V 30/422
716/139
(Continued)

FOREIGN PATENT DOCUMENTS

EP 187860 A2 12/2007
EP 1868146 A1 12/2007

OTHER PUBLICATIONS

Charras, Jean-Pierre, et al; "KiCAD—Eeschema", Apr. 27, 2021, all pages (Year: 2021).*

(Continued)

*Primary Examiner* — Irete F Ehichioya
(74) *Attorney, Agent, or Firm* — McDonnell Boehnen Hulbert & Berghoff LLP

(57) ABSTRACT

A method and computing system operable for displaying a first routing diagram on a display. The first routing diagram is a member of a first set of routing diagrams that includes multiple different routing diagrams. Displaying the first routing diagram includes displaying a user-selectable control and a first portion of a particular routable component within the first routing diagram. The user-selectable control indicates that the particular routable component continues on a second routing diagram. An additional function include determining, by one or more processors, a selection of the user-selectable control occurs while the first routing diagram is displayed on the display. A further function includes displaying the second routing diagram on the display in response to determining the selection of the user-selectable control occurs while the first routing diagram is displayed on the display. Displaying the second routing diagram includes displaying a second portion of the particular routable component.

38 Claims, 25 Drawing Sheets

(51) Int. Cl.

| | |
|---|---|
| *G06F 3/0482* | (2013.01) |
| *G06F 30/18* | (2020.01) |
| *G06T 11/26* | (2026.01) |
| *G06F 30/30* | (2020.01) |

(52) U.S. Cl.

CPC .............. *G06F 30/18* (2020.01); *G06T 11/26* (2026.01); *G06F 30/30* (2020.01)

(56) References Cited

U.S. PATENT DOCUMENTS

| | | | | |
|---|---|---|---|---|
| 7,149,975 | B1* | 12/2006 | Johnson | .................. H04L 41/22 |
| | | | | 709/224 |
| 7,212,936 | B2* | 5/2007 | Baum | ..................... G06F 30/18 |
| | | | | 702/92 |
| 7,499,601 | B2 | 3/2009 | Nuno et al. | |
| 7,865,278 | B2 | 1/2011 | Underdal et al. | |
| 8,274,511 | B2 | 9/2012 | Sato | |
| 8,924,913 | B1 | 12/2014 | Goh et al. | |
| 9,881,119 | B1 | 1/2018 | Kukal et al. | |
| 11,210,434 | B2 | 12/2021 | Wolfe et al. | |
| 2003/0025734 | A1 | 2/2003 | Boose et al. | |
| 2004/0243944 | A1 | 12/2004 | Sabiers et al. | |
| 2006/0142910 | A1 | 6/2006 | Grier et al. | |
| 2006/0161410 | A1 | 7/2006 | Hamatani | |
| 2006/0238036 | A1 | 10/2006 | Nagata et al. | |
| 2007/0204254 | A1* | 8/2007 | Kumagai | ................ G06F 30/30 |
| | | | | 716/139 |
| 2007/0208840 | A1* | 9/2007 | Mcconville | ............. H04L 41/22 |
| | | | | 715/764 |
| 2007/0271499 | A1 | 11/2007 | Feng et al. | |
| 2007/0294002 | A1 | 12/2007 | Underdal et al. | |
| 2009/0146997 | A1 | 6/2009 | Sato | |
| 2011/0035721 | A1 | 2/2011 | Shimoyama et al. | |
| 2011/0167401 | A1* | 7/2011 | Boose | ..................... G06F 30/39 |
| | | | | 716/136 |
| 2012/0179977 | A1* | 7/2012 | Rounding | ............. G06F 3/0484 |
| | | | | 715/750 |
| 2012/0256925 | A1 | 10/2012 | Stannard et al. | |
| 2012/0304105 | A1* | 11/2012 | Rosman Lafever | .... G06F 30/15 |
| | | | | 715/781 |
| 2013/0031509 | A1* | 1/2013 | Curtis | ................... G06F 30/394 |
| | | | | 715/810 |
| 2014/0169217 | A1* | 6/2014 | Coroy | ..................... H04L 41/12 |
| | | | | 370/254 |
| 2016/0012179 | A1 | 1/2016 | Zoukari | |
| 2017/0032071 | A1 | 2/2017 | Jummel | |
| 2017/0177757 | A1 | 6/2017 | Thorley et al. | |
| 2018/0095638 | A1 | 4/2018 | Merg et al. | |
| 2019/0042684 | A1 | 2/2019 | Toub et al. | |
| 2019/0108294 | A1 | 4/2019 | Anderson et al. | |
| 2019/0114387 | A1 | 4/2019 | Wolfe et al. | |
| 2019/0384885 | A1 | 12/2019 | Lau et al. | |
| 2020/0057429 | A1* | 2/2020 | Takao | ..................... G06F 16/54 |
| 2020/0184745 | A1 | 6/2020 | Merg et al. | |
| 2021/0004585 | A1 | 1/2021 | Alberry et al. | |
| 2024/0119753 | A1 | 4/2024 | Alberry et al. | |
| 2025/0225811 | A1 | 7/2025 | Alberry et al. | |

OTHER PUBLICATIONS

Quadcept, "Schematic Capture: Placing Labels", p. 1-6, Jul. 27, 2017 https://web.archive.org/web/20170727233759/https://www.quadcept.com/en/manual/schematic/post-100.

Donbavand, "Microsoft Excel—setting same zoom level for several worksheets", Apr. 5, 2014, 1 page https://ifonlyidknownthat.wordpress.com/2014/04/05/microsoft-excel-setting-same-zoom-level-for-several-worksheets/.

Microsoft Excel 2019, Screenshots SS0-7, 2019.

Spataro, Jared, "Office 2019 is now available for Windows and Mac", Microsoft, Sep. 24, 2018, 5 pages.

Adobe, "Adjusting PDF views", Jun. 2, 2018, 13 pages https://web.archive.org/web/20180602214401/https://helpx.adobe.com/acrobat/using/adjusting-pdf-views.html.

World Wide Web Consortium (W3C); Scalable Vector Graphics (SVG) 2, W3C Candidate Recommendation Oct. 4, 2018, Chapter 8: Coordinate Systems, Transformations and Units; downloaded from the world wide web at https://www.w3.org/TR/SVG/coords.html#ViewBoxAttribute on Jun. 9, 2019, pp. 1-21.

Michael, Research as a Hobby; How to Display Additional Information by Clicking Image Components? Easy and for Free (WP, SVG); Oct. 18, 2018; pp. 1-10 (14 total pages).

Bracey, Kezz; SVG Viewport and viewBox (For Complete Beginners), Mar. 29, 2018; pp. 1-6 (11 total pages).

w3schools.com; SVG Stroke Properties; pp. 1-3 (6 total pages).

Wikipedia; Web Service; downloaded from the world wide web at https://en.wikipedia.org/wiki/Web_service on Jun. 19, 2019; pp. 1-3 (4 total pages).

alldata diy.com; Access Factory Repair Information, Beyond the Printed Manual; downloaded from the world wide web at http://web.archive.org/web/20190402040954/http://www.alldaydatadiy.com/about_alldate/repair.html; archived Apr. 2, 2019; p. 1 (2 total pages).

Alldata LLC; All Data—OEM Automotive Mechanical Repair Information, Jumpstart your Shop's Success with ALLDATA Repair; downloaded from the world wide web at http://web.archive.org/web/20190208023756/https://www.alldata.com/alldata-repair; archived Feb. 8, 2019; pp. 1-2 (5 total pages).

Alldata, Screenshots and transcript from the Google Youtube video titled "Alldata Repair & Collision: Interactive Color Diagrams (Non OE)", a Youtube video online at https://www.youtube.com/watch?=JUdYb_4ZhKw as of Sep. 8, 2017.

Alldata; Screenshots of Youtube video titled "Alldata Repair & Collision: Interactive Color Diagrams (Non OE)" captured from Internet at https://www.youtube.com/watch?=JUdYb_4ZhKw; video online as of Sep. 8, 2017.

Altium, "AD101: Altium Essentials", Jul. 2013, 630 pages, contained in 6 separate PDF files.

\* cited by examiner

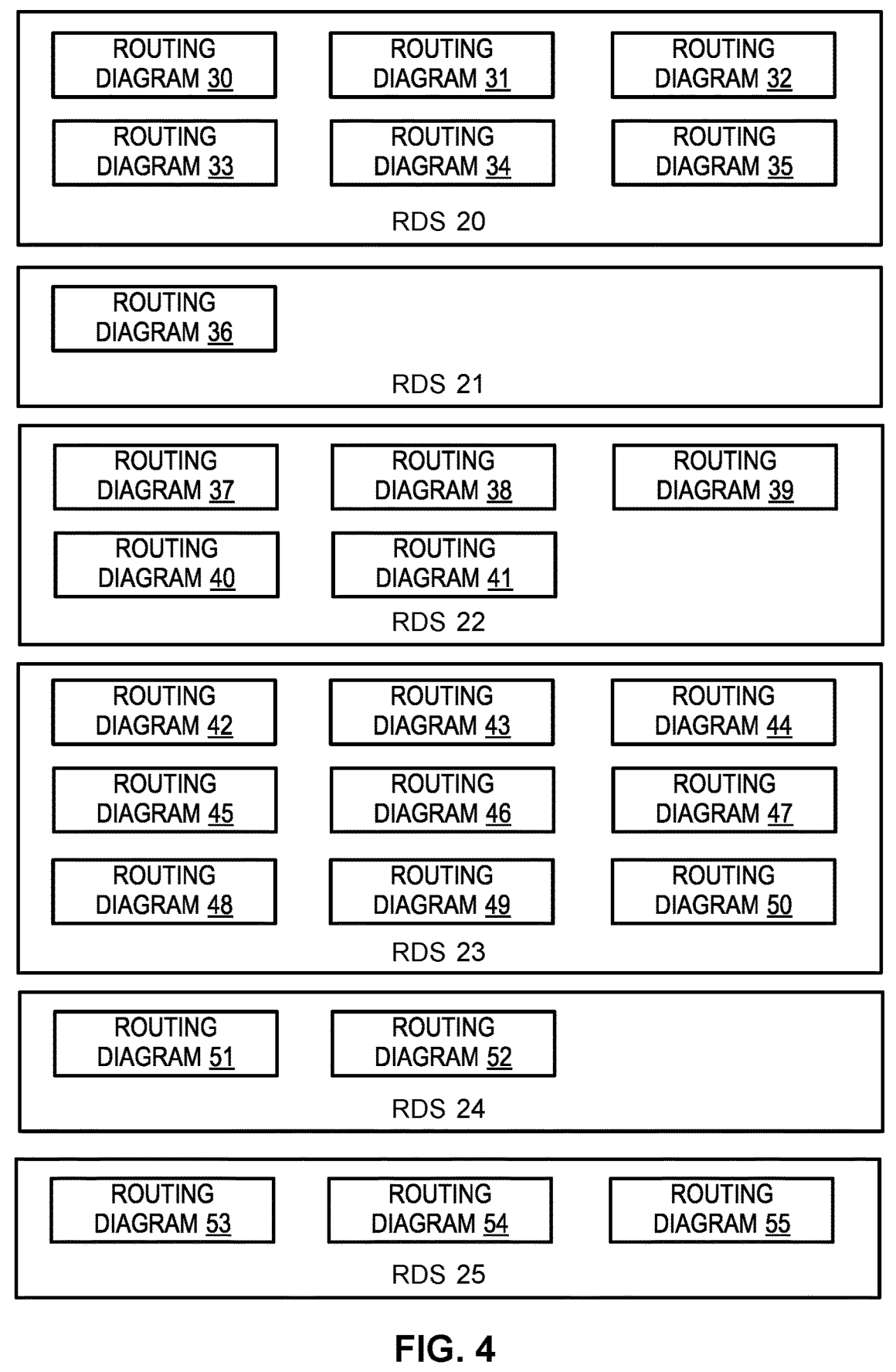

| ROUTING DIAGRAM 30 | ROUTING DIAGRAM 31 | ROUTING DIAGRAM 32 |
|---|---|---|
| ROUTING DIAGRAM 33 | ROUTING DIAGRAM 34 | ROUTING DIAGRAM 35 |

RDS 20

| ROUTING DIAGRAM 36 | | |
|---|---|---|

RDS 21

| ROUTING DIAGRAM 37 | ROUTING DIAGRAM 38 | ROUTING DIAGRAM 39 |
|---|---|---|
| ROUTING DIAGRAM 40 | ROUTING DIAGRAM 41 | |

RDS 22

| ROUTING DIAGRAM 42 | ROUTING DIAGRAM 43 | ROUTING DIAGRAM 44 |
|---|---|---|
| ROUTING DIAGRAM 45 | ROUTING DIAGRAM 46 | ROUTING DIAGRAM 47 |
| ROUTING DIAGRAM 48 | ROUTING DIAGRAM 49 | ROUTING DIAGRAM 50 |

RDS 23

| ROUTING DIAGRAM 51 | ROUTING DIAGRAM 52 | |
|---|---|---|

RDS 24

| ROUTING DIAGRAM 53 | ROUTING DIAGRAM 54 | ROUTING DIAGRAM 55 |
|---|---|---|

RDS 25

FIG. 4

POWER SUPPLY 86

HOUSING 88

PROCESSOR 81

COMPUTER-READABLE MEMORY 82

USER INTERFACE 83

DISPLAY 84

~ 87

COMMUNICATION INTERFACE 85

~ 89

COMPUTING SYSTEM 80

APPLICATION 96

CRPI 90

NAVIGATION SEQUENCE DATA 93

HIGHLIGHT STATUS DATA 94

ROUTING DIAGRAM 91

METADATA 92

DEVICE SELECTION DATA 95

COMPUTER-READABLE MEMORY 82

Figure 26:
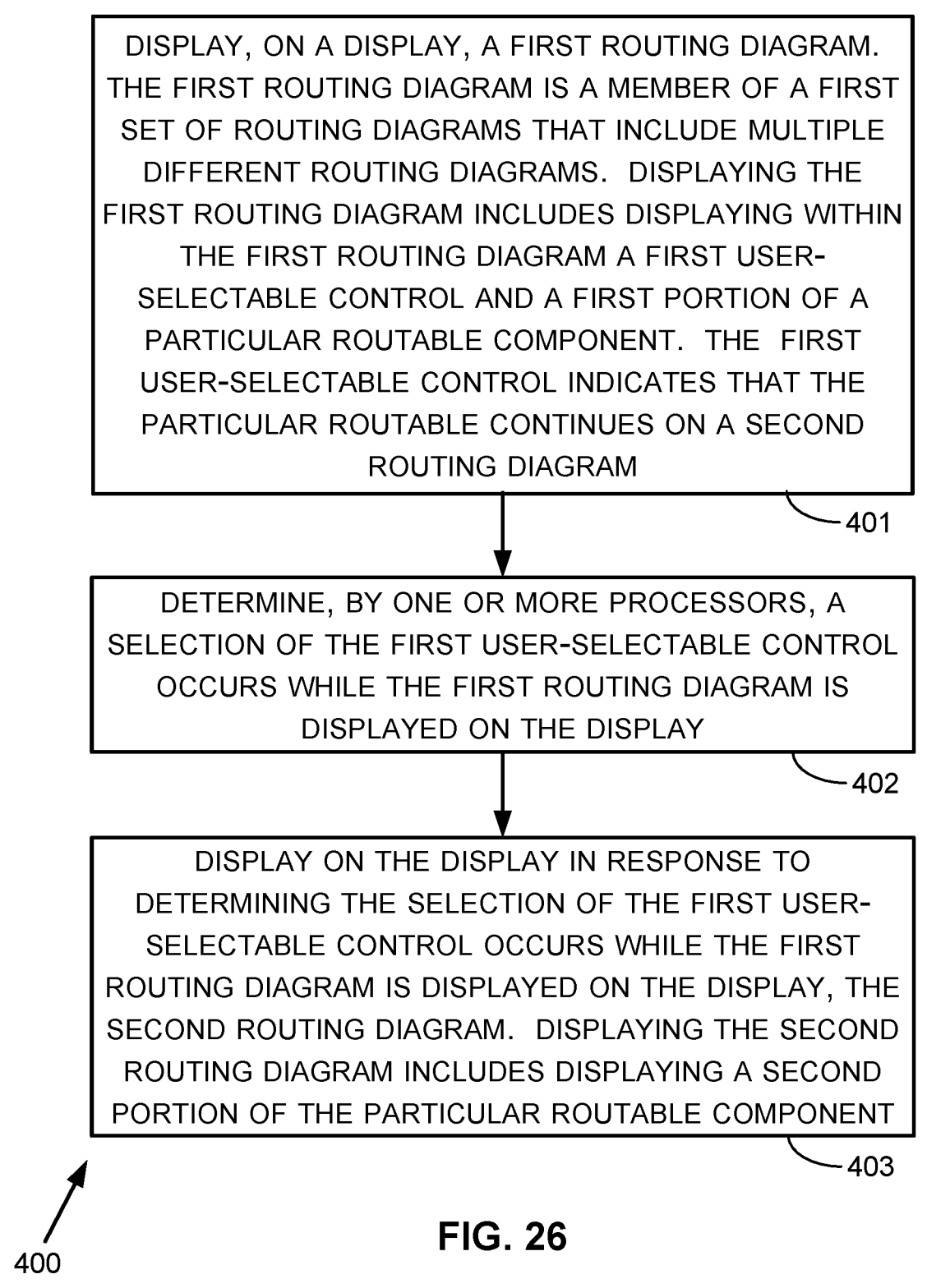

DISPLAY, ON A DISPLAY, A FIRST ROUTING DIAGRAM. THE FIRST ROUTING DIAGRAM IS A MEMBER OF A FIRST SET OF ROUTING DIAGRAMS THAT INCLUDE MULTIPLE DIFFERENT ROUTING DIAGRAMS. DISPLAYING THE FIRST ROUTING DIAGRAM INCLUDES DISPLAYING WITHIN THE FIRST ROUTING DIAGRAM A FIRST USER-SELECTABLE CONTROL AND A FIRST PORTION OF A PARTICULAR ROUTABLE COMPONENT. THE FIRST USER-SELECTABLE CONTROL INDICATES THAT THE PARTICULAR ROUTABLE CONTINUES ON A SECOND ROUTING DIAGRAM

— 401

DETERMINE, BY ONE OR MORE PROCESSORS, A SELECTION OF THE FIRST USER-SELECTABLE CONTROL OCCURS WHILE THE FIRST ROUTING DIAGRAM IS DISPLAYED ON THE DISPLAY

— 402

DISPLAY ON THE DISPLAY IN RESPONSE TO DETERMINING THE SELECTION OF THE FIRST USER-SELECTABLE CONTROL OCCURS WHILE THE FIRST ROUTING DIAGRAM IS DISPLAYED ON THE DISPLAY, THE SECOND ROUTING DIAGRAM. DISPLAYING THE SECOND ROUTING DIAGRAM INCLUDES DISPLAYING A SECOND PORTION OF THE PARTICULAR ROUTABLE COMPONENT

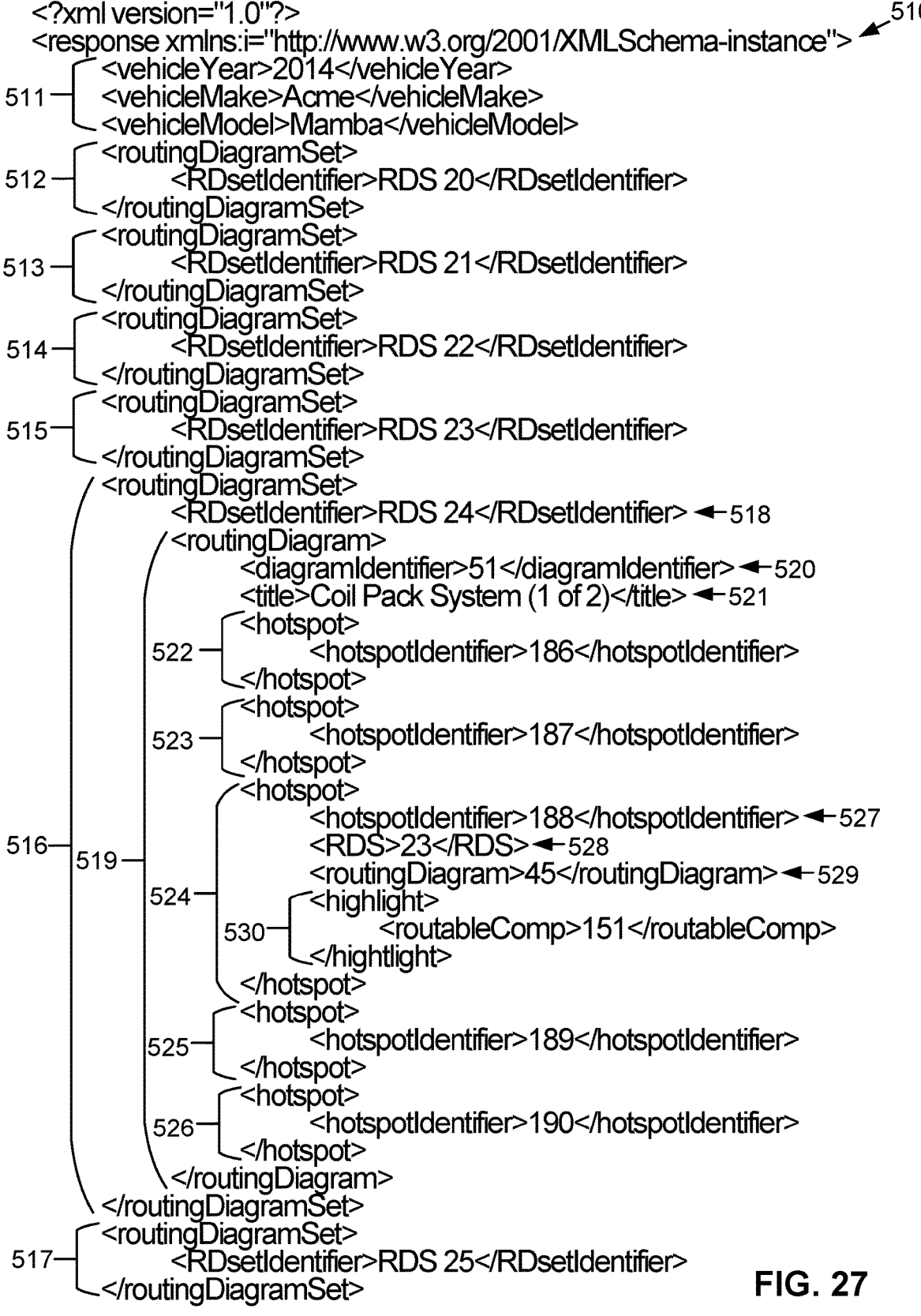

```
<?xml version="1.0"?>
<response xmlns:i="http://www.w3.org/2001/XMLSchema-instance">                510
        <vehicleYear>2014</vehicleYear>
511     <vehicleMake>Acme</vehicleMake>
        <vehicleModel>Mamba</vehicleModel>
        <routingDiagramSet>
512         <RDsetIdentifier>RDS 20</RDsetIdentifier>
        </routingDiagramSet>
        <routingDiagramSet>
513         <RDsetIdentifier>RDS 21</RDsetIdentifier>
        </routingDiagramSet>
        <routingDiagramSet>
514         <RDsetIdentifier>RDS 22</RDsetIdentifier>
        </routingDiagramSet>
        <routingDiagramSet>
515         <RDsetIdentifier>RDS 23</RDsetIdentifier>
        </routingDiagramSet>
        <routingDiagramSet>
            <RDsetIdentifier>RDS 24</RDsetIdentifier>    518
            <routingDiagram>
                <diagramIdentifier>51</diagramIdentifier>    520
                <title>Coil Pack System (1 of 2)</title>    521
                <hotspot>
522                 <hotspotIdentifier>186</hotspotIdentifier>
                </hotspot>
                <hotspot>
523                 <hotspotIdentifier>187</hotspotIdentifier>
                </hotspot>
                <hotspot>
                    <hotspotIdentifier>188</hotspotIdentifier>    527
                    <RDS>23</RDS>    528
                    <routingDiagram>45</routingDiagram>    529
524                 <highlight>
530                     <routableComp>151</routableComp>
                    </hightlight>
                </hotspot>
                <hotspot>
525                 <hotspotIdentifier>189</hotspotIdentifier>
                </hotspot>
                <hotspot>
526                 <hotspotIdentifier>190</hotspotIdentifier>
                </hotspot>
            </routingDiagram>
        </routingDiagramSet>
        <routingDiagramSet>
517         <RDsetIdentifier>RDS 25</RDsetIdentifier>
        </routingDiagramSet>
```

| ROUTING DIAGRAM SET | DIAGRAM | VEHICLE | ROUTABLE COMPONENT (REF. NO.) HIGHLIGHTED UPON DEPARTURE | SELECTED HOTSPOT (REF. NO.) |
|---|---|---|---|---|
| RDS-4 | 2 | 2014 ACME MAMBA | 113 | 383 |
| RDS-4 | 1 | 2014 ACME MAMBA | 148 | 187 |
| RDS-1 | 2 | 2014 ACME MAMBA | 153, 154, 155, 156 | 306 |
| RDS-1 | 1 | 2014 ACME MAMBA | 153, 154, 155, 156 | 287 |

| 451 | 452 | 453 | 454 |
|---|---|---|---|
| RD | RD ID | RD ID | RD ID |
| 30 | (20, 1) | Computer Data Lines (1 of 6) | 189 |
| 31 | (20, 2) | Computer Data Lines (2 of 6) | 287 |
| 32 | (20, 3) | Computer Data Lines (3 of 6) | 307 |
| 33 | (20, 4) | Computer Data Lines (4 of 6) | N.S. |
| 34 | (20, 5) | Computer Data Lines (5 of 6) | 285 |
| 35 | (20, 6) | Computer Data Lines (6 of 6) | 286 |
| 36 | (21, 1) | Interior Lamps (1 of 1) | N.S. |
| 37 | (22, 1) | Starting/Charging System (1 of 5) | 186, 334 |
| 38 | (22, 2) | Starting/Charging System (2 of 5) | 322, 383 |
| 39 | (22, 3) | Starting/Charging System (3 of 5) | N.S. |
| 40 | (22, 4) | Starting/Charging System (4 of 5) | N.S. |
| 41 | (22, 5) | Starting/Charging System (5 of 5) | N.S. |
| 42 | (23, 1) | Power Distribution (1 of 9) | N.S. |
| 43 | (23, 2) | Power Distribution (2 of 9) | N.S. |
| 44 | (23, 3) | Power Distribution (3 of 9) | N.S. |
| 45 | (23, 4) | Power Distribution (4 of 9) | 188 |
| 46 | (23, 5) | Power Distribution (5 of 9) | N.S. |
| 47 | (23, 6) | Power Distribution (6 of 9) | N.S. |
| 48 | (23, 7) | Power Distribution (7 of 9) | N.S. |
| 49 | (23, 8) | Power Distribution (8 of 9) | N.S. |
| 50 | (23, 9) | Power Distribution (9 of 9) | N.S. |
| 51 | (24, 1) | Coil Pack System (1 of 2) | 306, 381, 382, 387 |
| 52 | (24, 2) | Coil Pack System (2 of 2) | 187, 190, 335 |
| 53 | (25, 1) | Body Control Module ECM (1 of 3) | N.S. |
| 54 | (25, 2) | Body Control Module ECM (2 of 3) | N.S. |
| 55 | (25, 3) | Body Control Module ECM (3 of 3) | N.S. |

METHOD AND SYSTEM FOR DISPLAYING MULTIPLE ROUTING DIAGRAMS

BACKGROUND

To assist repair personnel, technicians, or other individuals, some manufacturers or information suppliers produce wiring diagrams that show representations of electrical circuits (i.e., wires) and electrical components (connectable to the electrical circuits) of a serviceable device, such as a vehicle.

The level of complexity of a wiring diagram can vary for various reasons, such as the size of the diagram, the number of electrical components and/or wires shown on the diagram, and the proximity of the wires to one another on the diagram. As the complexity of a routing diagram increases, the ease of tracing a wire on the wiring diagram decreases.

Early on, a wiring diagram was printed on paper. More recently, a wiring diagram has become available for display on a computing device display. In some cases, the computing display device is not sufficiently large to display a complete wiring diagram at a zoom level such that the content of the wiring diagram is decipherable by a human being. Accordingly, some wiring diagrams are sub-divided into multiple wiring diagrams.

In some cases, wires shown on a first of the multiple wire diagram continue on a second of the multiple wiring diagrams. In some of those cases, the first and second wiring diagrams are contained within a set of drawings arranged in a sequence. Moreover, the sequence of drawing can include one or more intermediary wiring diagrams in between the first and second wiring diagrams. In some different cases in which wires shown on a first wiring diagram continue on a second wiring diagram, the first and second wiring diagrams can be contained in different sets of wiring diagrams. It would be beneficial to have new methods and systems for navigating from displaying the first wiring diagram to displaying the second wiring diagram on the computing device display. Such methods and systems could improve the computing display device and/or reduce an amount of time required to repair a device under service.

Overview

This description pertains to displaying routing diagram(s) on a display. A routing diagram can be arranged as a wiring diagram, a pneumatic line diagram, a hydraulic line diagram, an optical communication line diagram, a vacuum line diagram, or some other routing diagram that shows routable component(s) and/or connectable component(s). Routable and connectable components can include connectors that are connectable to one another. The connectors can, but need not necessarily, include connectors that are arranged as male/female connectors. The connectors can, but need not necessarily, be releasably connectable to each other via threads. Moreover, a routing diagram can include any mix of two or more different types of routable components, such as a mix of routable components including two or more from among: a wire, an optical communication line, a hydraulic line, a pneumatic line, or a vacuum line.

A routable component on a wiring diagram can include a wire (e.g., a 16 gauge copper wire coated with insulation or multiple wires within a wire harness) that extends from a first location to a second location for transporting an electrical current and/or establishing a voltage potential at a node. A component that is connectable to a wire is referred to as a connectable component. Examples of a connectable component on a wiring diagram include an electrical motor, a solenoid, a sensor, a battery, and a switch, among other examples.

A routable component on a pneumatic line diagram can include a pneumatic line (e.g., a hose or a metal tube) that extends from a first location to a second location for transporting one or more gases. A gas within a pneumatic line can include air extracted from a local environment. Alternatively, a gas within a pneumatic line can include a refrigerant in a gaseous state. A component that is connectable to a pneumatic line is referred to as a connectable component. Examples of a connectable component on a pneumatic line diagram include an air pump and an air compressor.

A routable component on a hydraulic line diagram can include a hydraulic line (e.g., a hose or a metal tube) that extends from a first location to a second location for transporting a liquid. The liquid can, but need not necessarily, include a transmission fluid, a brake fluid, and/or a liquid coolant. A component that is connectable to a hydraulic line is referred to as a connectable component. Examples of a connectable component on a hydraulic line diagram include a pump, a control valve, a filter, and a reservoir.

A routable component on an optical communication line diagram can include an optical communication line (e.g., a fiber optic cable or optical fiber) that extends from a first location to a second location for transporting optical signals. A component that is connectable to an optical communication line is referred to as a connectable component. Examples of a connectable component on an optical communication line diagram include a fiber optic sensor and a fiber optic repeater.

A routable component on a vacuum line diagram can include a vacuum line (e.g., a rubber hose or metal line) that extends from a first location to a second location for maintaining a vacuum within the vacuum line and/or transporting a gas to a vacuum pump for withdrawal of the gas from the vacuum line so as to create a vacuum within the vacuum line. A component that is connectable to a vacuum line is referred to as a connectable component. Examples of a connectable component on a vacuum line diagram include a vacuum pump and a valve.

In a first implementation, a method is provided. The method includes displaying, on a display, a first routing diagram. The first routing diagram is a member of a first set of routing diagrams that includes multiple different routing diagrams. Displaying the first routing diagram includes displaying, within the first routing diagram, a first user-selectable control and a first portion of a particular routable component. The first user-selectable control indicates that the particular routable component continues on a second routing diagram. The method also includes determining, by one or more processors, a selection of the first user-selectable control occurs while the first routing diagram is displayed on the display. Furthermore, the method includes displaying, on the display in response to determining the selection of the first user-selectable control occurs while the first routing diagram is displayed on the display, the second routing diagram. Displaying the second routing diagram includes displaying a second portion of the particular routable component.

In a second implementation, a computing system is provided. The computing system includes one or more processors and a non-transitory computer readable medium configured to store at least executable instructions. The executable instructions, when executed by the processor, cause the computing system to perform functions. The functions include displaying, on a display, a first routing diagram. The first routing diagram is a member of a first set of routing diagrams that includes multiple different routing diagrams. Displaying the first routing diagram includes displaying, within the first routing diagram, a first user-selectable control and a first portion of a particular routable component. The first user-selectable control indicates that the particular routable component continues on a second routing diagram. The functions also includes determining, by one or more processors, a selection of the first user-selectable control occurs while the first routing diagram is displayed on the display. The functions further includes displaying, on the display in response to determining the selection of the first user-selectable control occurs while the first routing diagram is displayed on the display, the second routing diagram. Displaying the second routing diagram includes displaying a second portion of the particular routable component.

In a third implementation, a non-transitory computer-readable memory is provided. The non-transitory computer readable medium has stored therein instructions executable by one or more processors to cause a computing system to perform functions. The functions include displaying, on a display, a first routing diagram. The first routing diagram is a member of a first set of routing diagrams that includes multiple different routing diagrams. Displaying the first routing diagram includes displaying, within the first routing diagram, a first user-selectable control and a first portion of a particular routable component. The first user-selectable control indicates that the particular routable component continues on a second routing diagram. The functions also include determining, by one or more processors, a selection of the first user-selectable control occurs while the first routing diagram is displayed on the display. The function further include displaying, on the display in response to determining the selection of the first user-selectable control occurs while the first routing diagram is displayed on the display, the second routing diagram. Displaying the second routing diagram includes displaying a second portion of the particular routable component.

In a fourth implementation, a computing system is provided. The computing system includes means for displaying a first routing diagram. The first routing diagram is a member of a first set of routing diagrams that includes multiple different routing diagrams. Displaying the first routing diagram includes displaying, within the first routing diagram, a first selection means and a first portion of a particular routable component. The first selection means indicates that the particular routable component continues on a second routing diagram. The computing system also includes means for determining a selection of the first selection means occurs while the first routing diagram is displayed on the display. Furthermore, the computing system includes means for displaying the second routing diagram in response to determining the selection of the first selection means occurs while the first routing diagram is displayed on the display. Displaying the second routing diagram includes displaying a second portion of the particular routable component.

Other implementations will become apparent to those of ordinary skill in the art by reading the following detailed description, with reference where appropriate to the accompanying drawings.

BRIEF DESCRIPTION OF THE DRAWINGS

Example implementations are described herein with reference to the drawings.

4

Figure 1:
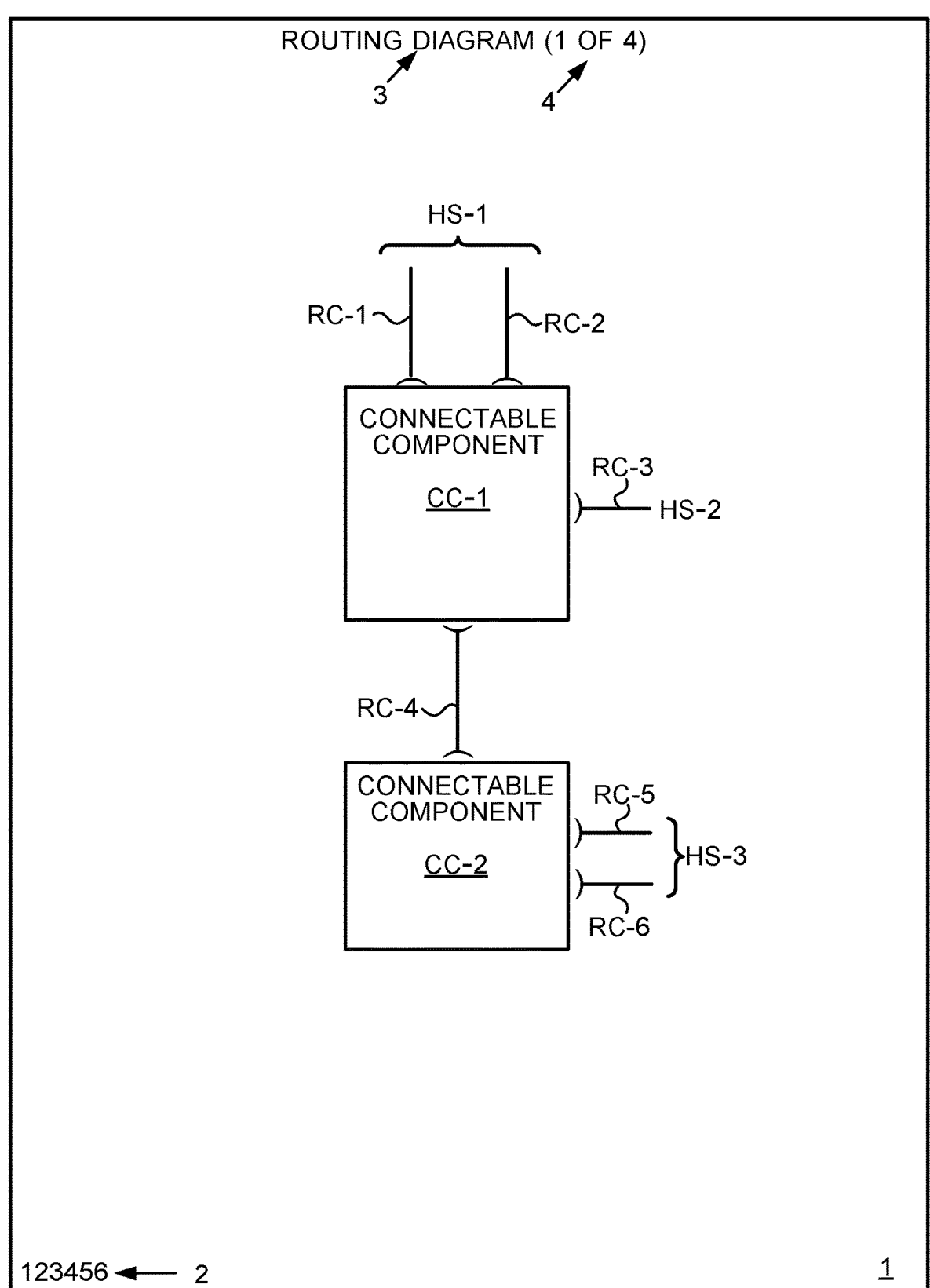

FIG. 1 shows a routing diagram in accordance with one or more of the example implementations.

Figure 2:
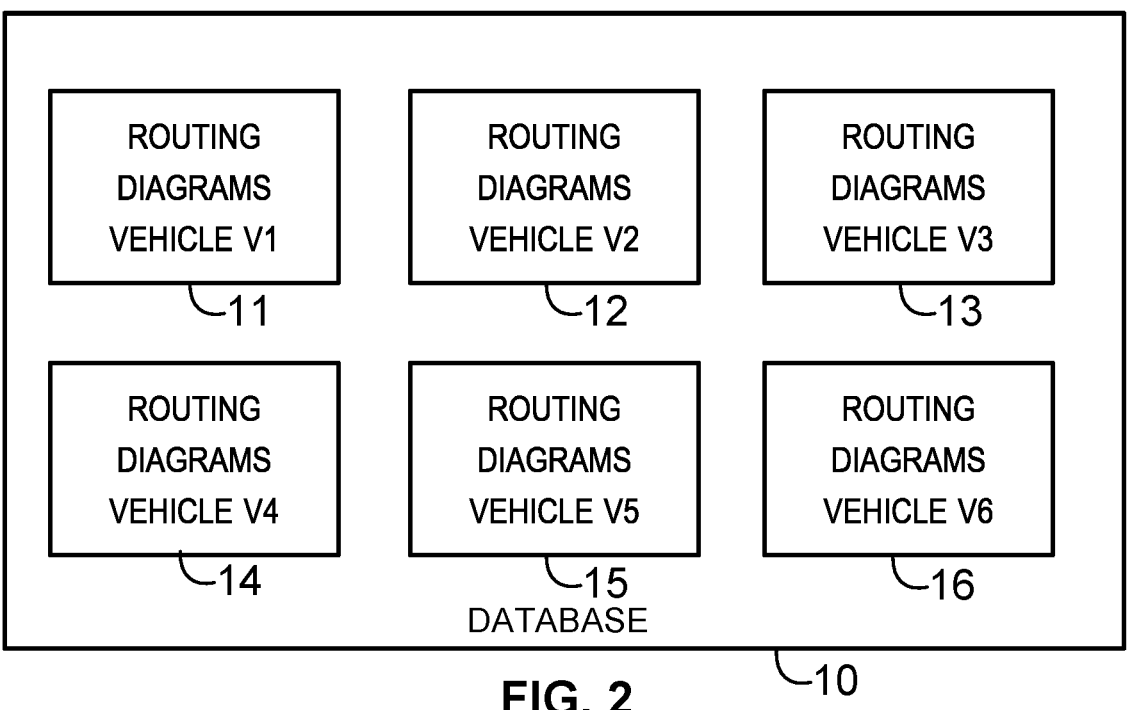

FIG. 2 shows a database in accordance with one or more of the example implementations.

Figure 3:
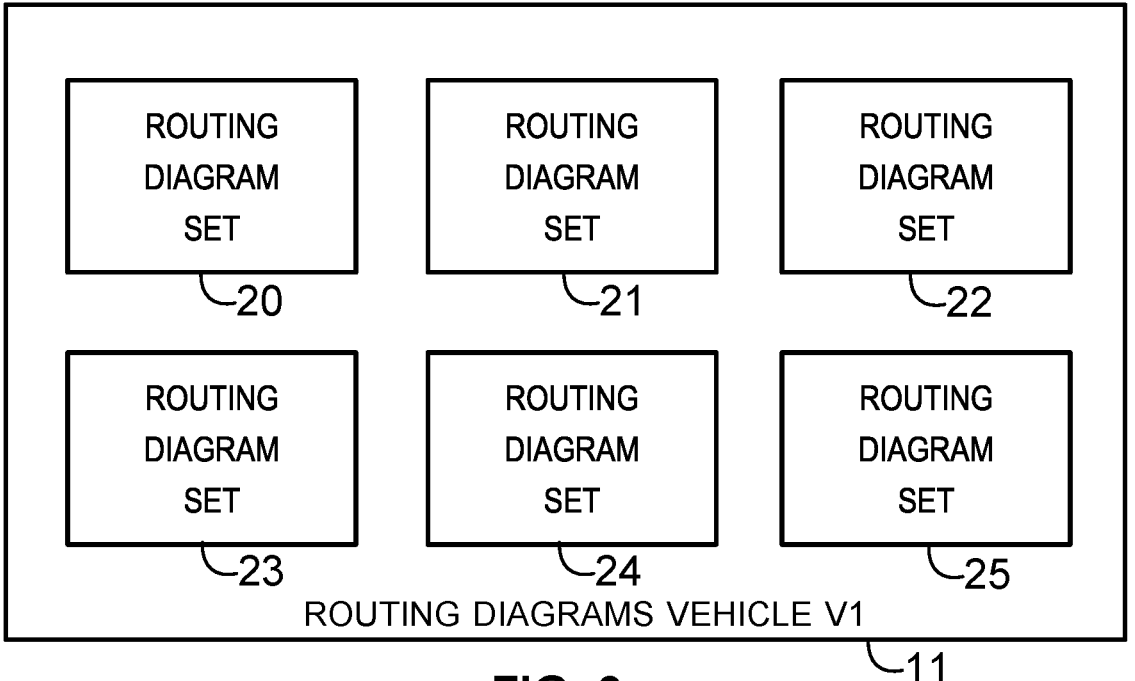

FIG. 3 shows sets of routing diagrams within the database shown in FIG. 1 for a particular vehicle in accordance with one or more of the example implementations.

FIG. 4 shows routing diagrams within sets of routing diagrams shown in FIG. 2 in accordance with one or more of the example implementations.

Figure 5:
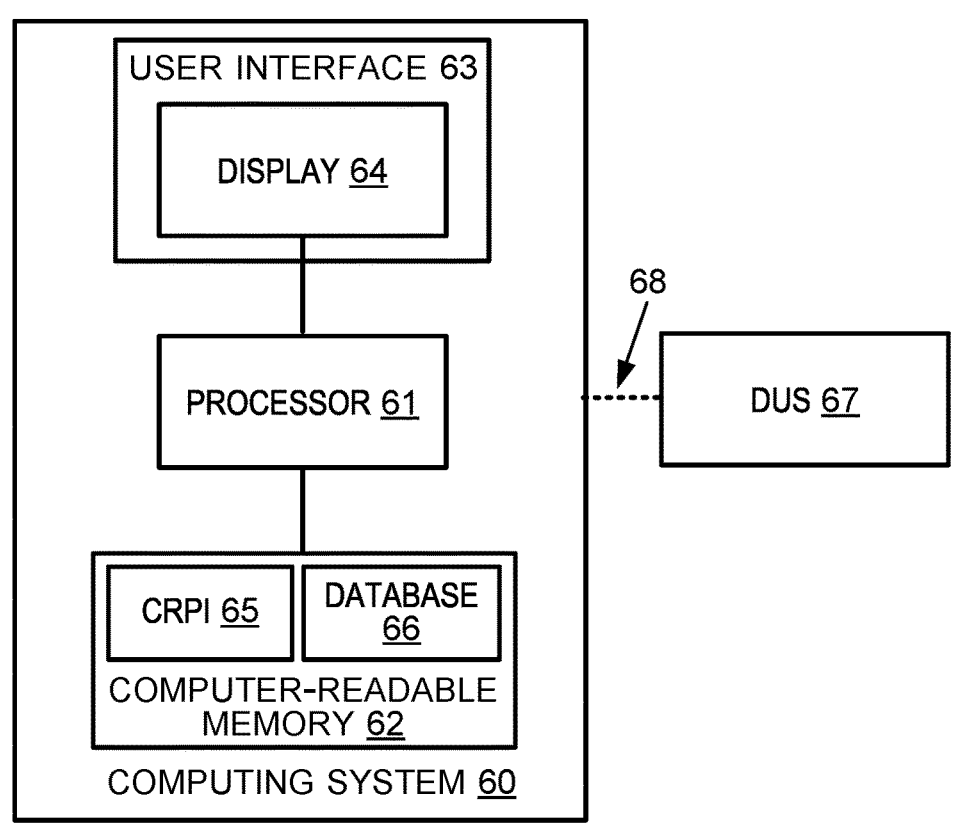

FIG. 5 is a block diagram of a computing system in accordance with one or more of the example implementations.

Figure 6:
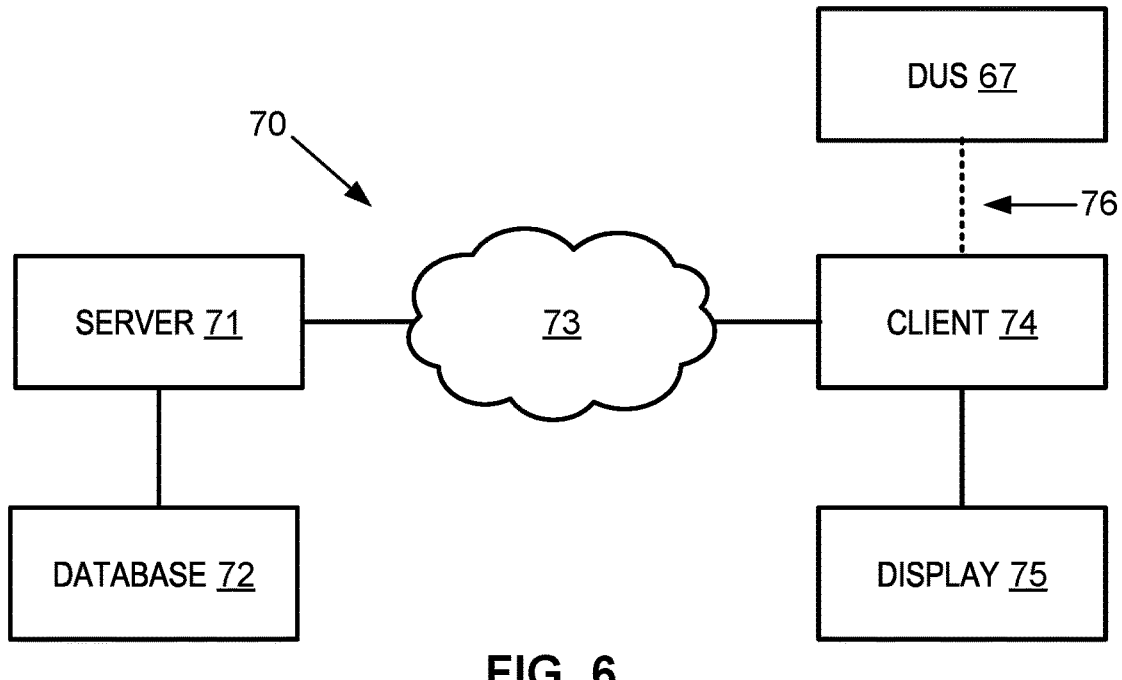

FIG. 6 shows a network architecture in accordance with one or more of the example implementations.

Figure 7:
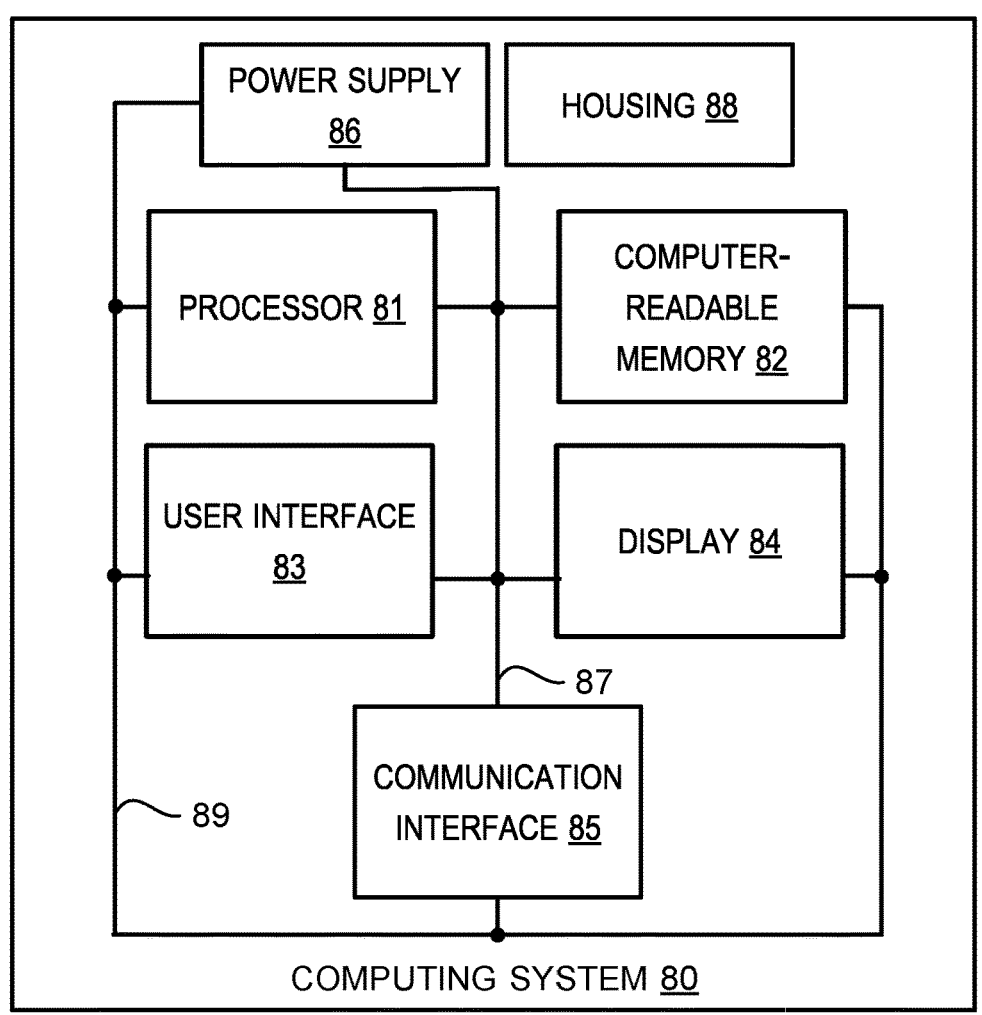

FIG. 7 is a block diagram of a computing system in accordance with one or more of the example implementations.

Figure 8:
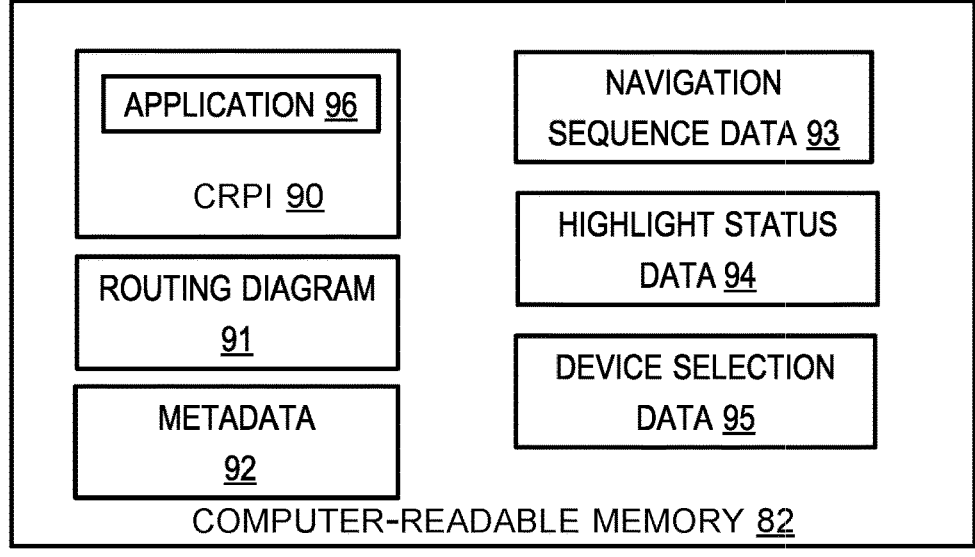

FIG. 8 shows content stored in memory of the computing system shown in FIG. 7 in accordance with one or more of the example implementations.

Figure 9:
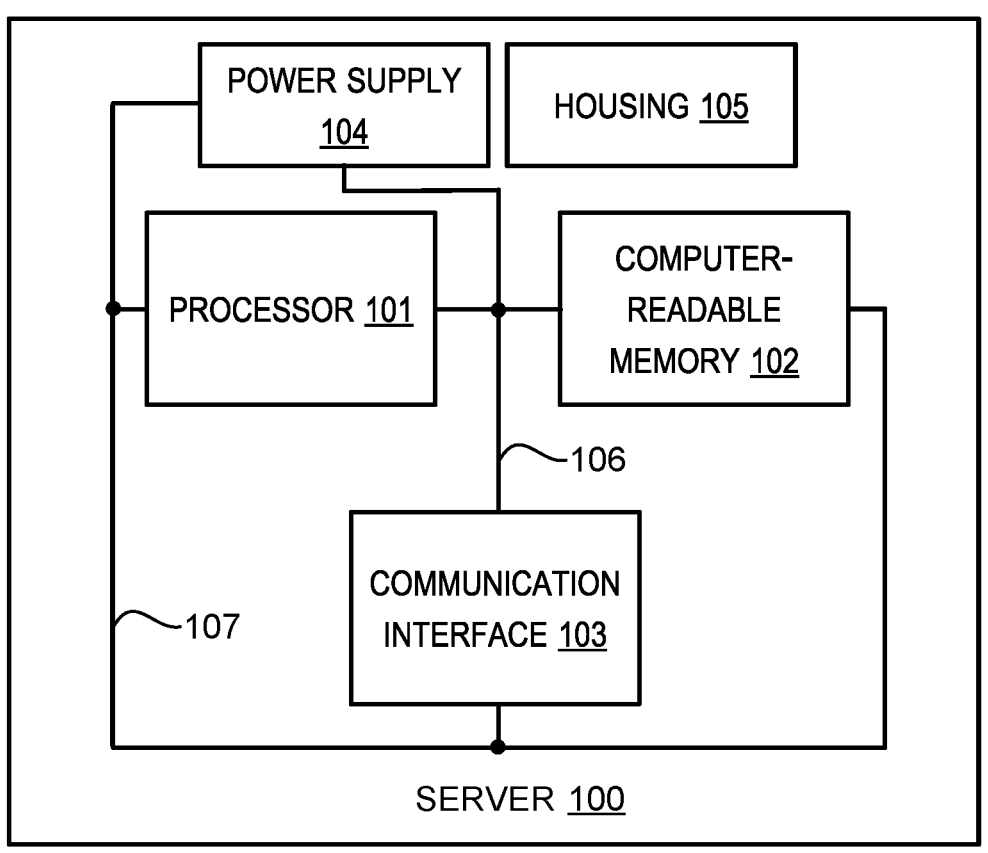

FIG. 9 is a block diagram of a server in accordance with one or more of the example implementations.

Figure 10:
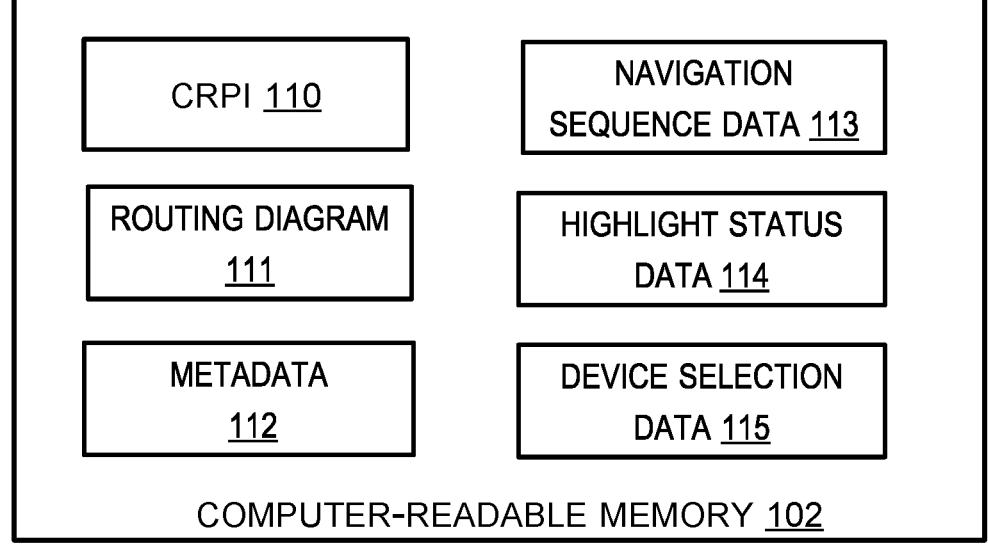

FIG. 10 shows content stored in memory of the server shown in FIG. 9 in accordance with one or more of the example implementations.

FIG. 11, FIG. 12, FIG. 13, FIG. 14, and FIG. 15 show a graphical user interface in accordance with one or more of the example implementations.

FIG. 16, FIG. 17, FIG. 18, FIG. 19, FIG. 20, FIG. 21, FIG. 22, FIG. 23, FIG. 24, and FIG. 25 show at least a portion of a routing diagram in accordance with one or more of the example implementations.

FIG. 26 depicts a flow chart showing functions of a method in accordance with one or more of the example implementations.

FIG. 27 shows metadata corresponding to a routing diagram in accordance with one or more of the example implementations.

Figure 28:
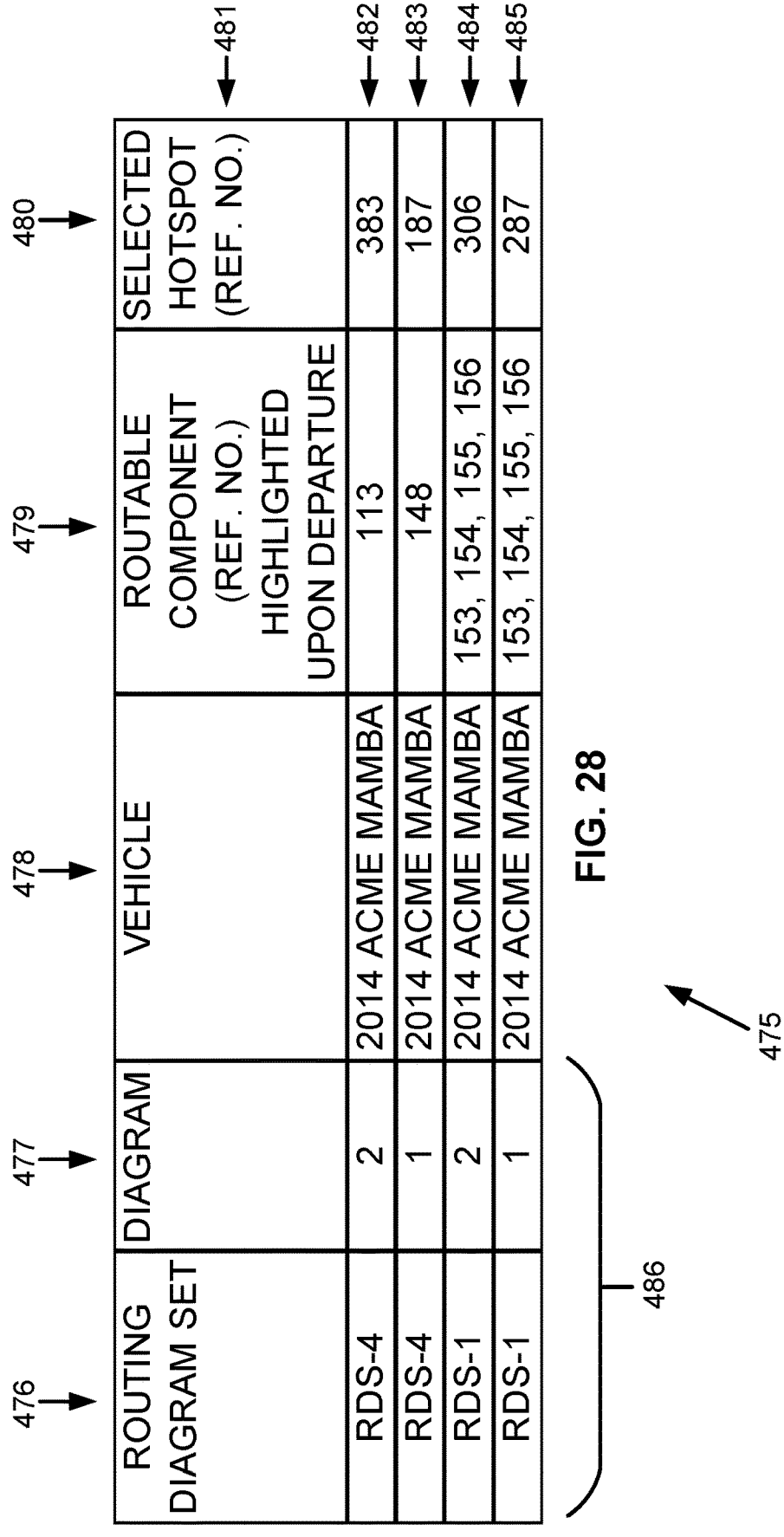

FIG. 28 is a table showing navigation sequence data and highlight status data pertaining to displaying routing diagrams in accordance with one or more of the example implementations.

FIG. 29 is a table showing metadata corresponding to routing diagrams in accordance with one or more of the example implementations.

DETAILED DESCRIPTION

I. Introduction

This description describes several example implementations that pertain to systems, devices, computer-readable memories, and methods for displaying a routing diagram or a portion of a routing diagram. The routing diagram can represent routable components of a device-under-service (DUS) that are routed throughout different portions of the DUS. The routing diagram can represent other components, i.e., connectable components, of the DUS that operatively connect to the routable components. In at least some implementations, the DUS is a vehicle. In at least some of those implementations or in other implementations, the routable components include electrical circuits, optical communication lines, hydraulic lines, vacuum lines, and/or pneumatic lines. In accordance with those implementations, the routing diagram can include an electrical routing diagram, an optical routing diagram, a hydraulic routing diagram, a vacuum routing diagram, or a pneumatic routing diagram, respectively. In at least some of the implementations, the routing diagram includes a schematic diagram that represents functionality of the routable components and connectable components using graphical symbols rather than real images of the components in the DUS. Although this description refers to a DUS, the systems, devices, computer-readable memories, and methods are operable, arranged and/or performable even if a DUS is not in proximity to the systems, devices or computer-readable memories.

FIG. 1 shows a routing diagram 1 in accordance with one or more of the example implementations. The routing diagram 1 includes a routing diagram identifier 2. In at least some implementations, the routing diagram identifier 2 is visible on the routing diagram 1, whereas in at least some other implementations, the routing diagram identifier 2 is not visible on the routing diagram 1. Metadata corresponding to the routing diagram 1 can include data indicative of the routing diagram identifier, regardless of whether the routing diagram identifier 2 is visible on the routing diagram 1. The routing diagram 1 includes a textual routing diagram identifier 3 and diagram count 4. The diagram count 4 includes a first number (e.g., the left-most number shown in the diagram count 4) that is indicative of which diagram the routing diagram 1 is within a sequence of diagrams. The diagram count 4 includes a second number (e.g., the right-most number shown in the diagram count 4) that is indicative of the total number of diagrams in a set of routing diagrams including the routing diagram 1. Particular examples of the textual routing diagram identifier 3 and the diagram count 4 are shown in FIG. 16 to FIG. 25.

The routing diagram 1 includes a connectable component CC-1, CC-2, a routable component RC-1, RC-2, RC-3, RC-4, RC-5, RC-6, and a hot spot HS-1, HS-2, HS-3. FIG. 1 represents that the routable component RC-4 is connected to and/or connectable to both the connectable component CC-1 and the connectable component CC-2. The hot spot HS-1 is a user-selectable control (USC) that corresponds to the routable component RC-1 and the routable component RC-2. The hot spot HS-2 is a user-selectable control (USC) that corresponds to the routable component RC-3. The hot spot HS-3 is a user-selectable control (USC) that corresponds to the routable component RC-5 and the routable component RC-6.

A hot spot that corresponds to routable component(s) on a first routing diagram can include an indicator. As an example, the indicator within the hot spot can include an icon that represents that the routable component(s) corresponding to the hot spot continue on a second routing diagram of a set of routing diagrams that include the first routing diagram. In at least some implementations, this icon includes a solid-filled arrow head. Other examples of this icon are possible. A diagram identifier within a hotspot can be referred to a destination diagram identifier or a destination routing diagram identifier.

As another example, the indicator within the hot spot can include an icon that represents that the routable component(s) corresponding to the hot spot continue on a second routing diagram of a set of routing diagrams other than the set of routing diagrams that includes the routing diagram with the hot spot. In at least some implementations, this icon includes a triangle filled with an alpha-numeric character. In accordance with those implementations, the other diagram can include a triangular icon filled with the same alpha-numeric character. The use of the same alpha-numeric character in the two triangular icons represents that the routable component(s) corresponding to the icons are different portions of the routable component(s).

A hot spot can include a textual description of the routable component(s) that correspond to the hot spot. Examples of a textual description within a hot spot are shown in FIG. 16 to FIG. 25.

For the implementations in which a routing diagram includes an electrical routing diagram, examples of a connectable component (e.g., an electrical component) that can be shown on the routing diagram include a sensor, an electronic control unit (ECU), a motor, a solenoid, a relay, a battery, a pump, a compressor, a fuse, a fuse block, a ground lug, a coil, or a transformer. Additionally, for those implementations, the routable components shown on the routing diagram can represent a copper wire, an aluminum wire, a silver wire, a gold wire, a solid wire, a stranded wire, or a coaxial cable. Other examples of a connectable component and other examples of a routable component on the electrical routing diagram are also possible. Furthermore, the routable components represented on the routing diagram can be arranged as or part of a wiring harness that includes multiple electrical circuits and a wiring harness sleeve that provides for protection of the electrical circuits.

For the implementations in which a routing diagram includes an optical communication line diagram, examples of a connectable component (e.g., an optical component) that can be shown on the routing diagram include a laser, a splitter, a multiplexer, a switch, a receiver, or a photodetector. Additionally, for those implementations, the routable components shown on the routing diagram can represent an optical fiber communication line. The optical fiber communication line can include a glass optical fiber (e.g., a glass optical fiber made from silica) or a plastic optical fiber. Other examples of a connectable component and other examples of a routable component on the optical routing diagram are also possible.

For the implementations in which a routing diagram includes a hydraulic routing diagram, examples of a connectable component (e.g., a hydraulic component) that can be shown on the routing diagram include a pump, a valve, an actuator, a reservoir, a filter, or a pressure switch. Additionally, for those implementations, the routable components shown on the routing diagram can represent a hydraulic hose that meets a Society of Automotive Engineers (SAE) 100R1AT or 100R2AT standard, or a metal line (e.g., a steel or aluminum line). Other examples of a connectable component and other examples of a routable component on the hydraulic routing diagram are also possible.

For the implementations in which a routing diagram includes a vacuum routing diagram, examples of a connectable component (e.g., a vacuum component) that can be shown on the routing diagram include a carburetor, a solenoid valve, an exhaust gas recirculation (EGR) valve, a vacuum pump, or a vacuum reservoir. Additionally, for those implementations, the routable components shown on the routing diagram can represent a rubber hose, a polyvinyl chloride (PVC) hose, or a metal line (e.g., a steel or aluminum line). Other examples of a connectable component and other examples of a routable component on the vacuum routing diagram are also possible.

For the implementations in which a routing diagram includes a pneumatic routing diagram, examples of a connectable component (a pneumatic component) that can be shown on the routing diagram include a compressor, a reservoir, a pressure regulator, a valve (e.g., a solenoid valve), a filter, or an air dehumidifier. Additionally, for those implementations, the routable components shown on the routing diagram can represent a plastic line, a rubber line, a polyurethane line, a PVC line, or a metal line (e.g., a steel or aluminum line). Other examples of a connectable component and other examples of a routable component on the pneumatic routing diagram are also possible.

II. Example Apparatus and Systems

The implementations described in this description pertain to routing diagrams. In at least some of the implementations, the routing diagrams can be stored in a database.

FIG. 2 shows a database 10 in accordance with one or more of the example implementations. In general, the database 10 includes routing diagrams for a quantity of DUS (e.g., one or more DUS). FIG. 2 shows an implementation in which the database 10 includes routing diagrams for six DUS. As shown in FIG. 2, the routing diagrams in the database 10 are for vehicles V1 to V6. In particular, the database 10 includes routing diagrams 11 for a vehicle V1, routing diagrams 12 for a vehicle V2, routing diagrams 13 for a vehicle V3, routing diagrams 14 for a vehicle V4, routing diagrams 15 for a vehicle V5, and routing diagrams 16 for a vehicle V6. Each of the vehicles V1 to V6 can represent vehicles corresponding to one or more YMME, which represents a unique combination of a vehicle year, a vehicle make, a vehicle model, and a vehicle engine. Examples of a YMME are described in the section below entitled "Example Vehicle." For purposes of this description, the vehicle V1 is also referred to as a "2014 Acme Mamba 5.7L," where 2014 represents a vehicle year, "Acme" represents a vehicle make, "Mamba" represents a vehicle model, and "5.7L" represents a vehicle engine. The database 10 is not limited to storing routing diagrams nor is it limited to storing routing diagrams for only a single type of DUS. Even so, in accordance with at least some implementations, a database including routing diagrams may include routing diagrams for only a single DUS.

Next, in at least some implementations, the routing diagrams for a given DUS include one set of routing diagrams. In at least some other implementations, however, the routing diagrams for a given DUS include multiple sets of routing diagrams. For example, as shown in FIG. 3, the routing diagrams 11 for the vehicle V1 include multiple sets of routing diagrams. In particular, the routing diagrams 11 includes a routing diagram set 20, 21, 22, 23, 24, 25. A routing diagram set can be referred to as "RDS" and/or a "set of routing diagrams."

Next, FIG. 4 shows routing diagrams within the routing diagram set 20, 21, 22, 23, 24, 25 in accordance with one or more of the example implementations. As shown in FIG. 4, a routing diagram set can include one or more routing diagrams. The routing diagram set 20 includes a routing diagram 30, 31, 32, 33, 34, 35. The routing diagram set 21 includes a routing diagram 36. The routing diagram set 22 includes a routing diagram 37, 38, 39, 40, 41. The routing diagram set 23 includes a routing diagram 42, 43, 44, 45, 46, 47, 48, 49, 50. The routing diagram set 24 includes a routing diagram 51, 52. The routing diagram set 25 includes a routing diagram 53, 54, 55. In accordance with one or more of the example implementations, the routing diagram set 20, 21, 22, 23, 24, 25 can include routing diagrams that show and/or correspond to a computer data lines in the vehicle V1, interior lamps in the vehicle V1, a starter/charging system in the vehicle V1, a power distribution system in the vehicle V1, a coil pack system in the vehicle V1, and a body control module in the vehicle V1, respectively. Other examples of components and/or systems that correspond to a routing diagram set are also possible.

Next, FIG. 5 shows a computing system 60 in accordance with one or more of the example implementations. The computing system 60 includes a processor 61, a computer-readable memory 62, a user interface 63, and a display 64. Although FIG. 5 shows the display 64 within the user interface 63, in at least some other implementations, the display 64 can be separate from other components of the user interface 63. Computer-readable program instructions (CRPI) 65 and a database 66 are stored on the computer-readable memory 62. In at least some implementations, the database 66 includes routing diagrams for a single DUS. In at least some other implementations, the database 66 includes routing diagrams for multiple different DUS. In accordance with these other implementations, the database 66 can be arranged like the database 10 shown in FIG. 2.

The processor 61 can include one or more processors. In at least some implementations, the processor 61 is contained in a single device that also contains the computer-readable memory 62, the user interface 63, and the display 64. The single device can, for example, include an embedded computing system operable for servicing a DUS, such as a DUS 67. In at least some implementations, the computing system 60 and the DUS 67 are operatively connected via a communication link 68. In those implementations, the processor 61 can transmit communications to the DUS 67 over the communication link 68 and/or receive communications from the DUS 67 over the communication link 68. The DUS 67 includes a serviceable device (or system) for which the database 66 includes routing diagrams. As an example, the DUS 67 can include a vehicle. In these implementations, the computing system 60 can include a communication interface for transmitting a vehicle data message to the DUS 67 and for receiving a vehicle data message from the DUS 67.

The processor 61 can execute the CRPI 65. Execution of the CRPI 65 can cause the computing system 60 to obtain a routing diagram from a database 66 and to output the routing diagram on the display 64. Additionally or alternatively, execution of the CRPI 65 can cause the computing system to request and receive a routing diagram from a server and remote database (such, as the server 71 and the database 72 shown in FIG. 6) and to output the routing diagram on the display 64. Moreover, execution of the CRPI 65 can cause the processor 61 to determine that a hotspot on the displayed routing diagram is selected by use of the user interface 63 and to responsively output on the display 64 a routing diagram corresponding to the hotspot. In some implementations, the routing diagram including the hotspot and the routing diagram corresponding to the hotspot are contained in a single set of routing diagrams. In at least some of those implementations, the routing diagrams in the single set of routing diagrams are arranged as a sequence of drawings. In some other implementations, the routing diagram including the hotspot and the routing diagram corresponding to the hotspot are contained in different sets of routing diagrams. Similarly, those different sets of routing diagrams can include multiple routing diagrams arranged in separate sequences.

Since the database 66 includes routing diagrams, the computing system 60 is operable to display routing diagrams while the computing system 60 is not connected to a communication network and/or the internet. For implementations in which the computing system 60 further includes a communication interface for communicating over a communication network (e.g., the communication network 73 shown in FIG. 6), the computing system 60 can download different and/or additional routing diagrams while the computing system 60 is connected to a communication network including a database with the different and/or additional routing diagrams.

Next, FIG. 6 shows a network architecture 70 in accordance with one or more of the example implementations. The network architecture 70 includes a server 71, a database 72, a communication network 73, a client 74, and a display 75. Similar to FIG. 5, the DUS 67 can be operatively connected to the client 74 via a communication link 76. The database 72 can include and/or be arranged like the database 10 shown in FIG. 2. The database can be stored in a computer-readable memory, such as the computer-readable memory 62 shown in FIG. 5.

The communication network 73 can include a wide area network (WAN) such as the internet. The communication network 73 can carry communications between the server 71 and the client 74. As an example, a communication between the server 71 and the client 74 can include a communication comprising a request from the client 74 for the server 71 to provide the client with a routing diagram. As another example, a communication between the server 71 and the client 74 can include a communication comprising a routing diagram and metadata regarding the routing diagram. As yet another example, a communication between the server 71 and the client 74 can include a communication comprising information that can be used in and/or as a jump instruction that corresponds to a hotspot selected from a routing diagram displayed on the display 75. Other examples of a communication between the server 71 and the client 74 are possible, some of which are described in this description. The communication network 73 can carry communications using a wireless communication standard, such as any wireless communications standard described in this description, and/or using a wired communication standard, such as any wired communications standard described in this description.

Next, FIG. 7 is a block diagram of a computing system 80 in accordance with one or more of the example implementations. The computing system 80 includes a processor 81, a computer-readable memory 82, a user interface 83, a display 84, a communication interface 85, a power supply 86, and/or a housing 88. The computing system 80 can also include a data bus 87 to operatively couple two or more of the following together: the processor 81, the computer-readable memory 82, the user interface 83, the display 84, the communication interface 85 or the power supply 86. The computing system 80 can also include an electrical circuit 89 to operatively couple the power supply 86 to the processor 81, the computer-readable memory 82, the user interface 83, the display 84, and the communication interface 85. The computing system 60 shown in FIG. 5 can be arranged like the computing system 80. The computing system 80 can operate within the network architecture 70 like the computing system 60 and/or the client 74.

In at least some implementations, the communication interface 85 includes a vehicle communication transceiver. The vehicle communication transceiver can be operable to transmit and/or receiver a vehicle data message according to a vehicle data message protocol, such as any vehicle data message protocol described in this description. In these implementations, the communication interface 85 can request and receive a vehicle data message including an identifier of a DUS (e.g., a vehicle). The identifier of the DUS can include a vehicle identification number. The identifier of the DUS can be used to request a routing diagram corresponding to that DUS.

Next, FIG. 8 shows content of the computer-readable memory 82 in accordance with one or more of the example implementations. As shown in FIG. 8, the computer-readable memory 82 includes CRPI 90, a routing diagram 91, metadata 92, navigation sequence data 93, highlight status data 94, and/or device selection data 95. Other examples of data stored in the computer-readable memory 82 are also possible.

The CRPI 90 can comprise a plurality of program instructions. The CRPI 90 and any other CRPI described in this description can include data structures, objects, programs, routines, or other program modules that can be accessed by and executed by a processor. The CRPI 65 shown in FIG. 5 can include any or all of the CRPI 90.

In general, the CRPI 90 can include program instructions to cause the computing system 80 to perform any function described herein as being performed by the computing system 80 or to cause any component of the computing system 80 to perform any function herein as being performed by that component of the computing system 80. As an example, the CRPI 90 can include program instructions to perform the functions of the flow chart 400 shown in FIG. 26, and/or each, any or all of the functions to carry out the example operation and functionality discussed in the section entitled "Example Operation," below.

As another example, the CRPI 90 can include program instructions that are executable by the processor 81 to display a routing diagram within the routing diagram 91 on the display 84. In at least some implementations, execution of these program instructions can cause the processor 81 to output to the display a GUI that includes the routing diagram within the routing diagram 91 such that displaying the routing diagram includes displaying the GUI that includes the routing diagram. As an example, execution of these program instructions can cause the processor 81 to output the GUI 241 (shown in FIG. 14 and FIG. 15) on the display 84.

As yet another example, the CRPI 90 can include program instructions that are executable by the processor 81 to request a routing diagram from the server 71, 100 (shown in FIG. 9) and to receive a routing diagram from the server 71, 100. Execution of those program instructions can cause the routing diagram received from the server 71, 100 to be stored in the routing diagram 91 and/or to display the routing diagram received from the server 71, 100 on the display 84.

As yet another example, the CRPI 90 can include program instructions that are executable by the processor 81 to determine a selection of a routable component or a connectable component shown on a routing diagram displayed on the display 84 has occurred. In response to determining that selection, if the selected component is currently un-highlighted, the processor 81 can execute additional program instructions to cause the selected component to be highlighted. Alternatively, in response to determining the selection of the routable or connectable component, if the selected component is currently highlighted, the processor 81 can execute additional program instructions to cause the selected component to be un-highlighted.

As yet another example, the CRPI 90 can include program instructions that are executable by the processor 81 to modify the highlight status data 94 each time a component on a routing diagram is selected to be highlighted or un-highlighted.

As yet another example, the CRPI 90 can include program instructions that are executable by the processor 81 to receive a selection of a hotspot shown on a routing diagram displayed on the display 84 and to responsively display a routing diagram that corresponds to the selected hotspot.

Figure 23:
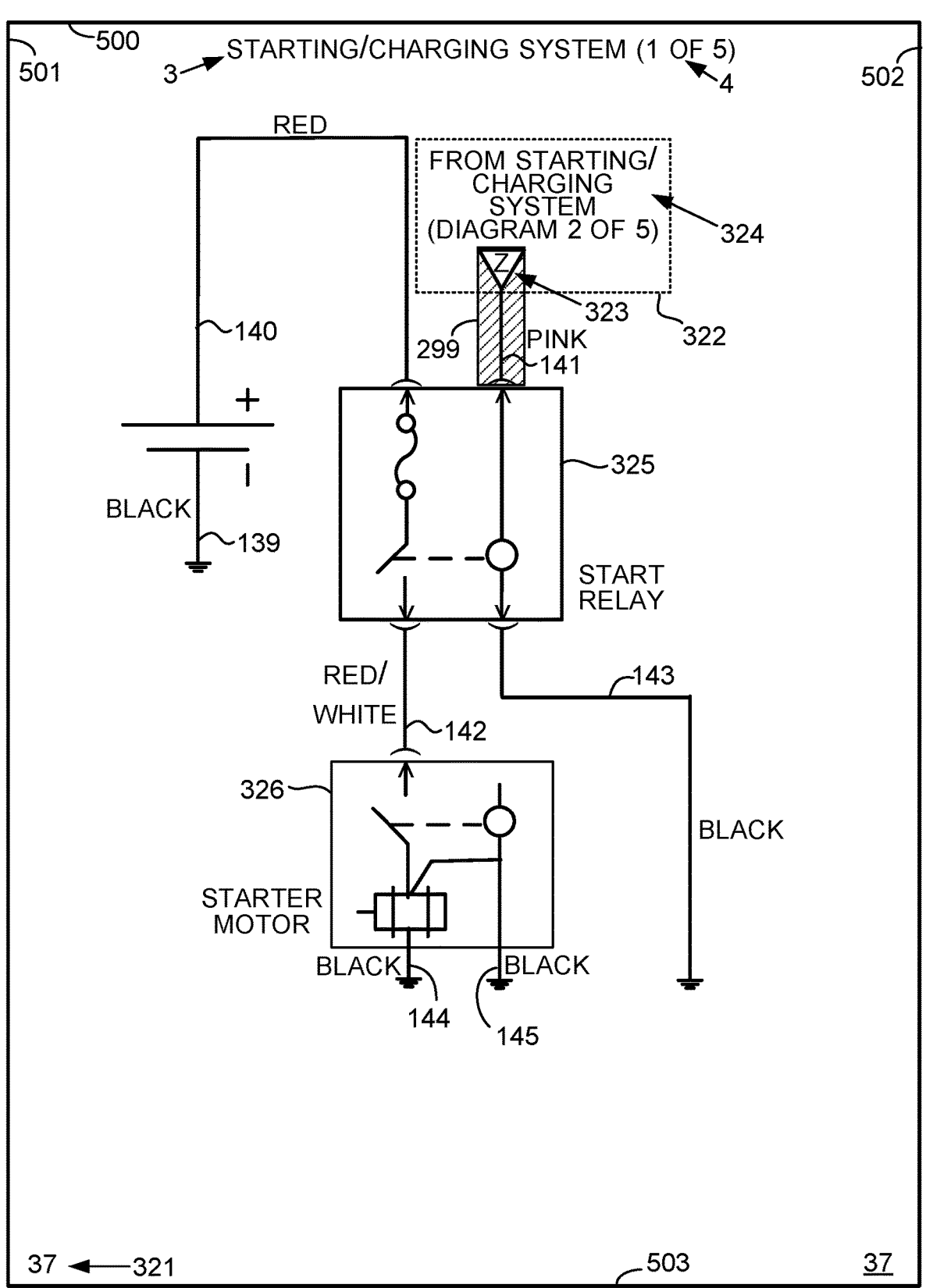

As yet another example, the CRPI 90 can include program instructions that are executable by the processor 81 to determine a routing diagram that corresponds to a hotspot selected from a routing diagram displayed on the display 84. In at least some implementations, the processor 81 determines the routing diagram from metadata corresponding to the hotspot. As an example, the metadata can be internal to the routing diagram and/or internal to a routing diagram file that includes the routing diagram including the hotspot. As another example, the metadata can be external to the routing diagram and external to a routing diagram file that includes the routing diagram. FIG. 23 shows metadata the processor 81 can use to determine the routing diagram that corresponds to a selected hotspot.

As yet another example, the CRPI 90 can include program instructions that are executable by the processor 81 to request from the server 71, 100 a routing diagram that corresponds to a hotspot selected from a routing diagram currently displayed on the display 84. The processor 81 can transmit a request and/or cause a request to be transmitted to the server 71, 100 in order to request the routing diagram that corresponds to the hotspot. In at least some implementations, the request includes an identifier of the routing diagram (i.e., a routing diagram identifier) that corresponds to the hotspot. As an example, the routing diagram identifier includes a routing diagram like the routing diagram identifier 271, 273, 281, 301, 321, 331, 274 shown in FIG. 16 to FIG. 22. As yet another example, the routing diagram identifier can include an identifier of a routing diagram set and an identifier of a particular routing diagram within the routing diagram set. In at least some implementations, the identifier of a routing diagram set can be based on a textual routing diagram identifier (e.g., a textual routing diagram identifier 3 shown in any of FIG. 16 to FIG. 25) and the identifier of a particular routing diagram within the routing diagram set can include a diagram count (e.g., a diagram count 4 shown in any of FIG. 16 to FIG. 25). As still yet another example, the routing diagram identifier can include an identifier of a hotspot identifier that corresponds to the hotspot that corresponds to the routing diagram.

As yet another example, the CRPI 90 can include program instructions that are executable by the processor 81 to modify the navigation sequence data 93 each time another routing diagram is selected to be displayed on the display 84 and/or each time another routing diagram is displayed on the display 84. In at least some implementations, the CRPI 90 can include program instructions that are executable by the processor 81 to stop tracking a navigation sequence of routing diagrams for a particular DUS after a different DUS is selected and/or identified using the computing system 80. In at least some of those implementations, stopping the tracking can include deleting or overwriting the navigation sequence data 93 for the particular DUS.

As still yet another example, the CRPI 90 can include program instructions arranged as an application 96. In at least some implementations, the application 96 includes a web-browser application. The application 96 (e.g., the web-browser application) can be configured to request the server 71, 100 to provide data stored in the database 72 or in the computer-readable memory 102. The application 96 (e.g., the web-browser application) can be used to display data received from the server 71, 100 on the display 84. In at least some implementations, the application 96 (e.g., the web-browser application) can be operable to perform the other functions that are described herein as being performable by execution of the CRPI 90.

The routing diagram 91 can include one or more routing diagrams. In implementations, in which the routing diagram 91 includes one routing diagram, that one routing diagram can include a routing diagram that the server 71, 100 provides to the computing system 80 in response to a request for a routing diagram. The request for the routing diagram can include a request for an initial routing diagram for a particular DUS. Alternatively, the request for the routing diagram can include a request for a different routing diagram for the particular DUS. In at least some occurrences, the request for a different routing diagram for the particular DUS is sent by the processor 81 in response to determining that a hotspot on a currently displayed routing diagram is selected. In still at least some other occurrences, the request for a different routing diagram for the particular DUS is sent by the processor 81 in response to determining that an identifier corresponding to a previously displayed routing diagram is selected (e.g., the identifier 264, 265, 266, 267 shown in FIG. 15). FIG. 29 shows examples of routing diagram identifiers that can be included within the request for a different routing diagram.

In at least some implementations, the request for a different routing diagram includes a DUS identifier. In those or in at least some other implementations, the server 71, 100 tracks a most-recent DUS identifier received from the computing system 80 such that the request for a different routing diagram implies that the requested for routing diagram is for a DUS corresponding to the most-recent DUS identifier unless the request for a different routing diagram includes a different DUS identifier.

In at least some implementations in which the routing diagram 91 includes only one routing diagram, the routing diagram 91 includes only one routing diagram that can be displayed on the display 84 without having to request another routing diagram from the server 71, 100. Accordingly, in these implementations, a routing diagram previously displayed on the display 84 could still be stored in the computer-readable memory 82, but the processor 81 is not operable to display the previously displayed routing diagram still stored in the computer-readable memory 82. For these implementations, to display the previously displayed routing diagram, the computing system 80 has to request the previously displayed routing diagram from the server 71, 100.

In implementations in which the routing diagram 91 includes more than one routing diagram, the routing diagram 91 can include one or more sets of routing diagrams. Each of those set(s) of routing diagrams includes one or more routing diagrams.

In accordance with at least some implementations, the routing diagram 91 includes a routing diagram that includes one or more connectable components, one or more routable components, a portion of one or more routable components, and/or one or more hotspots. The hotspot(s) correspond to a different routing diagram. The hotspot(s) are and/or include user-selectable control(s).

In accordance with at least some implementations, the routing diagram 91 includes an electrical wiring diagram. The connectable component within the electrical wiring diagram includes an electrical component. The routable component or portion of the routable component within the electrical wiring diagram represents an electrical circuit or a portion of an electrical circuit. The different routing diagram corresponding to the hotspot in the electrical wiring diagram can be a different electrical wiring diagram or some other type of routing diagram described in this description.

In accordance with at least some implementations, the routing diagram 91 includes an optical communication line diagram. The connectable component within the optical communication line diagram includes an optical component. The routable component or portion of the routable component within the optical communication line diagram can represents an optical communication line or a portion of an optical communication line. The different routing diagram corresponding to the hotspot in the optical communication line diagram can be a different optical communication line diagram or some other type of routing diagram described in this description.

In accordance with at least some implementations, the routing diagram 91 includes a hydraulic line diagram. The connectable component within the hydraulic line diagram includes a hydraulic component. The routable component or portion of the routable component within the hydraulic line diagram represents a hydraulic line or a portion of a hydraulic line. The different routing diagram corresponding to the hotspot in the hydraulic line diagram can be a different hydraulic line diagram or some other type of routing diagram described in this description.

In accordance with at least some implementations, the routing diagram 91 includes a pneumatic line diagram. The connectable component within the pneumatic line diagram includes a pneumatic component. The routable component or portion of the routable component within the pneumatic line diagram represents a pneumatic line or a portion of a pneumatic line. The different routing diagram corresponding to the hotspot in the pneumatic line diagram can be a different pneumatic line diagram or some other type of routing diagram described in this description.

In accordance with at least some implementations, the routing diagram 91 includes a vacuum line diagram. The connectable component within the vacuum line diagram includes a vacuum component. The routable component or portion of the routable component within the vacuum line diagram represents a vacuum line or a portion of a vacuum line. The different routing diagram corresponding to the hotspot in the vacuum line diagram can be a different vacuum line diagram or some other type of routing diagram described in this description.

In accordance with at least some implementations, a routing diagram within the routing diagram 91 includes at least two different types of connectable components selected from among an electrical component, an optical component, a hydraulic component, a pneumatic component, or a vacuum component, and includes at least two different types of routable components selected from an electrical circuit, an optical communication line, a hydraulic line, a pneumatic line, or a vacuum line.

In accordance with at least some implementations, the routing diagram 91 includes a graphics file. In at least some implementations, the graphics file can include a vector graphics file. As an example, the vector graphics file can be formatted as an SVG (Scalable Vector Graphics) file, an EPS (Encapsulated PostScript) file, a PDF (Portable Document Format) file, an AI (Adobe Illustrator Artwork) file, or a DXF (Drawing eXchange Format) file. In accordance with at least some other implementation(s), the graphics file include a raster graphics file. As an example, the raster graphics file can be formatted as a BMP (bitmap) file, a TIF (Tagged Image File) file, a JPG (Joint Photographic Group) file, a JPEG (Joint Photographic Experts Group) file, a GIF (Graphical Interchange Format) file, or a PNG (Portable Network Graphic) file. Other examples of the vector graphics file and/or the raster graphics files are possible.

The metadata 92 can include a variety of metadata (i.e., data about data). As an example, the metadata 92 can include metadata corresponding to a routing diagram. In some implementations, the metadata corresponding to a routing diagram is internal metadata contained within a routing diagram file that includes the routing diagram. In some other implementations, the metadata corresponding to a routing diagram is external metadata contained outside of a routing diagram file that includes the routing diagram. FIG. 27 shows metadata in the form of external metadata contained outside of a routing diagram file. As shown in FIG. 27, the external metadata can include metadata corresponding to multiple routing diagrams.

As another example, the metadata 92 can include data indicative of user-selections made with respect to a routing diagram and/or a DUS. For instance, the metadata 92 can include a DUS identifier. Additionally or alternatively, the metadata 92 can include identifiers of a routing diagram selected to be displayed, a routable component or a connectable component selected from within a displayed routing diagram, and/or a state of whether a routable component or connectable component was highlighted at a time when the display 84 switches from displaying a currently displayed routing diagram (which subsequently becomes a departure routing diagram) to displaying a different routing diagram. A portion of the metadata 92 can include a routing diagram identifier in the form of metadata shown in FIG. 29. Other examples of the metadata 92 are also possible.

The navigation sequence data 93 can include data that indicates a sequence of routing diagrams displayed on the display 84. The sequence of displayed routing diagrams can include a currently displayed routing diagram and one or more previously displayed routing diagrams. In at least some implementations, the navigation sequence data 93 is no longer tracked for a particular DUS after a different DUS is selected. In at least some of those implementations, the navigation sequence data 93 for the particular DUS is deleted and/or overwritten by navigation sequence data corresponding to the different DUS. In some other implementations, the navigation sequence data for the particular DUS continues to be tracked for some amount of time after the different DUS is selected. An advantage of these other implementations, is that a user can use the navigation sequence data 93 to select a previously displayed routing diagram and to cause that routing diagram to be displayed without having to re-select the particular DUS. FIG. 28, described below, includes a table showing navigation sequence data pertaining to displaying routing diagrams in accordance with one or more of the example implementations. A previously displayed routing diagram can be referred to as a departure routing diagram.

The highlight status data 94 can include data that indicates which component(s) on a routing diagram currently displayed on the display 84 are highlighted. The highlight status data 94 can also include data that indicates which component(s) were highlighted on a routing diagram previously displayed on the display 84 at a time when a hotspot on the routing diagram was selected. The highlight status data 94 can therefore represent a snapshot and/or screenshot of a departure routing diagram that is no longer displayed after the hotspot was selected. In response to selecting that departure routing diagram (or an identifier of that departure diagram) from a routing diagram history (e.g., the routing diagram history 237 shown in FIG. 15), the processor 81 can cause the selected departure routing diagram to be displayed on the display 84 as that departure routing diagram appeared when the hotspot was selected therefrom.

In at least some implementations, the highlight status data 94 is no longer tracked for a particular DUS after a different DUS is selected. In at least some of those implementations, the highlight status data 94 for the particular DUS is deleted and/or overwritten by highlight status data corresponding to the different DUS. In some other implementations, the highlight status data for the particular DUS continues to be tracked for some amount of time after the different DUS is selected.

An advantage of these other implementations, is that the processor 81 can use the highlight status data 94 to highlight component(s) on a routing diagram (previously displayed) when that routing diagram is selected to be displayed again without the user having to select those component(s) again. A benefit of storing and referring to the highlight status data 94 is that the processor 81 can cause a selected routing diagram to be displayed again (i.e., with particular component(s) highlighted) in the same way the routing diagram was displayed at a time a hotspot within that routing diagram was selected. FIG. 28, described below, includes a table showing highlight status data pertaining to displaying routing diagrams in accordance with one or more of the example implementations.

The device selection data 95 can include data indicative of a DUS. The processor 81 can use the device selection data 95 to populate a GUI 160 (shown in FIG. 11) and to determine the data indicative of a DUS based on selections on the GUI 160 through use of the user interface 83. The DUS indicated by the device selection data 95 can be connected to the computing system 80. Alternatively, the DUS indicated by the device selection data 95 is not connected to the computing system 80.

In at least some implementations, the processor 81 uses the data indicative of a DUS to determine a routing diagram (e.g., one or more routing diagrams) and/or a set of routing diagrams (e.g., one or more sets of routing diagrams) from within the routing diagram 91. In at least some other implementations, the processor 81 uses the data indicative of a DUS to request from a server (e.g., the server 71 or the server 100 shown in FIG. 9) a routing diagram (e.g., one or more routing diagrams) and/or a set of routing diagrams (e.g., one or more sets of routing diagrams) from within the routing diagram 111 (shown in FIG. 10).

Next, FIG. 9 is a block diagram of a server 100 in accordance with one or more of the example implementations. The server 100 includes a processor 101, a computer-readable memory 102, a communication interface 103, a power supply 104, and/or a housing 105. The server 100 can also include a data bus 106 to operatively couple the processor 101, the computer-readable memory 102, the communication interface 103, and/or the power supply 104 to each other. The server 100 can also include an electrical circuit 107 to couple the power supply 104 to the processor 101, the computer-readable memory 102, and/or the communication interface 103. The server 71 can be arranged like the server 100. The server 100 can operate within the network architecture 70 like, in place of, and or in addition to the server 71.

Next, FIG. 10 shows content of the computer-readable memory 102 in accordance with one or more of the example implementations. As shown in FIG. 10, the computer-readable memory 102 includes computer-readable program instructions (CRPI) 110, a routing diagram 111, metadata 112, navigation sequence data 113, highlight status data 114, and/or device selection data 115. Other examples of data stored in the computer-readable memory 102 are also possible.

The CRPI 110 can include one or more program instructions executable by the processor 101. In general, the CRPI 110 includes program instructions to cause the server 100 to perform any function described herein as being performed by the server 100 or to cause any component of the server 100 to perform any function described and/or shown herein as being performed by that component of the server 100.

As an example, the CRPI 110 can include program instructions that are executable by the processor 101 to serve one or more client computing systems like the client 74. One or more of the client computing systems that are served by the processor 101 executing the CRPI 110 can include and/or be arranged like the computing system 80.

As yet another example, the CRPI 110 can include program instructions that are executable by the processor 101 to output data for displaying a GUI (e.g., a GUI 160, 201, 228, 241 shown in FIG. 11 to FIG. 15) on the display 84. As an example, that data can include a markup language file, such as a hyper-text markup language page or file including a GUI, a routing diagram within the routing diagram 111, metadata from the metadata 112, navigation sequence data from the navigation sequence data 113, highlight status data from the highlight status data 114 and/or device selection data from the device selection data 115. The device selection data output for displaying a GUI can be device selection data used to populate the GUI 160 shown in FIG. 11.

As yet another example, the CRPI 110 can include program instructions that are executable by the processor 101 to receive a request for a routing diagram (i.e., a routing diagram request), determine a routing diagram to output in response to the request, and to output the routing diagram to the computing system that requested the routing diagram. As an example, the request for a routing diagram can include a DUS identifier and an identifier of a component or system within a DUS corresponding to the DUS identifier. That request can also include an identifier of the computing system 80 that requested the routing diagram. As another example, the request for a routing diagram can include a routing diagram identifier (e.g., a routing diagram identifier in a form shown in FIG. 29. Similarly, this request can also include an identifier of the computing system 80 that requested the routing diagram.

As yet another example, the CRPI 110 can include program instructions that are executable by the processor 101 to determine a routing diagram based on a routing diagram request received from a computing system 80. Execution of those program instruction can cause the processor 101 to refer to metadata, such as the metadata shown in FIG. 29 to determine a routing diagram. For example, assuming that the metadata shown in FIG. 29 corresponds to a DUS identifier included within the request and the request includes an identifier of a coil pack system, the processor 101 can determine that the routing diagram 51, 52 correspond to that DUS and system. Execution of the program instructions can cause the processor 101 to output one of the routing diagram 51, 52 in response to the request. As another example, assuming that the metadata shown in FIG. 29 corresponds to a DUS currently identified for the computing system and request includes a particular identifier of a routing diagram set and a particular identifier of a routing identifier (e.g., (22, 2) shown in FIG. 29), the processor 101 can determine that the routing diagram 38 should be output in response to the request.

As yet another example, the CRPI 110 can include program instructions that are executable by the processor 101 to output a routing diagram to the computing system 80. Execution of those program instructions can cause the processor 101 to provide the routing diagram to the communication interface 103 which, in turns, transmits the routing diagram over the communication network 73 to the computing system 80. In at least some implementations, outputting the routing diagram includes outputting a GUI that includes the routing diagram, such as a GUI 241 shown in FIG. 14 and FIG. 15. In at least some other implementations, outputting the routing diagram includes outputting a routing diagram file that can be populated into a GUI, such as the GUI 241, and metadata corresponding to the routing diagram file. That metadata can include metadata indicating which component(s) in the routing diagram are to be highlighted when initially displayed.

As yet another example, the CRPI 110 can include program instructions that are executable by the processor 101 to output to the computing system 80 data that indicates which routable component(s) and/or connectable component(s) on a routing diagram are to be highlighted when that routing diagram is displayed again on the display 84.

The routing diagram 111 includes one or more routing diagrams. As an example, the routing diagram 111 can include the routing diagrams described as being within the database 10 shown in FIG. 2. As another example, the routing diagram 111 can include the routing diagrams described as being within the routing diagrams 11 shown in FIG. 3. As yet another example, the routing diagram 111 can include the routing diagrams shown in FIG. 4, FIG. 16, FIG. 17, FIG. 18, FIG. 19, FIG. 20, FIG. 21, and/or FIG. 22.

The metadata 112 can include metadata corresponding to and/or included within the routing diagram 111, the navigation sequence data 113, the highlight status data 114, and/or the device selection data 115. The metadata 112 can include metadata received from multiple computing systems. That metadata can be arranged like the metadata 92 shown in FIG. 8.

The navigation sequence data 113 can include navigation sequence data for one or more computing systems. The navigation sequence data for each of the one or more computing systems can be arranged like the navigation sequence data 93 shown in FIG. 8.

The highlight status data 114 can include highlight status data for one or more computing systems. The highlight status data for each of the one or more computing systems can be arranged like the highlight status data 94 shown in FIG. 8.

The device selection data 115 can include device selection data corresponding to one or more DUS and one or more computing systems. The device selection data 115 can include data for populating a GUI (e.g., the GUI 160 shown in FIG. 11) from which a device (e.g., a DUS) can be selected.

III. Example Components of Apparatus and System

1. Processor

A processor, such as the processor 61, the processor 81, the processor 101, or any other processor discussed in this description, can include one or more processors. Any processor discussed in this description can thus be referred to as "at least one processor" and/or "one or more processors." Any processor discussed in this description can include a general purpose processor (e.g., an INTEL® single core microprocessor or an INTEL® multicore microprocessor), and/or a special purpose processor (e.g., a digital signal processor, a graphics processor, an embedded processor, or an application specific integrated circuit (ASIC) processor). Furthermore, any processor discussed in this description can include and/or be operatively connected to a memory controller that controls a flow of data going to and from a memory, such as the processor 61 including and/or being operatively coupled to the computer-readable memory 62, the processor 81 including and/or being operatively coupled to the computer-readable memory 82, and/or the processor 101 including and/or being operatively coupled to the computer-readable memory 102. In at least some implementations of the server 100, the INTEL® multicore microprocessor can include one or more INTEL® XEON® processors having between four and twenty-eight cores.

Any processor discussed in this description can be operable to execute computer-readable program instructions (CRPI). Any CRPI discussed in this description can, for example, include assembler instructions, machine instructions, machine dependent instructions, microcode, firmware instructions, state-setting data, and/or either source code or object code written in one or any combination of two or more programming languages. As an example, a programming language can include an object oriented programming language such as Java, Python, or C++, or a procedural programming language, such as the "C" programming language. Any processor discussed in this description can be operable to read a computer-readable file, such as a markup language file, a flat file, a comma-separated-variable (CSV) file, a portable document format (PDF) file, or a text file. Any processor discussed in this description can be operable to execute hard-coded functionality in addition to or as an alternative to software-coded functionality (e.g., via CRPI).

In at least some implementations, the processor 81 can be programmed to perform any function(s) described in this description as being performed by the computing system 60, the client 74, and/or the computing system 80. Similarly, in at least some implementations, the processor 101 can be programmed to perform any function(s) described in this description as being performed by the server 71 and/or the server 100.

An embedded processor refers to a processor with a dedicated function or functions within a larger electronic, mechanical, pneumatic, optical, vacuum, and/or hydraulic device, and is contrasted with a general purpose computer. The embedded processor can include a central processing unit chip used in a system that is not a general-purpose workstation, laptop, or desktop computer. In some implementations, the embedded processor can execute an operating system, such as a real-time operating system (RTOS). As an example, the RTOS can include the SMX® RTOS developed by Micro Digital, Inc., such that the embedded processor can, but need not necessarily, include (a) an advanced RISC (reduced instruction set computer) machine (ARM) processor (e.g., an AT91SAM4E ARM processor provided by the Atmel Corporation, San Jose, California), or (b) a COLDFIRE® processor (e.g., a 52259 processor) provided by NXP Semiconductors N.V., Eindhoven, Netherlands. A general purpose processor, a special purpose processor, and/or an embedded processor can perform analog signal processing and/or digital signal processing.

2. Memory

A memory, such as the computer-readable memory 62, the computer-readable memory 82, the computer-readable memory 102, and/or any other memory discussed in this description, can include one or more memories. Any memory discussed in this description can thus be referred to as "at least one memory" and/or "one or more memories." A memory can include a non-transitory memory, a transitory memory, or both a non-transitory memory and a transitory memory. A non-transitory memory, or a portion thereof, can be located within or as part of a processor (e.g., within a single integrated circuit chip). A non-transitory memory, or a portion thereof, can be separate and distinct from a processor.

A non-transitory memory can include a volatile or non-volatile storage component, such as an optical, magnetic, organic or other memory or disc storage component. Additionally or alternatively, a non-transitory memory can include or be configured as a random-access memory (RAM), a read-only memory (ROM), a programmable read-only memory (PROM), an erasable programmable read-only memory (EPROM), a flash memory, an electrically erasable programmable read-only memory (EEPROM), or a compact disk read-only memory (CD-ROM). The RAM can include static RAM or dynamic RAM. A non-transitory memory can be configured as a removable storage device, a non-removable storage device, or a combination thereof. A removable storage and/or a non-removable storage device can, but need not necessarily, include a magnetic disk device such as a flexible disk drive or a hard-disk drive (HDD), an optical disk drive such as a compact disc (CD) drive and/or a digital versatile disk (DVD) drive, a solid state drive (SSD), or a tape drive.

A transitory memory can include, for example, CRPI provided over a communication network, such as the communication network 73.

A "memory" can be referred to by other terms such as a "computer-readable memory," a "computer-readable medium," a "computer-readable storage medium," a "data storage device," a "memory device," "computer-readable media," a "computer-readable database," "at least one computer-readable medium," or "one or more computer-readable mediums." Any of those alternative terms can be preceded by the prefix "transitory" if the memory is transitory or "non-transitory" if the memory is non-transitory. For a memory including multiple memories, two or more of the multiple memories can be the same type of memory or different types of memories.

3. User Interface

A user interface, such as the user interface 63, the user interface 83 or any other user interface described in this description, can include one or more user interface components. A user interface component can be operable by a user to enter an input (e.g., data and/or a selection) to the computing system 80 and/or to provide an output, such as a visual, audible, or haptic output. Unless stated otherwise, an input entered via the user interface 63, 83 is and/or can be provided to the processor 61, 81, respectively. In at least some implementations, the user interface 63, 83 is operable to enter an input on and/or using a graphical user interface (GUI). As an example, the input entered on and/or using the GUI can include a selection of a connectable component, a component identifier, a routable component, or a hotspot. Those selectable items can be located on a routing diagram shown on the GUI. Examples of those selectable items are discussed throughout this application.

In at least some implementations, the user interface 83 includes a keyboard having one or more components configured for entering data and/or a selection into the computing system 80. The keyboard can include one or more keys. In at least some implementations, each key includes a push button, such as a press-and-hold button or a press-and-release button. In at least some implementations, at least a portion of the keyboard is implemented as part of a touch screen display that includes soft keys, such as capacitive or resistive keys of a touch screen display. In still other implementations, the soft keys of the keyboard on the touch screen display can include a power on/off key, a yes key and a no key, and/or four directional cursor keys (such as left, up, right, down keys). The keyboard can, but need not necessarily, include a QWERTY keyboard. In at least some implementations, the user interface 83 includes a pointing device such as a computing device mouse, a joystick, and/or or a microphone for receiving spoken inputs. In at least some implementations, the user interface 83 includes a camera and one or more user-selectable controls for capturing an image, such as an image of a code representing a DUS identifier.

4. Display

A display, such as the display 64, the display 84, or any other display described in this description, can include one or more displays. As an example, a display can include a capacitive touch screen display, a resistive touch screen display, a plasma display, a light emitting diode (LED) display, a cathode ray tube display, an organic light-emitting diode (OLED) display, or a liquid crystal display (LCD). An OLED display can include an active-matrix OLED or a passive-matrix OLED. The LCD can include a backlit, color LCD. The display 64, 84 can include a touch screen display with the LCD. For instance, the display 64, 84 can include a capacitive or resistive touch screen display. Other examples of the display 64, 84 are also possible. The touch screen display can be operable for entering an input to select any item shown on the display 64, 84. The processor 81 can determine each, any, or all selection(s) made using the touch screen display.

In some implementations, the display 84 is configured to display a GUI. In at least some of those implementations, the GUI can be displayed in response to the processor 81 executing the application 96. In those or in other implementations, the GUI can be arranged like a GUI or some portion of a GUI shown in any one or more of FIG. 11 to FIG. 15. In at least some of those implementations or in other implementations, the display 84 is configured to display a routing diagram, such as any routing diagram described in this description or shown in the drawings. Further, in at least some of the implementations, the display 84 is configured to display a still image (such as a visible light image, a thermal image, and/or a blended image), a video, a text file (such as a text file with a PDF file extension or an XML file extension), a hypertext markup language file, a web page, a menu, and/or some other visual content configured to be displayed on a display. The display 84 can be a component of the user interface 83.

5. Communication Interface

A communication interface, such as the communication interface 85, the communication interface 103, and/or any other communication interface described in this description, can include one or more communication interfaces operable to transmit data to one or more other devices including a communication interface and/or to receive data transmitted by one or more other device including a communication interface. In some implementations, the communication interface 85, 103 transmits data directly to the other device(s) and/or receives data directly from the other device(s). In some other implementations, the communication interface 85, 103 transmits data indirectly to the other devices and/or receives data indirectly from the other device(s). The data transmitted or received by the communication interface 85, 103 can be carried by a communication network, such as the communication network 73.

The communication interface 85, 103 can include one or more transceivers. Each transceiver includes one or more transmitters configured to transmit data onto a network, such as the communication network 73, a data bus, and/or some other type of connection mechanism. Each transceiver includes one or more receivers configured to receive data or a communication carried over a network, such as the communication network 73, a data bus, and/or some other type of connection mechanism. Unless stated differently, any data described as being transmitted to a device or system is considered to be received by that device or system. Similarly, unless stated differently, any data described as being received from a device or system is considered to be transmitted by that device or system directly or indirectly to the receiving device or system. For some implementations, a transceiver can include a transmitter and a receiver in a single semiconductor chip. In at least some of those implementations, the semiconductor chip can include a processor.

In at least some of the example implementations, a transmitter, such as a transmitter within any transceiver described in this description, transmits radio signals carrying data, and a receiver, such as a receiver within any transceiver described in this description, receives radio signals carrying data. A transceiver with a radio transmitter and radio receiver can include one or more antennas and can be referred to as a "radio transceiver," an "RF transceiver," or a "wireless transceiver." "RF" represents "radio frequency."

A radio signal transmitted or received by a radio transceiver can be arranged in accordance with one or more wireless communication standards or protocols such as an IEEE® standard, such as (i) an IEEE® 802.11 standard for wireless local area networks (wireless LAN) (which is sometimes referred to as a WI-FI® standard) (e.g., 802.11a, 802.11b, 802.11g, 802.11n or 802.11ac), (ii) an IEEE® 802.15 standard (e.g., 802.15.1, 802.15.3, 802.15.4 (ZIG-BEE®), or 802.15.5) for wireless personal area networks (PANs), (iii) a BLUETOOTH® version 4.1 or 4.2 standard developed by the Bluetooth Special Interest Group (SIG) of Kirkland, Washington, (iv) a cellular wireless communication standard such as a long term evolution (LTE) standard, (v) a code division multiple access (CDMA) standard, (vi) an integrated digital enhanced network (IDEN) standard, (vii) a global system for mobile communications (GSM) standard, (viii) a general packet radio service (GPRS) standard, (ix) a universal mobile telecommunications system (UMTS) standard, (x) an enhanced data rates for GSM evolution (EDGE) standard, (xi) a multichannel multipoint distribution service (MMDS) standard, (xii) an International Telecommunication Union (ITU) standard, such as the ITU-T G.9959 standard referred to as the Z-Wave standard, (xiii) a 6LoWPAN standard, (xiv) a Thread networking protocol, (xv) an International Organization for Standardization (ISO/International Electrotechnical Commission (IEC) standard such as the ISO/IEC 18000-3 standard for Near Field Communication (NFC), (xvi) the Sigfox communication standard, (xvii) the Neul communication standard, or (xviii) the LoRaWAN communication standard. Other examples of the wireless communication standards or protocols are possible.

In at least some of the implementations, a transmitter, such as a transmitter within any transceiver described in this description, can be configured to transmit a signal (e.g., one or more signals or one or more electrical waves) carrying or representing data onto an electrical circuit (e.g., one or more electrical circuits). Similarly, a receiver, such as a receiver within any transceiver described in this description, can be configured to receive via an electrical circuit a signal carrying or representing data over the electrical circuit. The electrical circuit can be part of a network, such as the communication network 73, or a data bus, such as the data bus 87 or the data bus 106. The signal carried over an electrical circuit can be arranged in accordance with a wired communication standard such as a Transmission Control Protocol/Internet Protocol (TCP/IP), an IEEE® 802.3 Ethernet communication standard for a LAN, a data over cable service interface specification (DOCSIS standard), such as DOCSIS 3.1, a universal serial bus (USB) specification, or some other wired communication standard. In accordance with at least some implementations, an electrical circuit can include a wire, a printed circuit on a substrate, and/or a network cable (e.g., a single wire, a twisted pair of wires, a fiber optic cable, a coaxial cable, a wiring harness, a power line, a printed circuit, a CAT5 cable, and/or CAT6 cable). The wire can be referred to as a "conductor". As an example, transmission of data over the conductor can occur electrically and/or optically.

A transceiver that is configured to carry out communications over the communication network 73 can include a modem, a network interface card, a local area network (LAN) on motherboard (LOM), and/or a chip mountable on a circuit board. As an example the chip can include a CC3100 Wi-Fi® network processor available from Texas Instruments, Dallas, Texas, a CC256MODx Bluetooth® Host Controller Interface (HCI) module available from Texas instruments, or a different chip for communicating via Wi-Fi®, Bluetooth® or another communication protocol.

A network device within and/or operatively coupled to the communication network 73 and/or that communicates via the communication network 73 using a packet-switched technology can be locally configured for a next 'hop' in the communication network 73 (e.g., a device or address where to send data to, and where to expect data from). As an example, a device (e.g., a transceiver) configured for communicating using an IEEE® 802.11 standard can be configured with a network name, a network security type, and a password. Some devices auto-negotiate this information through a discovery mechanism (e.g., a cellular phone technology).

The data transmitted by a communication interface can include a destination identifier or address of a computing system to which the data is to be transmitted. The data or communication transmitted by a communication interface can include a source identifier or address of the computing system including the communication interface. The source identifier or address can be used to send a response to the computing system that includes the communication interface that transmitted the data.

6. Power Supply

A power supply, such as the power supply 86, the power supply 104, and/or any other power supply described in this description can be arranged in various configurations. As an example, the power supply 86 and/or the power supply 104 can include circuitry to receive AC current from an AC electrical supply (e.g., electrical circuits operatively connected to an electrical wall outlet) and a converter to convert the AC current to a DC current for supplying to one or more of the components of the computing system 80 or the server 100, respectively. As another example, the power supply 86 and/or the power supply 104 can include a battery or be battery operated. As yet another example, the power supply 86 and/or the power supply 104 can include a solar cell or be solar operated. The power supply 86 can include and/or operatively connect to electrical circuits arranged to distribute electrical current throughout the power supply 86 and/or the computing system 80. Likewise, the power supply 104 can include and/or operatively connect to electrical circuits arranged to distribute electrical current throughout the power supply 104 and/or the server 100. Other examples of the power supply 86 and/or the power supply 104 are also possible.

7. Housing

A housing, such as the housing 88, the housing 105, and/or any other housing described in this description, can be configured in any of a variety of configurations. In at least some implementations of the server 100, the housing 105 surrounds and/or supports at least a portion of one other component of the server 100. For example, the housing 105 can surround and/or support at least a portion of the processor 101, the computer-readable memory 102, the communication interface 103, and/or the power supply 104. Similarly, in at least some implementations of the computing system 80, the housing 88 surrounds and/or supports at least a portion of one other component of the computing system 80. For example, the housing 88 can surround and/or support at least a portion of the processor 81, the computer-readable memory 82, the user interface 83, the display 84, the communication interface 85, and/or the power supply 86. A housing can be made from various materials. In some example implementations, at least a portion of the housing is made from a plastic material (e.g., acrylonitrile butadiene styrene (ABS)). In those or in other implementations, at least a portion of the housing is metallic.

IV. Example Graphical User Interfaces

The computing system 80 is operable to display a GUI. In at least some implementations, a GUI displayed by the computing system 80 includes an interface that is operable to enter criteria for selecting a device, such as a DUS. In at least some implementations, a GUI that includes the interface operable to enter criteria for selecting a device also includes a container for displaying a routing diagram.

Figure 11:
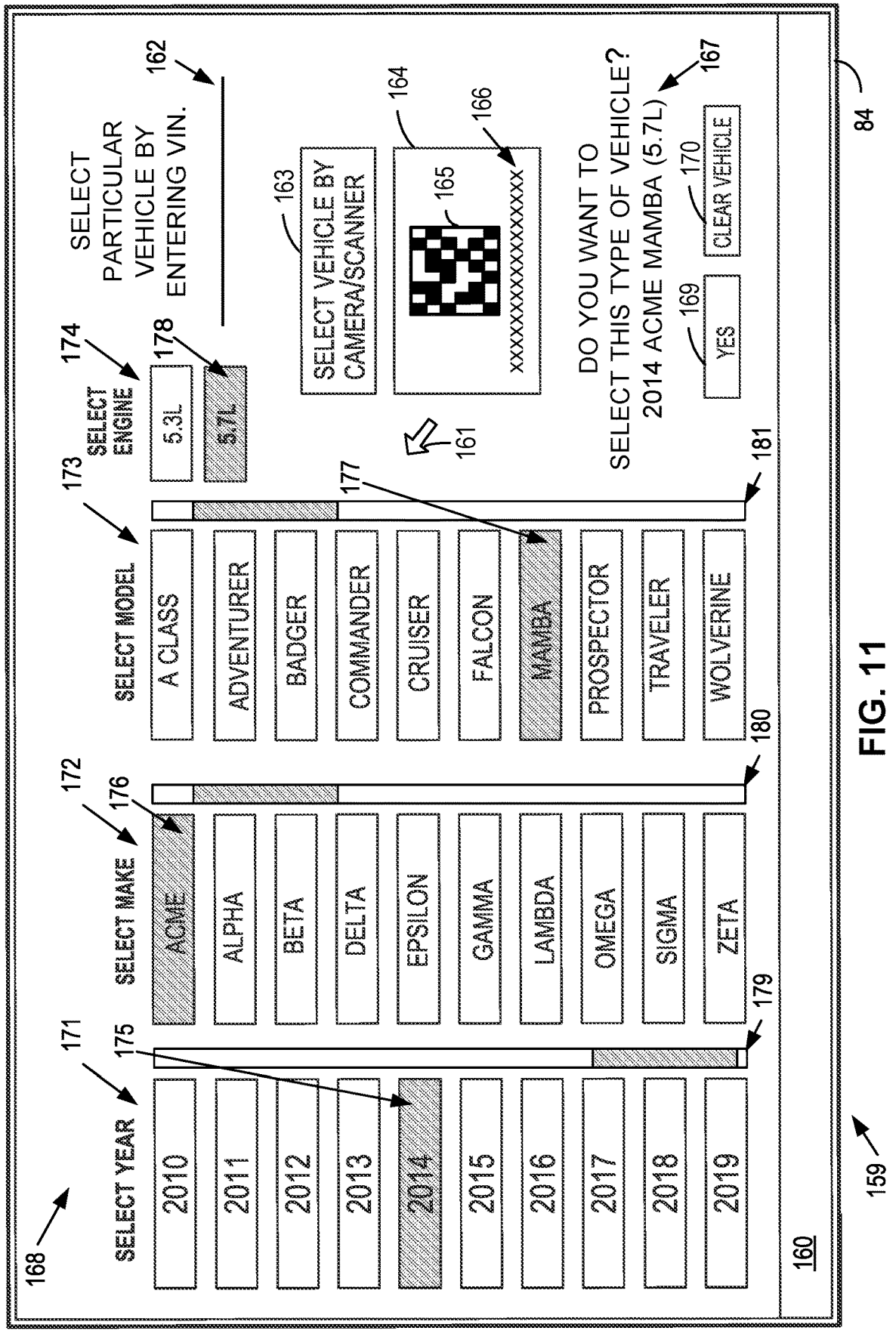

FIG. 11 shows a screen shot 159 of the display 84 while the display 84 is displaying a GUI 160. The GUI 160 includes a device selection menu 168. A device selection menu, such as the device selection menu 168, includes one or more user-selectable controls operable to provide a processor with a signal indicative of a selection of a characteristic of the device. In some implementations, the characteristic of the device is an identifier of the device itself such that no other characteristic needs to be entered to distinguish the device from other devices. In other implementations, the characteristic of the device is one of multiple characteristics a processor uses to distinguish the device from other devices. The device selection menu 168 includes user-selectable controls to select characteristics of a device in the form of a vehicle.

The GUI 160 can include a cursor 161 movable to point to a USC or another item of the GUI 160. The processor 81 can detect the USC or the other item of the GUI 160 is selected when the cursor 161 is disposed on the USC or the other item of the GUI 160. The other GUIs shown in the figures can also include a cursor, similar to the cursor 161, for use in selecting an item of that GUI. For implementations in which the display 84 includes a touch screen display, the GUIs shown in FIG. 11 to FIG. 15 may or may not include a cursor.

As shown in FIG. 11, the GUI 160 includes a year selection menu 171 in which a year USC 175 representing the year 2014 has been selected. The GUI 160 includes a make selection menu 172 in which a make USC 176 representing a make Acme has been selected. The GUI 160 includes a model selection menu 173 in which a model USC 177 representing the model Mamba has been selected. The makes and models shown in FIG. 7 are fictitious. In practice, the makes and models would include real vehicle makes and models. The GUI 160 includes an engine selection menu 174 in which an engine USC 178 representing a 5.7L engine has been selected. The year selection menu 171 includes a scroll bar 179 to cause the year selection menu 171 to display year(s) not currently shown in the year selection menu 171. Similarly, the make selection menu 172 includes a scroll bar 180 to cause the make selection menu 172 to display make(s) not currently shown in the make selection menu 172. Likewise, the model selection menu 173 includes a scroll bar 181 to cause the model selection menu 173 to display model(s) not currently shown in the model selection menu 173. Other examples of a selected year, make, model, and engine are also possible.

In at least some implementations, the make selection menu 172 is populated with vehicle makes after a year is selected from the year selection menu 171. Similarly, in at least some implementations, the model selection menu 173 is populated with vehicle models after a year is selected from the year selection menu 171 and after a make is selected from the make selection menu 172. Similarly, in at least some implementations, the engine selection menu 174 is populated with engine identifiers after a model is selected from the model selection menu 173 is populated with vehicle models after a year is selected from the year selection menu 171 and after a make is selected from the make selection menu 172. In alternative implementations, each of the year selection menu 171, the make selection menu 172, the model selection menu 173, or the engine selection menu 174 is in a separate GUI without the other of the year selection menu 171, the make selection menu 172, the model selection menu 173, and the engine selection menu 174.

In at least some implementations, the GUI 160 also includes a VIN USC 162 for entering an identifier of a particular vehicle. As an example, the VIN USC 162 can be used to type or key-in a vehicle identification number (VIN) associated with the particular vehicle. As another example, the VIN USC 162 can be used to cause the communication interface 85 to request a VIN from an ECU in the particular vehicle. The processor 81 can receive the requested VIN and determine one or more from among a year, a make, a model, an engine or a serial number corresponding to the particular vehicle from the VIN.

The GUI 160 includes a vehicle selector USC 163 for capturing a visual indication of a particular vehicle. As an example, in response to selection of the vehicle selector USC 163, the processor 81 can cause a camera of the user interface 83 to capture an image, such as an image of a code 165 representing a VIN, and to cause a GUI, such as the GUI 160 or a different GUI, to display a window 164 showing the image of code 165 and to display a representation of the alpha-numeric representation of the VIN 166 as determined by the processor 81 decoding the code 165. As yet another example, in response to selection of the vehicle selector USC 163, the processor 81 can cause a scanner of the user interface 83 to generate an image, such as an image of the code 165, and to cause a GUI, such as the GUI 160 or a different GUI, to display the window 164 showing the image of the code 165 and to display a representation of the alpha-numeric representation of the VIN 166 as determined by the processor 81 decoding the code 165.

The GUI 160 also includes a USC 169 to select a device (e.g., a vehicle) based on YMME criteria entered using the GUI 160 and indicated by a vehicle identifier 167. The GUI 160 further includes a USC 170 to clear the vehicle identifier 167 and the YMME criteria entered using the GUI 160 so that a user can select different YMME criteria for a desired vehicle type.

Figure 12:
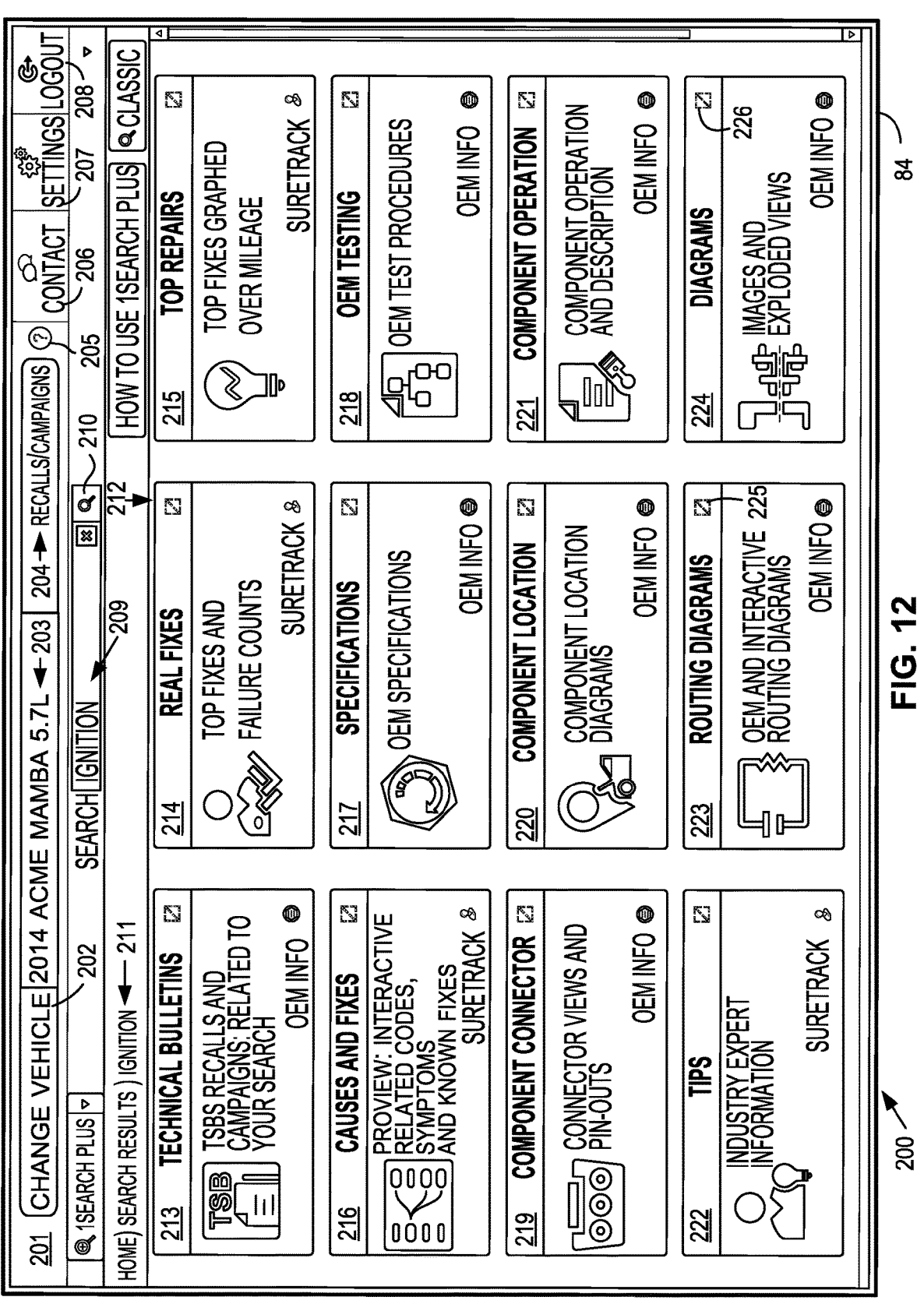

Next, FIG. 12 shows a screen shot 200 of the display 84 while the display 84 is displaying a GUI 201. As shown in FIG. 12, the GUI 201 includes a DUS GUI selector 202, a selected DUS identifier 203, a recalls/campaigns GUI selector 204, a help GUI selector 205, a contact GUI selector 206, a settings GUI selector 207, a logout GUI selector 208, a further search field 209, a search USC 210, a search result identifier 211, and a set of content selectors 212. In at least some implementations, a content selector of the set of content selectors 212 is selectable from the display 84 and the GUI 201. In at least some of those implementations, selection of a content selector causes a processor to expand a size of a container including the selected content selector on the display 84. In at least some other of those implementations, selection of a content selector causes a processor to display a different GUI on the display 84. In at least some other implementations, a content selector of the set of content selectors 212 can be un-selectable from the display 84 and the GUI 201 if content corresponding to that content selector is not available.

The DUS GUI selector 202 is selectable to cause the processor 81 to enter a mode for changing which DUS is identified in the selected DUS identifier 203. In some implementations, entering this mode can include clearing the selected DUS identifier 203 so that no DUS is indicated by the selected DUS identifier 203. In at least some implementations, entering this mode can include the processor 81 outputting a menu from which a DUS can be selected and entering an identifier of the selected DUS into the selected DUS identifier 203. In at least some implementations, selection of the DUS GUI selector 202 causes a processor 81 to output the GUI 160 shown in FIG. 11.

The selected DUS identifier 203 is selectable to cause the processor 81 to output an identifier of a selected DUS on the display 84. In accordance with the implementations, in which the DUS includes a vehicle, the selected DUS identifier 203 can indicate a year/make/model/engine (YMME) or some other type of vehicle identifier. Other types of identifiers can be used for other types of DUS.

The recalls/campaigns GUI selector 204 is selectable to cause the processor 81 to perform a search of the computer-readable memory 82 and/or to transmit to the server 100 a request to search the computer-readable memory 102 for information regarding recalls or campaigns, such as recalls or campaigns generated by an OEM of the DUS indicated in the selected DUS identifier 203 and/or an OEM of a component identified in the further search field 209 for the DUS indicated in the selected DUS identifier 203. The search performed or requested can be based on the text entered into the further search field 209 and/or the DUS indicated at the selected DUS identifier 203. Upon locating and/or receiving the information regarding recalls or campaigns, the processor 81 can output the information regarding recalls or campaigns on the display 84.

The help GUI selector 205 is selectable to cause the processor 81 to output on the display 84 a GUI configured for a user to enter a selection to search for and/or request help regarding some topic, such as the GUI 201 and/or the application 96.

The contact GUI selector 206 is selectable to cause the processor 81 to output on the display 84 a GUI configured for a user to enter a selection to search for and/or request information on how to contact an entity associated with the GUI 201 and/or the application 96.

The settings GUI selector 207 is selectable to cause the processor 81 to output on the display 84 one or more application settings and options for changing the application setting(s). As an example, the application setting can, but need not necessarily, include a font size setting, a communication network setting, a password setting, or some other application setting.

The logout GUI selector 208 is selectable to cause the processor 81 to log out of the application 96. Logging out of the application 96 could include the processor 81 transmitting to the server 100 a messaging indicating logging out has been requested.

The further search field 209 can include a text field to enter text indicative of a further search criterion, such as a component identifier. Text could be entered into the further search field 209 using the user interface 83. As an example, the text entered into the further search field could be indicative of a component located on the DUS indicated in the selected DUS identifier 203. As shown in FIG. 12, the text could include the search term "Ignition" indicative of an ignition system on the DUS indicated in the selected DUS identifier 203.

The search USC 210 is selectable to cause the processor 81 to perform a search of the computer-readable memory 82 and/or to transmit to the server 100 a request to search the computer-readable memory 102. The search performed or requested can be based on the text entered into the further search field 209 and/or the DUS indicated at the selected DUS identifier 203.

The search result identifier 211 indicates one or more search terms used to obtain content to populate within a content selector of the set of content selectors 212 and/or a GUI displayable in response to selecting the content selector. In at least some implementations, the search result identifier 211 indicates a search term entered at the selected DUS identifier 203 and/or at the further search field 209.

Each content selector of the set of content selectors 212 pertains to one or more categories of service information that is displayable in the content selector and/or within a GUI displayable in response to selecting the content selector. In at least some implementations, each content selector of the set of content selectors 212 includes a service information category title to indicate what type of service information will be displayed if that content selector is selected and/or expanded (e.g., expanded as a separate GUI). A content selector can be referred to by its service information category title. Accordingly, the set of content selectors 212 includes a technical bulletins content selector 213, a real fixes content selector 214, a top repairs content selector 215, a causes and fixes content selector 216, a specifications content selector 217, an OEM testing content selector 218, a component connector content selector 219, a component location content selector 220, a component operation content selector 221, a tips content selector 222, a routing diagrams content selector 223, and a diagrams content selector 224. Each content selector of the set of content selectors 212 can include an expander user-selectable control. An expander USC 225 of the routing diagrams content selector 223 and an expander USC 226 of the routing diagrams content selector 224 are specifically identified in FIG. 12.

The processor 81 is operable to determine that the routing diagrams content selector 223 has been selected from the GUI 201 and/or the display 84. In some implementations, in response to determining that the routing diagrams content selector 223 has been selected, the processor 81 transmits to the server 100 a request for a routing diagram. That request can include an identifier of a selected DUS (e.g., a 2014 Acme Mamba 5.7L) and information entered into the further search field 209 (e.g., Ignition).

In at least some other implementations, in response to determining that the routing diagrams content selector 223 has been selected, the processor 81 can responsively output on the display 84 a particular routing diagram that corresponds to the search criteria, such as a DUS identifier and/or one or more terms entered into the further search field 209.

In at least some other implementations, in response to determining that the routing diagrams content selector 223 has been selected, the processor 81 responsively outputs on the display 84 a GUI with a list of selectable routing diagrams for a DUS identified by the selected DUS identifier 203 and/or an entry in the further search field 209, such as "Ignition." In some implementations, the list of selectable routing diagrams includes an identifier for a set of routing diagrams that includes two or more wiring diagrams. In some implementations, the processor 81 requests and receives the list of selectable routing diagrams from the server 100. In other implementations, the processor 81 determines the list of selectable routing diagrams by searching the computer-readable memory 82 based on search criteria, such as a DUS identifier and/or one or more terms entered into the further search field 209.

Figure 13:
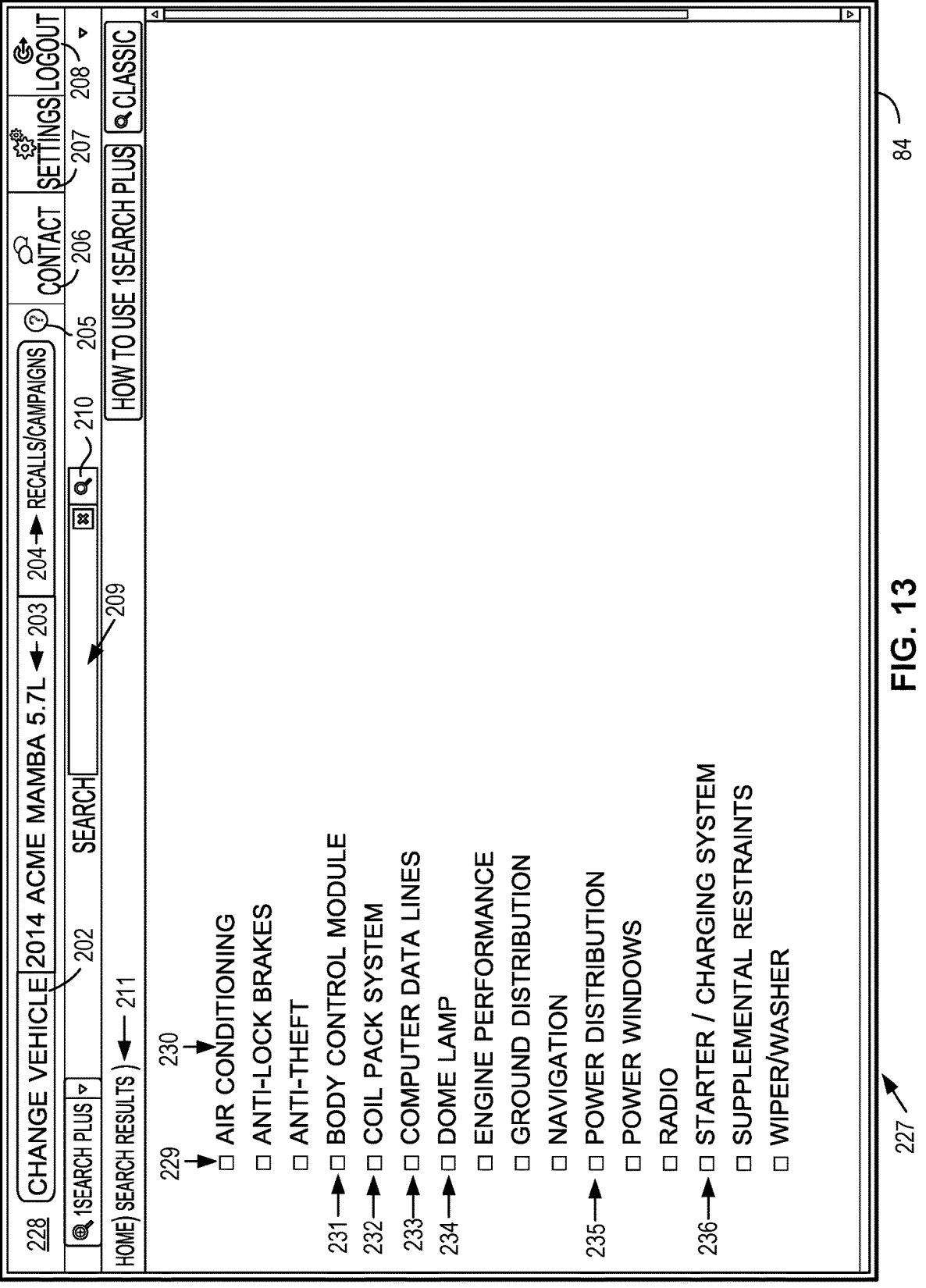

Next, FIG. 13 shows a screen shot 227 of the display 84 while the display 84 is displaying a GUI 228. The GUI 228 includes aspects shown in FIG. 12, although no term is entered into the further search field 209. The processor 81 can output the GUI 228 in response to a selection of the routing diagrams content selector 223 shown in FIG. 12. The GUI 228 includes user-selectable controls 229 and a list of selectable routing diagrams 230. The user-selectable controls 229 includes a separate USC for each selectable routing diagram within the list of selectable routing diagrams 230. In at least some implementations, a selectable routing diagram within the list of selectable routing diagrams 230 represents a set of routing diagrams.

As an example, the user-selectable controls 229 includes a USC 231 to select the routing diagrams set for a body control module, a USC 232 to select the routing diagrams for a coil pack system, a USC 233 to select the routing diagrams for computer data lines, a USC 234 to select the routing diagram for interior lamps, a USC 235 to select the routing diagrams for power distribution, and a USC 236 to select the routing diagrams for a starter/charging system. Sets of routing diagrams for the USC 231 to the USC 236 are shown in FIG. 3 and FIG. 4. The other USC in the user-selectable controls 229 pertain to other example topics for which a database can store a set of routing diagrams including one or more routing diagrams.

The processor 81 can determine that a USC from the user-selectable controls 229 has been selected. In some implementations, in response to determining a USC from the user-selectable controls 229 has been selected, the processor 81 sends to the server 100 a request for a diagram based on the selected USC. The server 100 can provide a sole routing diagram of a set of routing diagrams that corresponds to the selected USC or the first routing diagram of a set of routing diagrams if the set of routing diagrams that correspond to the selected USC includes multiple routing diagrams arranged in a particular sequence. In other implementations, the processor 81 determines a routing diagram from the routing diagram 91 based on the USC selected from the user-selectable controls 229.

Figure 14:
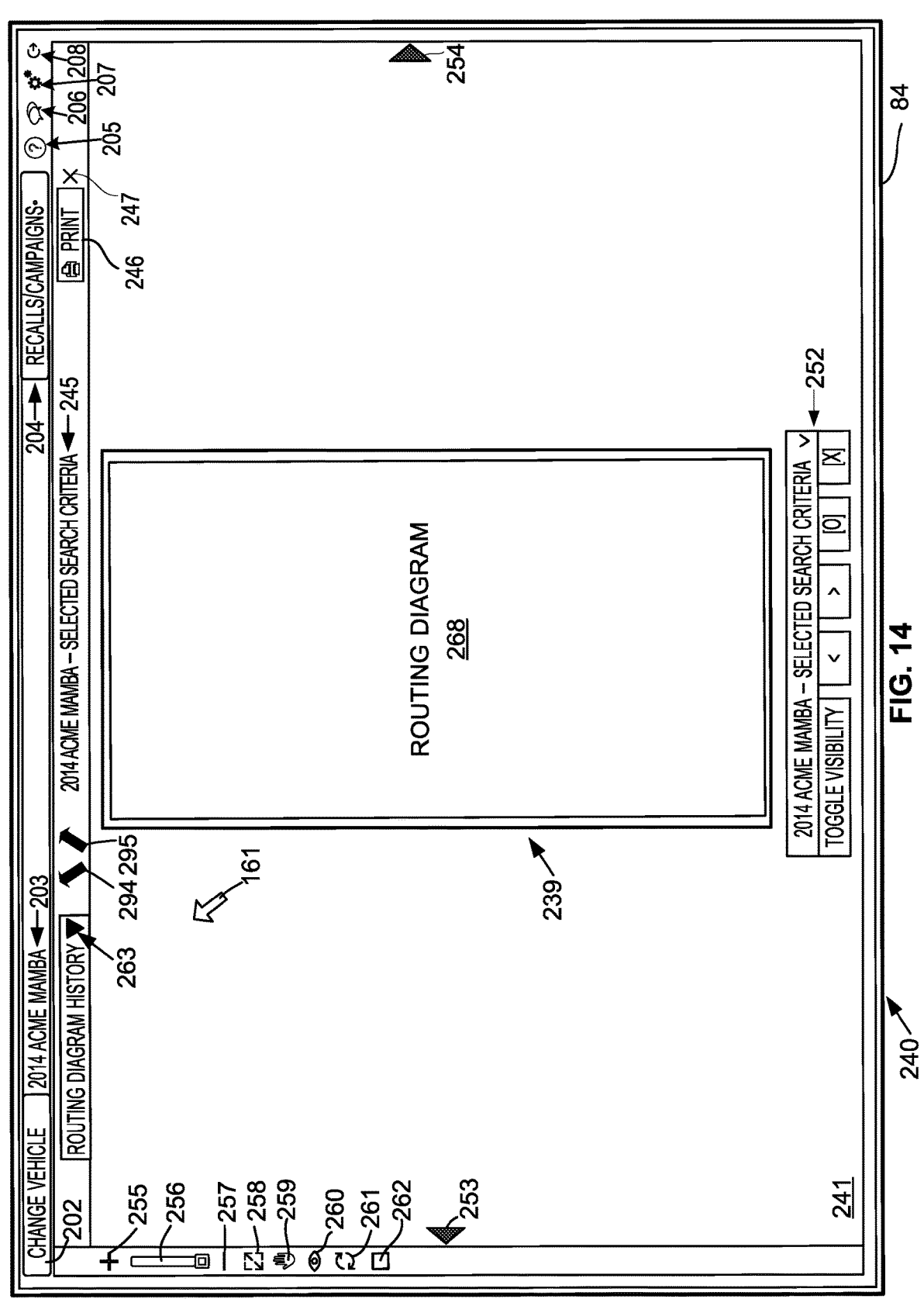

Next, FIG. 14 shows a screen shot 240 of the display 84 while the display 84 is displaying a GUI 241. The GUI 241 includes a container 239 for displaying a routing diagram 268. The container 239 can cover a different portion (e.g., a left-justified portion or a right justified portion) and/or different proportion (e.g., a larger or smaller proportion) of the GUI 241 than shown in FIG. 14. The routing diagram 268 can include any routing diagram, such as any routing diagram described in this description and/or shown in the drawings. Likewise, the routing diagram 268 can cover a different portion and/or proportion of the container 239 and/or the GUI 241. In at least some implementations, a GUI showing a routing diagram is a container for displaying the routing diagram.

Figure 15:
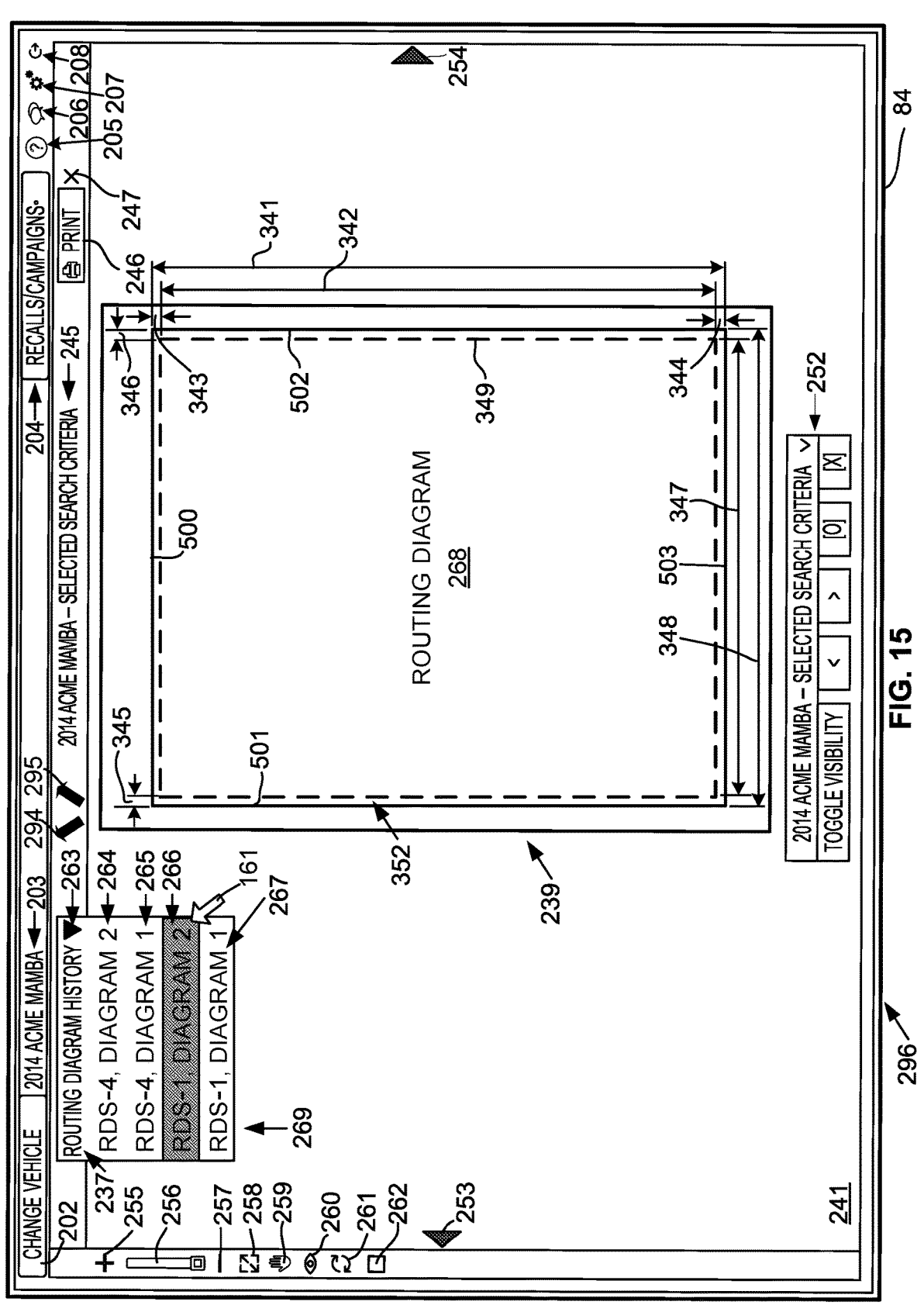

The GUI 241 includes a USC 263 that pertains to routing diagram(s) previously displayed on the display 84. Selection of the USC 263 can cause the processor 81 to display identifier(s) of previously-displayed routing diagram(s). FIG. 15 shows a screen shot 296 after the USC 263 has been selected.

Staying at FIG. 14, the GUI 241 includes a historical navigation USC 294, 295. The historical navigation USC 294, 295 can be selected to signal the processor 81 that a previously-displayed routing diagram is to be displayed. As an example, selection of the historical navigation USC 294 can signal the processor 81 to display an earlier routing diagram in a sequence of previously-displayed routing diagrams, whereas selection of the historical navigation USC 295 can signal the processor 81 to display a later routing diagram in a sequence of previously-displayed routing diagrams. In at least some implementations, if a currently-displayed routing diagram is an initial routing diagram to be displayed for a selected DUS, then the historical navigation USC 294, 295 can be inactive because there is no previously-displayed routing diagram corresponding to the DUS to be displayed.

Tables A, B, C, and D represent use of the historical navigation USC 294, 295 after one, two, three, and four routing diagrams corresponding to the selected DUS, respectively, have been displayed on the display 84. The left-most columns in Tables A to D show an order in which the routing diagram(s) were first displayed on the display 84. The second columns from the left in Tables A to D include routing diagram identifier(s) for those routing diagram(s). The third columns from the left in Tables A to D include data indicating which previously-displayed diagram will be displayed if the historical navigation USC 294 is selected while the routing diagram corresponding to the identifier in the corresponding second column is displayed or that the historical navigation USC 294 is inactive. The right-most columns in Tables A to D include data indicating which previously-displayed diagram will be displayed if the historical navigation USC 295 is selected while the routing diagram corresponding to the identifier in the corresponding second column is displayed or that the historical navigation USC 295 is inactive.

Table A is applicable when only one routing diagram for the DUS has been displayed and that one routing diagram is still displayed. Table B is applicable after two routing diagrams for the DUS have been displayed and one of the two routing diagrams is still displayed. Table C is applicable after three routing diagrams for the DUS have been displayed and one of the three routing diagrams is still displayed. Table D is applicable after four routing diagrams for the DUS have been displayed and one of the four routing diagrams is still displayed.

TABLE A

| Order of RD first appearance | RD Identifier | Selection of historical navigation USC 294 | Selection of historical navigation USC 295 |
|---|---|---|---|
| 1st | RDS-1, Diagram 1 | Inactive | Inactive |

TABLE B

| Order of RD first appearance | RD Identifier | Selection of historical navigation USC 294 | Selection of historical navigation USC 295 |
|---|---|---|---|
| 1st | RDS-1, Diagram 1 | Inactive | RDS-1, Diagram 2 |
| 2nd | RDS-1, Diagram 2 | RDS-1, Diagram 1 | Inactive |

TABLE C

| Order of RD first appearance | RD Identifier | Selection of historical navigation USC 294 | Selection of historical navigation USC 295 |
|---|---|---|---|
| 1st | RDS-1, Diagram 1 | Inactive | RDS-1, Diagram 2 |
| 2nd | RDS-1, Diagram 2 | RDS-1, Diagram 1 | RDS-4, Diagram 1 |
| 3rd | RDS-4, Diagram 1 | RDS-1, Diagram 2 | Inactive |

TABLE D

| Order of RD first appearance | RD Identifier | Selection of historical navigation USC 294 | Selection of historical navigation USC 295 |
|---|---|---|---|
| 1st | RDS-1, Diagram 1 | Inactive | RDS-1, Diagram 2 |
| 2nd | RDS-1, Diagram 2 | RDS-1, Diagram 1 | RDS-4, Diagram 1 |
| 3rd | RDS-4, Diagram 1 | RDS-1, Diagram 2 | RDS-4, Diagram 2 |
| 4th | RDS-4, Diagram 2 | RDS-4, Diagram 1 | Inactive |

In at least some implementations, the use of the historical navigation USC 294, 295 includes a wrap-around feature such that neither of the historical navigation USC 294, 295 is inactive when one of two or more displayed routing diagrams corresponding to the DUS is still displayed. As an example, for Table C, instead of being inactive, selection of the historical navigation USC 294 while the RDS-1, Diagram 1 is displayed can result in the RDS-4, Diagram 1 being displayed. Likewise, with respect to Table C, instead of being inactive, selection of the historical navigation USC 295 while the RDS-4, Diagram 1 is displayed can result in the RDS-1, Diagram 1 being displayed.

The GUI 241 includes a routing diagram selector USC 253, 254. In at least some implementations, the processor 81 outputs a different routing diagram in the GUI 241 (e.g., within the container 239) in response to determining that the routing diagram selector USC 253, 254 has been selected.

Use of the routing diagram selector USC 253, 254 is now described with respect to the routing diagram set 22 that includes the routing diagram 37, 38, 39, 40, 41 (see, FIG. 3). Those routing diagrams can be arranged in a sequence such as routing diagrams (1 of 5), (2 of 5), (3 of 5), (4 of 5), and (5 of 5), respectively. In at least some implementations, the routing diagram selector USC 253 and the routing diagram selector USC 254 can be selected while one of the routing diagram 37, 38, 39, 40, 41 is displayed on the display 84.

In at least some implementations, while a routing diagram of the routing diagram set 22 is displayed on the display 84, the use of the routing diagram selector USC 253 causes the display 84 to display an earlier routing diagram in the sequence of routing diagrams in the routing diagram set 22 unless the first routing diagram in the sequence of routing diagrams is currently displayed. Likewise in those implementations, the use of the routing diagram selector USC 254 causes the display 84 to display a later routing diagram in the sequence of routing diagrams in the routing diagram set 22 unless the last routing diagram in the sequence of routing diagrams is currently displayed. Table E represents use of the routing diagram selector USC 253, 254 while a routing diagrams in the routing diagram set 22 is displayed on the display 84 in accordance with the aforementioned implementations.

TABLE E

| Routing diagram displayed on display | Routing diagram displayed after selection of routing diagram selector USC 253 | Routing diagram displayed after selection of routing diagram selector USC 254 |
|---|---|---|
| 37 | 37 | 38 |
| 38 | 37 | 39 |
| 39 | 38 | 40 |
| 40 | 39 | 41 |
| 41 | 40 | 41 |

In at least some other implementations, while a routing diagram of the routing diagram set 22 is displayed on the display 84, the use of the routing diagram selector USC 253 causes the display 84 to display an earlier routing diagram in the sequence of routing diagrams in the routing diagram set 22 unless the first routing diagram in the sequence of routing diagrams is currently displayed. In that case, the last routing diagram in the routing diagram set 22 is responsively displayed. Likewise in those implementations, the use of the routing diagram selector USC 254 causes the display 84 to display a later routing diagram in the sequence of routing diagrams in the routing diagram set 22 unless the last routing diagram in the sequence of routing diagrams is currently displayed. In that case, the first routing diagram in the routing diagram set 22 is responsively displayed. Table F represents use of the routing diagram selector USC 253, 254 while a routing diagrams in the routing diagram set 22 is displayed on the display 84 in accordance with the aforementioned implementations.

TABLE F

| Routing diagram displayed on display | Routing diagram displayed after selection of routing diagram selector USC 253 | Routing diagram displayed after selection of routing diagram selector USC 254 |
|---|---|---|
| 37 | 41 | 38 |
| 38 | 37 | 39 |
| 39 | 38 | 40 |
| 40 | 39 | 41 |
| 41 | 40 | 37 |

The GUI 241 shown in FIG. 14 also includes the DUS GUI selector 202, the selected DUS identifier 203, the recalls/campaigns GUI selector 204, the help GUI selector 205, the contact GUI selector 206, the settings GUI selector 207, and the logout GUI selector 208, a zoom USC 256, a resize USC 258, a pan USC 259, a hide-or-show USC 260, a reset routable components USC 261, a multi-diagram view USC 262, a routing diagram identifier 245, a print USC 246, and a close GUI USC 247.

The zoom USC 256 includes a zoom-in USC 255 and a zoom-out USC 257. The zoom-in USC 255 is selectable to cause the processor 81 to zoom in on one or more routing diagrams displayed on the display 84. The zoom-out USC 257 is selectable to cause the processor 81 to zoom out on one or more routing diagrams displayed on the display 84.

The resize USC 258 is selectable to cause the processor 81 to change a size of a routing diagram displayed on the display 84. As an example, in response to determining the resize USC 258 has been selected when the displayed routing diagram is not a default diagram size, the processor 81 can change the size of the diagram displayed on the display 84 to the default diagram size. As an example, the default diagram size of can be a size to accommodate a fit-diagram-to-page size such that the routing diagram is displayed in its entirety on a screen of the display 84. In at least some implementations in which the routing diagram 268 is displayed in the container 239, selection of the resize USC 258 causes a corresponding change in size of the container 239 so that the routing diagram 268 is still displayed within the container 239 after the size of the routing diagram 268 has changed.

The pan USC 259 is selectable to cause the processor 81 to move a routing diagram displayed on the display 84, such as moving the routing diagram horizontally, vertically, or a combination of horizontally and vertically.

The hide-or-show USC 260 is selectable to cause the processor 81 to hide particular component(s) of a routing diagram displayed on the display 84 if those particular component(s) are not currently hidden and to unhide the particular component(s) of the routing diagram on the display 84 if those particular component(s) are currently hidden. The particular components are not visible when hidden, but are visible when not hidden. As an example, the particular components can be the routable components on a routing diagram. As another example, the particular components can be the connectable components on a routing diagram.

The reset routable components USC 261 is selectable to cause the processor 81 to un-highlight any routable component(s) disposed on a routing diagram and currently displayed as highlighted. Moreover, the processor 81 can modify the metadata 92 to indicate that any segment of a routable component disposed on a routing diagram that is not currently displayed but is part of a routable component having a segment disposed on a routing diagram currently displayed and highlighted is associated with an un-highlighted state.

The routing diagram identifier 245 includes a textual identifier of a routing diagram or a set of routing diagrams that include a routing diagram currently displayed on the display 84. The routing diagram identifier 245 can match the textual routing diagram identifier 3 of a routing diagram contained in the container 239.

The print USC 246 can be configured for performing various functions. In at least some implementations, the print USC 246 is selectable to cause the processor 81 to open a window including a USC that is selectable to cause the processor 81 to send the GUI including a routing diagram and/or the routing diagram displayed on the GUI with the print USC 246 to a printer. In at least some other implementations, the print USC 246 is selectable to cause the processor 81 to directly send the GUI including a routing diagram and/or the routing diagram displayed on the GUI with the print USC 246 to a printer.

The close GUI USC 247 is selectable to cause the processor 81 to close the GUI including the GUI USC 247. In accordance with at least some implementations, the processor 81 causes the display to display another GUI, such as the GUI 201 shown in FIG. 12 or the GUI 228 shown in FIG. 12, in response to determining the GUI USC 247 has been selected.

The GUI 241 also includes a USC 252 that includes controls selectable to make selections to change what routing diagrams are displayed on the GUI 241 and/or how the displayed routing diagrams appear within the GUI 241.

Next, FIG. 15 shows a screen shot 296 of the display 84 while the display 84 is displaying an alternative view of the GUI 241 (as compared to a view of the GUI 241 shown in FIG. 14). One difference between the screen shot 240 shown in FIG. 14 and the screen shot 296 is that the container 239 is shown to cover a different portion and different proportion of the GUI 241 as compared to the view of the container 239 in FIG. 14. Similarly, the routing diagram 268 is shown to cover different portions and different proportions of the container 239 and the GUI 241 as compared to the view of the routing diagram 268 in FIG. 14.

The screen shot 296 represents an instance after the USC 263 has been selected to cause the processor 81 to display identifier(s) of previously-displayed routing diagram(s) of a routing diagram history 237. As an example, the identifier(s) of previously-displayed routing diagram(s) can be shown in a drop-down menu 269. As another example, the identifier(s) of previously-displayed routing diagram(s) can be shown in within display cards or within buttons or some other GUI element(s). In at least some implementations, the identifier(s) of previously-displayed routing diagram(s) are limited to identifier(s) of routing diagram(s) for the DUS identified by the selected DUS identifier 203. In other implementations, the identifier(s) of previously-displayed routing diagram(s) can include identifier(s) of routing diagram(s) for a DUS other than the DUS identified by the selected DUS identifier 203. The identifier(s) of previously-displayed routing diagram(s) are selectable. For example, in response to determining an identifier from the drop-down menu 269 (or another GUI element) has been selected, the processor 81 can output on the display 84 a routing diagram corresponding to the selected identifier. In at least some implementations, the routing diagram history 237 is configured to contain no more than a maximum number of identifiers of previously-displayed routing diagrams. As an example, the maximum number can be a number between five and twenty, such as ten. Other examples of the maximum number are also possible.

As an example, the drop-down menu 269 includes an identifier 264, 265, 266, 267 that corresponds to the routing diagram 43, 42, 31, 30, respectively. FIG. 15 shows a point of the cursor 161 positioned on the identifier 266 and the identifier 266 is shaded to indicate that the cursor 161 is pointing to the identifier 266. In some implementations, the user interface 83 can be used (e.g., clicking a computer mouse) to select the identifier 266 while the cursor is pointing to the identifier 266. In response to selecting the identifier 266, the processor 81 can responsively output the routing diagram 31 on the display 84. In some implementations, the processor 81 retrieves the routing diagram 31 stored in the routing diagram 91. In some other implementations, the processor 81 requests and receives the routing diagram 31 from the server 100 in response to determining the identifier 266 has been selected.

In at least some implementations, the identifier 264, 265, 266, 267 is displayed in an order in which the corresponding routing diagram was departed. As an example, the order can be from a most-recent departure routing diagram to an earliest departure routing diagram. For instance, the identifier 264 can correspond to a most-recent departure routing diagram and the identifier 267 can correspond to an earliest departure routing diagram for the DUS identified by the DUS identifier 203. In accordance with these examples, a flow of displaying routing diagrams is as follows: the routing diagram 30 was displayed, a hotspot within the routing diagram 30 was selected making the routing diagram 30 a departure routing diagram in order to display the routing diagram 31, a hotspot within the routing diagram 31 was selected making the routing diagram 31 a departure routing diagram in order to display the routing diagram 42, a hotspot within the routing diagram 42 was selected making the routing diagram 42 a departure routing diagram in order to display the routing diagram 43, and a hotspot within the routing diagram 43 was selected making the routing diagram 43 a departure routing diagram in order to display the routing diagram 268 within the GUI 241.

FIG. 15 also shows further details pertaining to the routing diagram 268. For example, the routing diagram 268 is shown to include an edge 500, 501, 502 503. FIG. 15 also shows an internal perimeter 349. In at least some implementations, the internal perimeter 349 is not displayed when the routing diagram 268 is displayed on the display 84. FIG. 15 shows a dimension 341, 342, 343, 344, 345, 346, 347, 348 between one of the edge 500, 501, 502, 503 and the internal perimeter 349. The edge 500, 501, 502, 503 and the internal perimeter define a border area 352. The border area 352 is the area between the edge 500, 501, 502, 503 and a closest portion of the internal perimeter 349. The border area 352 is adjacent the edge 500, 501, 502, 503. The edge 500, 501, 502, 503 is an outer-most portion of the routing diagram 268.

In at least some implementations, the dimension 341, 342, 343, 344, 345, 346, 347, 348 is defined as a number of pixels. As an example, the dimension 341 is 1800 pixels, the dimension 343, 344, 345, 346 is 40 pixels, the dimension 342 is 1720 pixels, the dimension 347 is 1320 pixels, and the dimension 348 is 1400 pixels. Other examples of the dimension 342, 343, 344, 345, 346, 347, 348 and the units thereof are also possible.

The other routing diagrams discussed in this description and/or shown in the drawings can also include the edge 500, 501, 502, 503, the internal perimeter 349, and the border area 352. The routing diagrams shown in the other drawings show the edge 500, 501, 502 503.

V. Example Routing Diagrams

Figure 16:
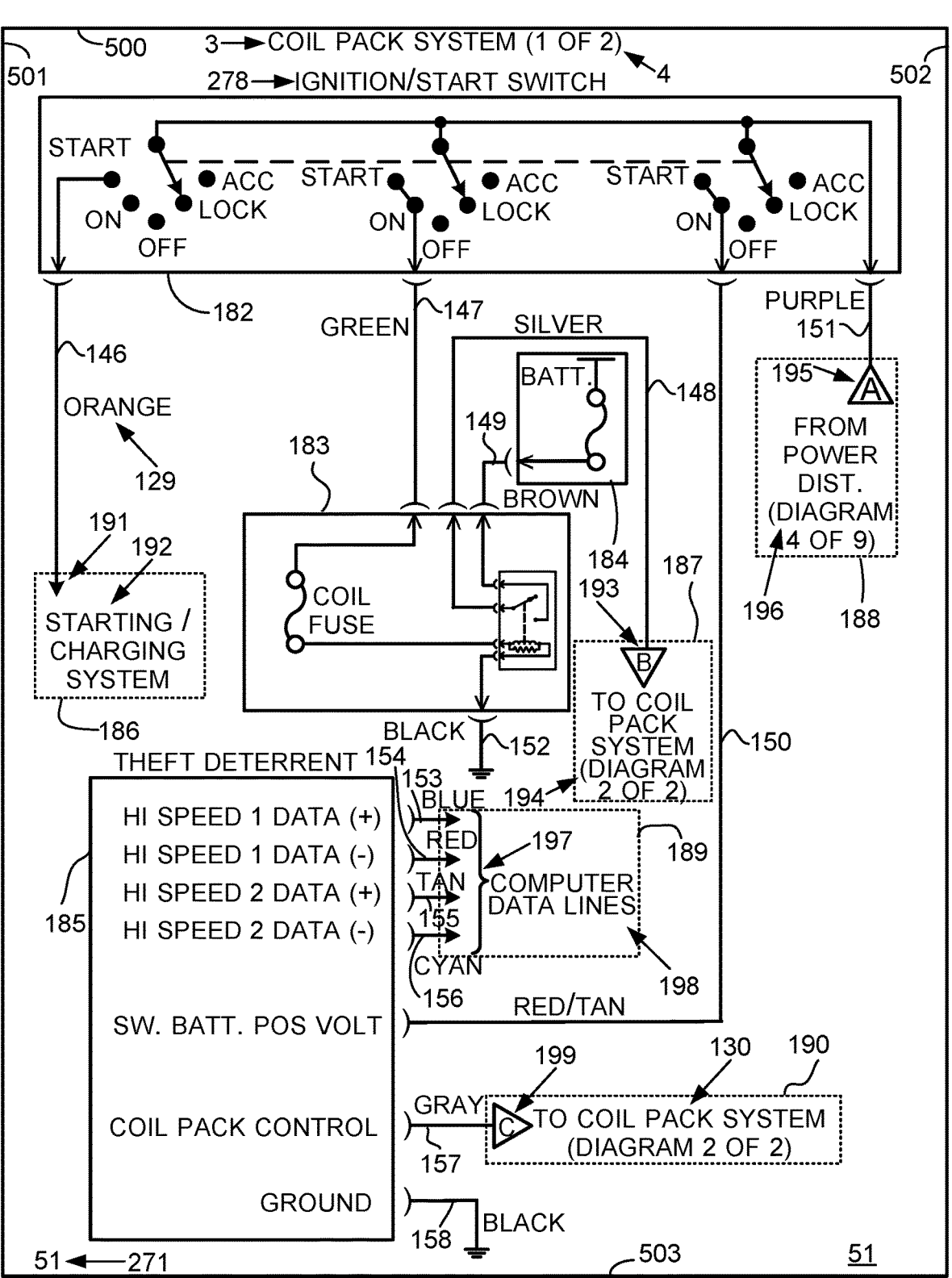

Next, FIG. 16 shows the routing diagram 51. The routing diagram 51 includes a routing diagram identifier 271. In some implementations, the routing diagram identifier 271 is visible on the display 84 while the routing diagram 51 is displayed on the display 84. In those or in other implementations, the routing diagram identifier 271 is stored within metadata corresponding to the routing diagram 51. The routing diagram identifier 271 is indicative of the routing diagram 51, which is a first of two routing diagrams corresponding to a coil pack system. The textual routing diagram identifier 3 and the diagram count 4 within the routing diagram 51 indicate that the routing diagram 51 is the first of two routing diagrams corresponding to a coil pack system.

The routing diagram 51 includes a routable component 146, 147, 148, 149, 150, 151, 152, 153, 154, 155, 156, 157, 158. In at least some implementations, those reference numbers correspond to routable component numbers (e.g., electrical circuit numbers) visually present on the routing diagram. The routing diagram 51 can include a textual description of a routable component. For example, the routing diagram 51 includes a textual description 129 indicating a color "orange" to describe the routable component 146. The routing diagram 51 also includes a connectable component 182, 183, 184, 185 representative of an ignition/ start switch, a relay, a fuse panel or fuse holder including a fuse for the routable component 149, and an ECU for a theft deterrent system, respectively. A routing diagram can include a component identifier that corresponds to a connectable component or a routable component, such as a component identifier 278 corresponding to the connectable component 182 shown in FIG. 16.

Additionally, the routing diagram 51 includes a hotspot 186, 187, 188, 189, 190. Although the hotspot 186, 187, 188, 189, 190 is represented using a dashed rectangular line, the hotspot 186, 187, 188, 189, 190 or any other hotspot described herein and/or shown in the drawings can cover a rectangular or non-rectangular area (e.g., a circular area) within a routing diagram and a screen of the display 84.

The hotspot 186 includes an icon 191. The icon 191 is connected to and corresponds to the routable component 146. An icon that that corresponds to a hotspot (e.g., included within a hotspot) can indicate that a routable component corresponding to the hotspot continues on another routing diagram of a set of routing diagrams that comprises the routing diagram including the hotspot. In the application drawings, this icon appears as a solid, filled black triangle. Alternatively, an icon that that corresponds to a hotspot can indicate that the routable component corresponding to the hotspot continues on another routing diagram of a set of routing diagrams that does not comprise the routing diagram including the hotspot (i.e., a different set of routing diagrams). In the application drawings, this icon appears as a triangle including an alphanumeric character (e.g., a letter).

The hotspot 186 includes a textual description 192. A textual description within and/or proximate a hotspot, such as the textual description 192, can describe a routing diagram on which a routable component corresponding to the hotspot continues. As an example, the textual description with a hotspot can indicate the textual routing diagram identifier 3 and the diagram count 4 for the other routing diagram.

In alternative implementations, a hotspot (e.g., the hotspot 186) on a routing diagram includes only an icon (e.g., the icon 191) or a textual description (e.g., the textual description 192), but is still selectable to cause the processor 81 to output a different routing diagram on the display 84. In still other alternative implementations, a hotspot includes neither an icon nor a textual description, but is still selectable to cause the processor 81 to output a different routing diagram on the display 84.

Figure 17:
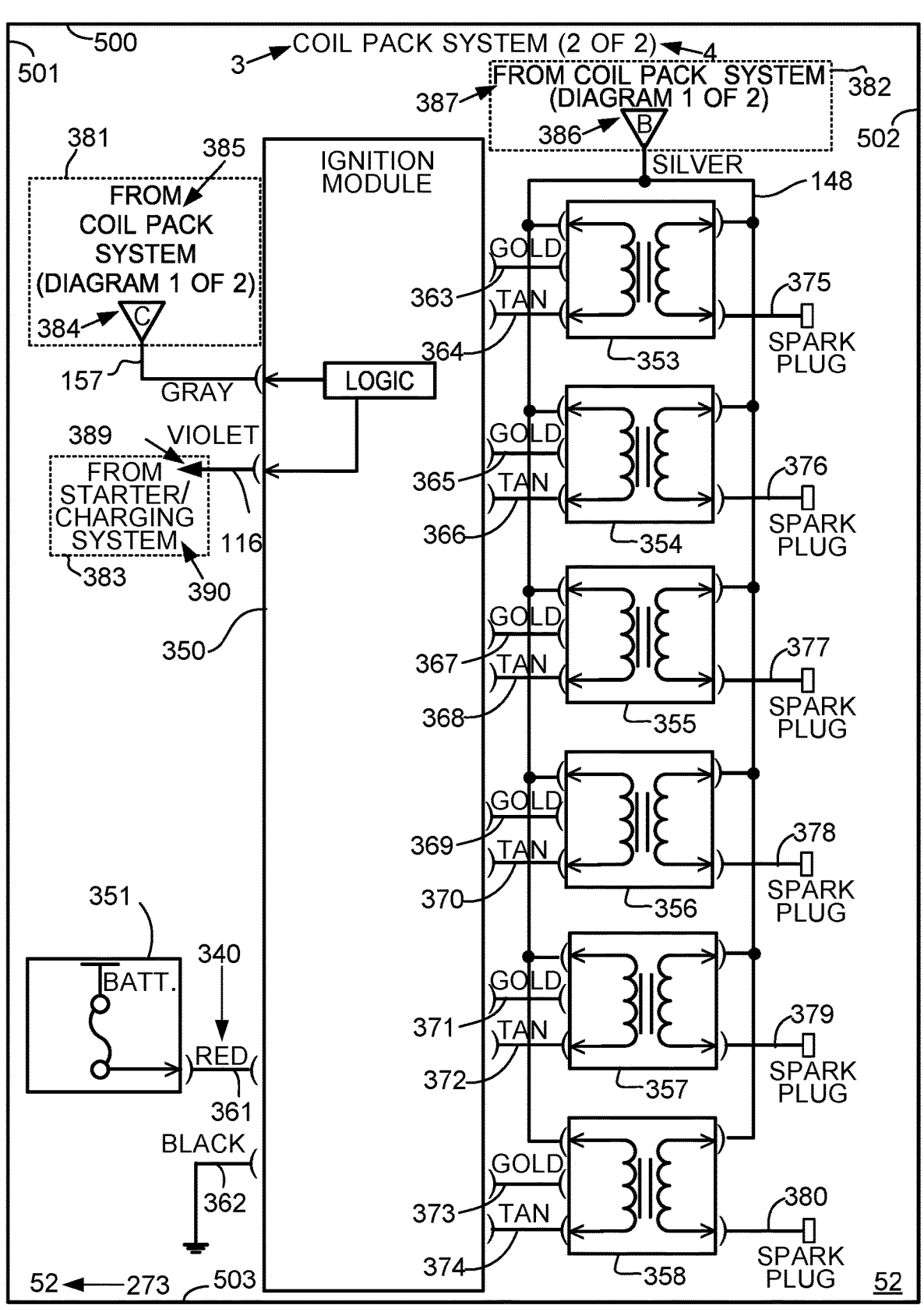

The hotspot 187 includes an icon 193 and a textual description 194. The icon 193 is connected to and corresponds to the routable component 148. The textual description 194 indicates the textual routing diagram identifier 3 and the diagram count 4 for the routing diagram 52 (which is shown in FIG. 17).

The hotspot 188 includes an icon 195 and a textual description 196. The icon 195 is connected to and corresponds to the routable component 151. The textual description 196 indicates the textual routing diagram identifier and the diagram count for the routing diagram 45 shown in FIG. 4.

The hotspot 189 includes an icon 197 and a textual description 198. The icon 197 includes a bracket corresponding to four solid, filled black triangles that are connected to and correspond to the routable component 153, 154, 155, 156. The textual description 198 indicates the textual routing diagram identifier for a routing diagram of the routing diagram set 20 shown in FIG. 4. In an alternative implementation, the textual description 198 can include a diagram count for a particular routing diagram of the routing diagram set 20 (e.g., the diagram count "4 of 6").

The hotspot 190 includes an icon 199 and a textual description 130. The icon 199 is connected to and corresponds to the routable component 157. The textual description 130 indicates the textual routing diagram identifier 3 and the diagram count 4 for the routing diagram 52 shown in FIG. 17.

The routing diagram 51 includes an edge 500, 501, 502, 503. The edge 500 can be referred to as a "top edge." The edge 501 can be referred to as a "left edge." The edge 502 can be referred to as a "right edge." The edge 503 can be referred to as a "bottom edge." A routing diagram 52, 30, 31, 37, 38, 36 shown in FIG. 17 to FIG. 22 also include a top edge, a left edge, a right edge, and a bottom edge that are identified as the edge 500, 501, 502, 503, respectively in those figures. The other routing diagrams shown in 4 and routing diagrams within the database 10 can also include a top edge, a left edge, a right edge, and a bottom edge like those shown in FIG. 16 to FIG. 22.

In at least some implementations, neither the icon nor the textual description of a hotspot in a routing diagram is disposed at or in proximity to an edge of a routing diagram that includes the hotspot. In at least some implementations, an icon or the textual description is not disposed at or in proximity to the edge of a routing diagram if some other portion of a routable component or a connectable component on the routing diagram is closer to the edge than the icon or the textual description. In at least some of those implementations or in other implementations, an icon or the textual description is not disposed at or in proximity to the edge of a routing diagram if no portion of the icon or the textual description is contained within the border area 352 (see, FIG. 15) of the routing diagram.

In at least some implementations, an icon or the textual description is not disposed at or in proximity to the edge of a routing diagram if at least a threshold percentage of a width dimension (e.g., dimension 348 shown in FIG. 15) of the routing diagram is between the left edge or the right edge of the routing diagram and a closest portion of the hotspot (e.g., the icon or the textual description of the hotspot), and at least a threshold percentage of a height dimension (e.g., dimension 341 shown in FIG. 15) of the routing diagram is between the top edge or the bottom edge of the routing diagram and a closest portion of hotspot (e.g., the icon or the textual description of the hotspot). As an example, the threshold percentages discussed in this paragraph can be a threshold percentage between 1% and 10%, inclusive. In accordance with that example, the threshold percentage can be a threshold percentage between 1% and 2% inclusive, between 2% and 3% inclusive, between 3% and 4% inclusive, between 4% and 5% inclusive, between 5% and 6% inclusive, between 6% and 7% inclusive, between 7% and 8% inclusive, between 8% and 9% inclusive, or between 9% and 10% inclusive. Also accordance with that example, the threshold percentage can be 1%, 2%, 3%, 4%, 5%, 6%, 7%, 8%, 9% or 10%.

In at least some implementations, an icon or the textual description is not disposed at or in proximity to the edge of a routing diagram if at least a threshold distance exists between the icon or the textual description of the hotspot and a closest edge of the routing diagram. In at least some implementations, the threshold distance is measured as a quantity of pixels. The quantity of pixels can be a discrete number of pixels, such as 40 pixels or a percentage of pixels of the quantity of vertical or horizontal pixels of the routing diagram. For example, if the routing diagram is 1400 pixels wide and 1800 pixels high (the number of pixels can be 2.85% of the quantity of horizontal pixels (rounded to the nearest integer). In accordance with the example of a routing diagram 1400 pixels wide, 2.85% of the horizontal pixels is 39.9 (or 40 pixels when rounded.) Other examples of a threshold distance in terms of a number of pixels or a percentage of pixels of the quantity of vertical or horizontal pixels of the routing diagram are also possible.

Next, FIG. 17 shows the routing diagram 52. The routing diagram 52 includes a routing diagram identifier 273. In some implementations, the routing diagram identifier 273 is visible on the display 84 while the routing diagram 52 is displayed on the display 84. In those or in other implementations, the routing diagram identifier 273 is stored within metadata corresponding to the routing diagram 52. The routing diagram identifier 273 is indicative of the routing diagram 52, which is a second of two routing diagrams corresponding to a coil pack system. The textual routing diagram identifier 3 and the diagram count 4 within the routing diagram 52 indicate that the routing diagram 52 is the second of two routing diagrams corresponding to a coil pack system.

The routing diagram 52 includes a routable component 116, 148, 157, 361, 362, 363, 364, 365, 366, 367, 368, 369, 370, 371, 372, 373, 374, 375, 376, 377, 378, 379, 380. The routable component 375 to 380 are commonly referred to as "spark plug wires." In at least some implementations, those reference numbers correspond to routable component numbers (e.g., electrical circuit numbers) visually present on the routing diagram 52. The routing diagram 52 can include a textual description of a routable component. For example, the routing diagram 52 includes a textual description 340 indicating a color "red" to describe the routable component 361. The routing diagram 52 also includes a connectable component 350, 351, representative of an ignition module, and a fuse panel or fuse holder including a fuse for the routable component 361, respectively. The routing diagram 52 also includes a connectable component 353, 354, 355, 356, 357, 358, each of which is a coil of a coil pack system.

Additionally, the routing diagram 52 includes a hotspot 381, 382, 383. Although the hotspot 381, 382, 383 is represented using a dashed rectangular line, the hotspot 381, 382, 383 or can cover a rectangular or non-rectangular area (e.g., a circular area) within the routing diagram 52 and a screen of the display 84.

The hotspot 381 includes an icon 384 and a textual description 385. The icon 384 is connected to and corresponds to the routable component 157. The textual description 385 indicates the textual routing diagram identifier 3 and the diagram count 4 for the routing diagram 51 shown in FIG. 16. The alphanumeric character within the icon 384 is identical to the alphanumeric character within the icon 199 shown in FIG. 16. The icon 199, 384 including the same alphanumeric character (i.e., "C") are both connected to the routable component 157. In response to the processor 81 detecting that the hotspot 381 was selected, the processor 81 outputs the routing diagram 51 on the display 84. In at least some implementations, the routable component 157 is highlighted on the display 84 when the routing diagram 51 is displayed in response to selection of the hotspot 381. In other words, upon displaying a routing diagram corresponding to a selected hotspot, a routable component or routable components corresponding to a hotspot in the routing diagram now displayed and in the departure routing diagram is or are highlighted. Moreover, in at least some implementations, connectable components connectable to the highlighted routable components can also be highlighted upon displaying the routing diagram displayed in response to a selection of a hotspot.

The hotspot 382 includes an icon 386 and a textual description 387. The icon 386 is connected to and corresponds to the routable component 148. The textual description 387 indicates the textual routing diagram identifier 3 and the diagram count 4 for the routing diagram 51 shown in FIG. 16. The alphanumeric character within the icon 386 is identical to the alphanumeric character within the icon 193 shown in FIG. 16. The icon 193, 386 including the same alphanumeric character (i.e., "B") are both connected to the routable component 148. In response to the processor 81 detecting that the hotspot 382 was selected, the processor 81 outputs the routing diagram 51 on the display 84. In at least some implementations, the routable component 148 is highlighted on the display 84 when the routing diagram 51 is displayed in response to selection of the hotspot 382.

The hotspot 383 includes an icon 389. The icon 389 is connected to and corresponds to the routable component 116. The hotspot 383 includes a textual description 390. The textual description 390 indicates the textual routing diagram identifier 3 and the diagram count 4 for another routing diagram, such as the routing diagram 38 (shown in FIG. 4 and FIG. 21). In at least some implementations, a textual description within a hotspot without any text indicating a particular routing diagram (e.g., the textual description 390) can include an identifier of a particular routing diagram (e.g., the routing diagram 38 (e.g., "Starter/Charging System (2 of 5)")). In those and/or alternative implementations, metadata corresponding to the hotspot 383 includes an identifier of the routing diagram 38. In response to a selection of the hotspot 383, the processor 81 can output the routing diagram 38 on the display 84. Furthermore, in response to a selection of the hotspot 383, the processor 81 can display the routing diagram 38 on the display 84 with the routable component 116 highlighted and without highlighting the other routable components on the routing diagram 38.

Figure 18:
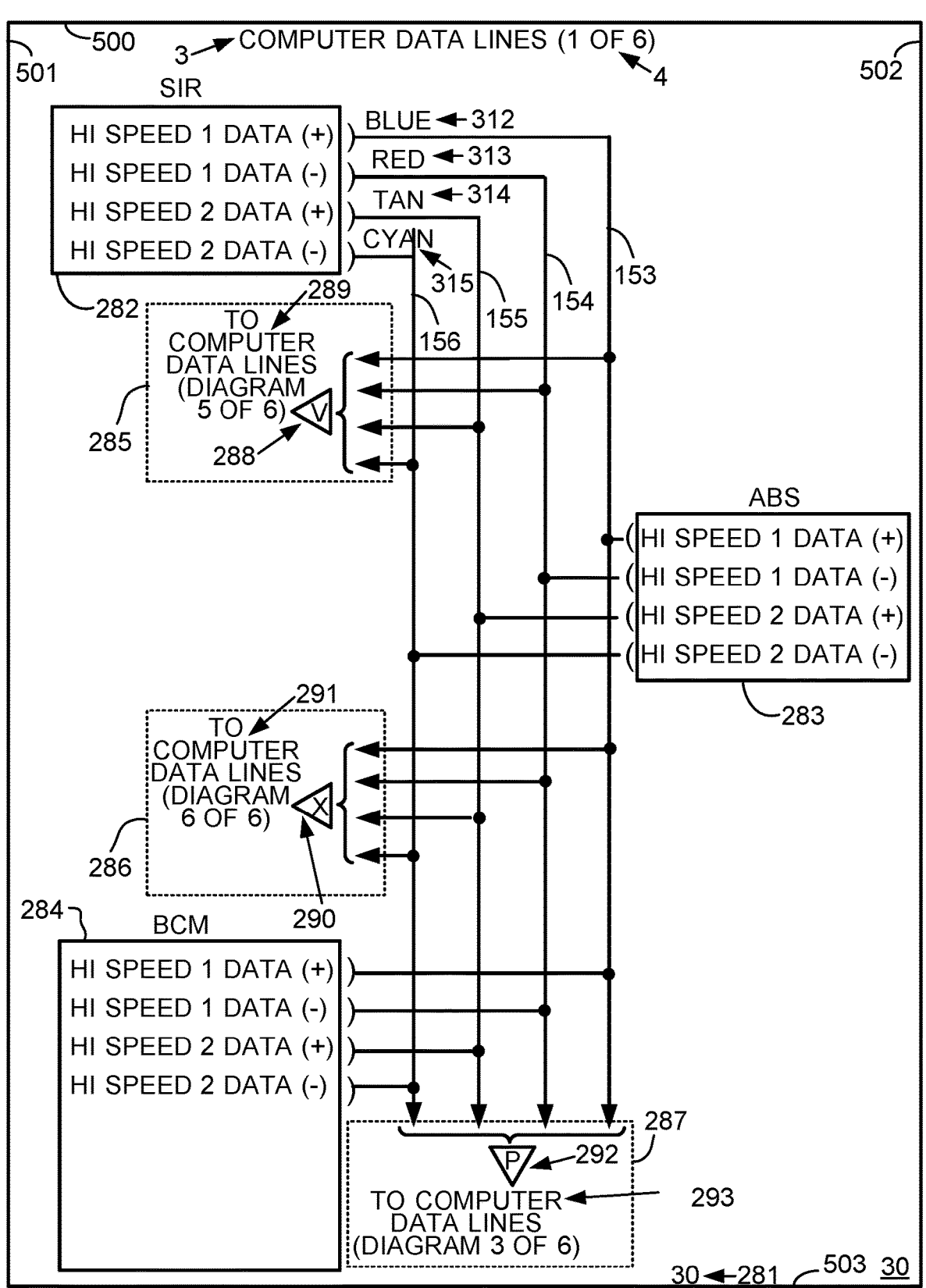

Next, FIG. 18 shows the routing diagram 30. The routing diagram 30 includes a routing diagram identifier 281. In some implementations, the routing diagram identifier 281 is visible on the display 84 while the routing diagram 30 is displayed on the display 84. In those or in other implementations, the routing diagram identifier 281 is stored within metadata corresponding to the routing diagram 30. The routing diagram identifier 281 is indicative of the routing diagram 30, which is a first of six routing diagrams corresponding to computer data lines. The textual routing diagram identifier 3 and the diagram count 4 within the routing diagram 30 indicate that the routing diagram 30 is the first of six routing diagrams corresponding to computer data lines.

The routing diagram 30 includes the routable component 153, 154, 155, 156. In at least some implementations, those reference numbers correspond to routable component numbers (e.g., electrical circuit numbers) visually present on the routing diagram 30. The routing diagram 30 includes a textual description 312, 313, 314, 315 that describes a color of the routable component 153, 154, 155, 156. The routing diagram 30 also includes a connectable component 282, 283, 284 representative of a supplemental inflatable restraint (SIR) ECU, an anti-lock brake system (ABS) ECU, and a body control module (BCM) ECU, respectively.

Additionally, the routing diagram 30 includes a hotspot 285, 286, 287. Although the hotspot 285, 286, 287 is represented using a dashed rectangular line, the hotspot 285, 286, 287 can cover a rectangular or non-rectangular area (e.g., a circular area) within the routing diagram 30 and a screen of the display 84.

The hotspot 285 includes an icon 288 and a textual description 289. The icon 288 includes a bracket corresponding to four solid, filled black triangles that are connected to and correspond to four segments of the routable component 153, 154, 155, 156 shown in the routing diagram 30. The textual description 289 indicates the textual routing diagram identifier for a routing diagram of the routing diagram set 20 shown in FIG. 4.

The hotspot 286 includes an icon 290 and a textual description 291. The icon 290 includes a bracket corresponding to four solid, filled black triangles that are connected to and correspond to four other segments of the routable component 153, 154, 155, 156 shown in the routing diagram 30. The textual description 291 indicates the textual routing diagram identifier for a routing diagram of the routing diagram set 20 shown in FIG. 4.

The hotspot 287 includes an icon 292 and a textual description 293. The icon 292 includes a bracket corresponding to four solid, filled black triangles that are connected to and correspond to four other segments of the routable component 153, 154, 155, 156 shown in the routing diagram 30. The textual description 293 indicates the textual routing diagram identifier for a routing diagram of the routing diagram set 20 shown in FIG. 4.

Figure 19:
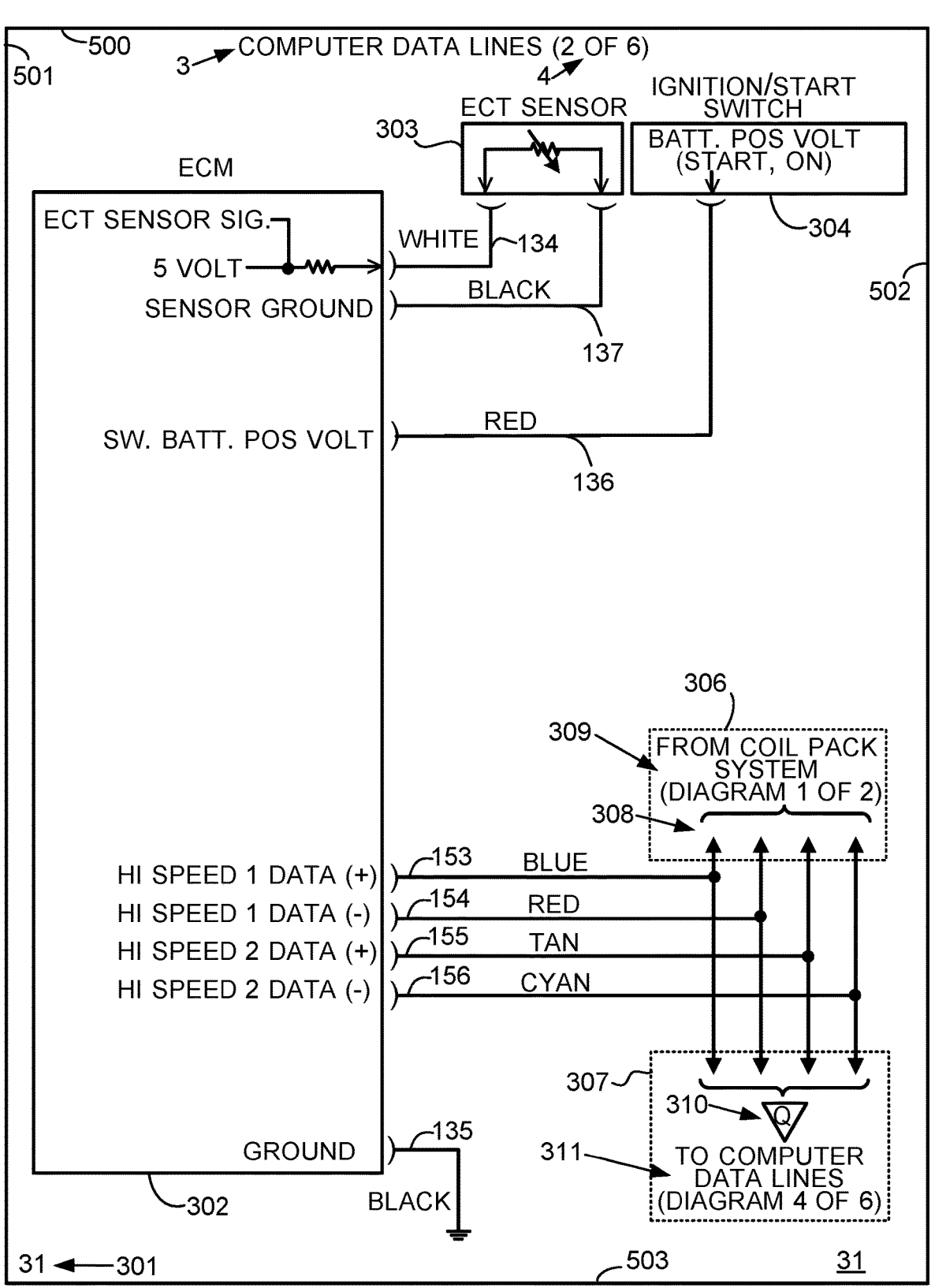

Next, FIG. 19 shows the routing diagram 31. The routing diagram 31 includes a routing diagram identifier 301. In some implementations, the routing diagram identifier 301 is visible on the display 84 while the routing diagram 31 is displayed on the display 84. In those or in other implementations, the routing diagram identifier 301 is stored within metadata corresponding to the routing diagram 31. The routing diagram identifier 301 is indicative of the routing diagram 31, which is a second of six routing diagrams corresponding to computer data lines. The textual routing diagram identifier 3 and the diagram count 4 within the routing diagram 31 indicate that the routing diagram 31 is the second of six routing diagrams corresponding to computer data lines.

The routing diagram 31 includes the routable component 134, 135, 136, 137, 153, 154, 155, 156. In at least some implementations, those reference numbers correspond to routable component numbers (e.g., electrical circuit numbers) visually present on the routing diagram 31. The routing diagram 31 also includes a connectable component 302, 303, 304 representative of an engine control module ECU, an engine coolant temperature sensor, and an ignition/start switch, respectively. The routable component 134, 137 connects and/or is connectable to the connectable component 302, 303. The routable component 136 connects and/or is connectable to the connectable component 302, 304.

Additionally, the routing diagram 31 includes a hotspot 306, 307. Although the hotspot 306, 307 is represented using a dashed rectangular line, the hotspot 306, 307 can cover a rectangular or non-rectangular area (e.g., a circular area) within the routing diagram 31 and a screen of the display 84.

The hotspot 306 includes an icon 308 and a textual description 309. The icon 308 includes a bracket corresponding to four solid, filled black triangles that are connected to and correspond to four segments of the routable component 153, 154, 155, 156 shown in the routing diagram 31. The textual description 309 indicates the textual routing diagram identifier for a routing diagram 51 shown in FIG. 16. In other words, in response to determining that the hotspot 306 is selected, the processor 81 can responsively output the routing diagram 51 onto the display 84 in place of the routing diagram 31. In at least some implementations, the routable component 153, 154, 155, 156 within the routing diagram 31 is highlighted on the display 84 when the routing diagram 31 is displayed in response to selection of the hotspot 306.

The hotspot 307 includes an icon 310 and a textual description 311. The icon 310 includes a bracket corresponding to four solid, filled black triangles that are connected to and correspond to four other segments of the routable component 153, 154, 155, 156 shown in the routing diagram 31. The textual description 311 indicates the textual routing diagram identifier for the routing diagram 33 shown in FIG. 4 (i.e., the fourth of six routing diagrams of the routing diagram set 20 regarding computer data lines). In response to determining that the hotspot 307 is selected, the processor 81 can responsively output the routing diagram 33 onto the display 84 in place of the routing diagram 31. In at least some implementations, the routable component 153, 154, 155, 156 within the routing diagram 33 is highlighted on the display 84 when the routing diagram 33 is displayed in response to selection of the hotspot 307.

Figure 20:
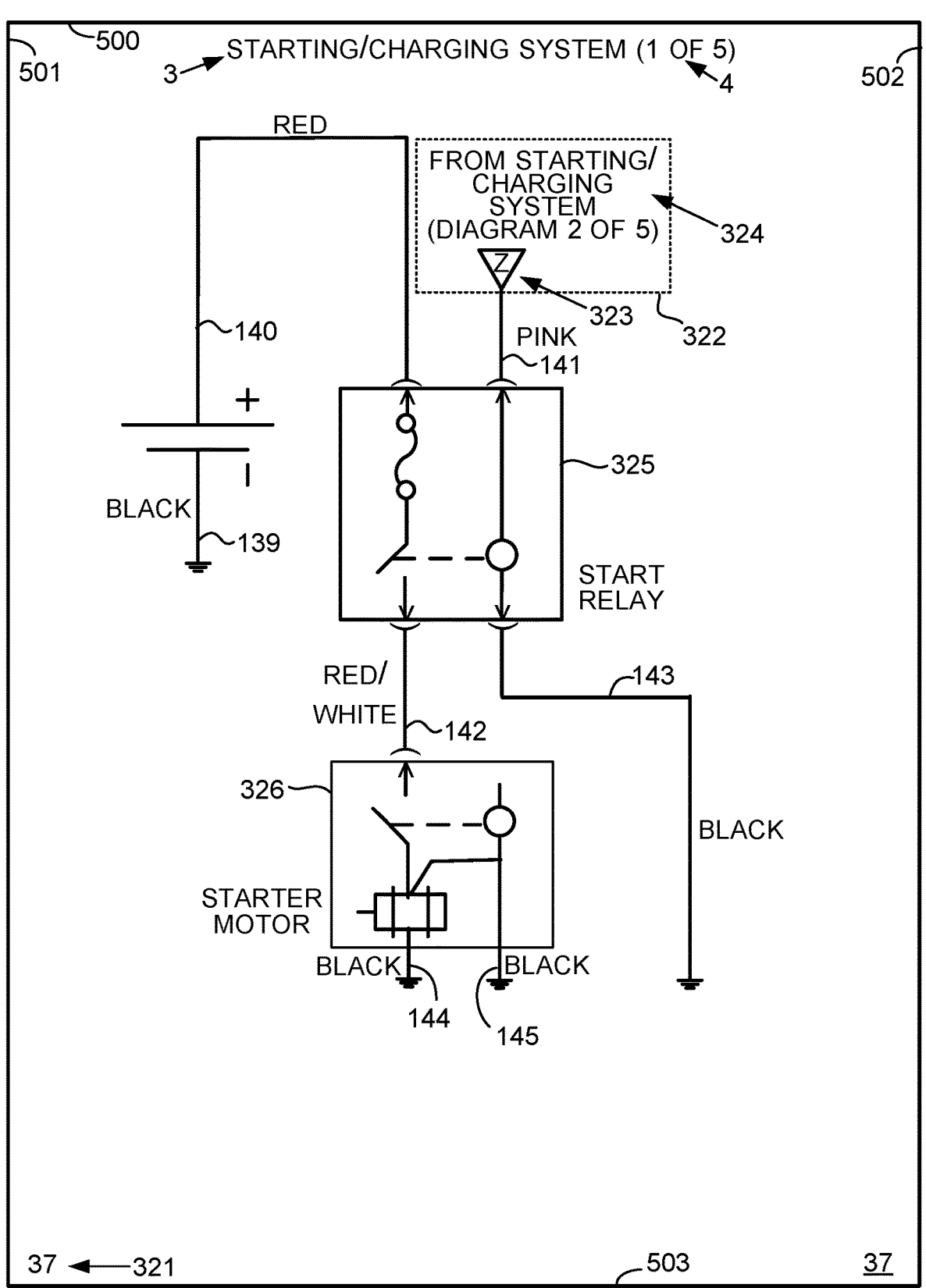

Next, FIG. 20 shows the routing diagram 37. The routing diagram 37 includes a routing diagram identifier 321. In some implementations, the routing diagram identifier 321 is visible on the display 84 while the routing diagram 37 is displayed on the display 84. In those or in other implementations, the routing diagram identifier 321 is stored within metadata corresponding to the routing diagram 37. The routing diagram identifier 321 is indicative of the routing diagram 37, which is a first of five routing diagrams corresponding to a starting/charging system. The textual routing diagram identifier 3 and the diagram count 4 within the routing diagram 37 indicate that the routing diagram 37 is the first of five routing diagrams corresponding to the starting/charging system.

The routing diagram 37 includes the routable component 139, 140, 141, 142, 143, 144, 145. In at least some implementations, those reference numbers correspond to routable component numbers (e.g., electrical circuit numbers) visually present on the routing diagram 37. Similar to other routing diagrams described above, the routing diagram 37 includes a textual description that describes a color of the routable component 139, 140, 141, 142, 143, 144, 145. The routing diagram 37 also includes a connectable component 325, 326 representative of a start relay, and a starter motor, respectively.

Additionally, the routing diagram 37 includes a hotspot 322. Although the hotspot 322 is represented using a dashed rectangular line, the hotspot 322 can cover a rectangular or non-rectangular area (e.g., a circular area) within the routing diagram 37 and a screen of the display 84.

The hotspot 322 includes an icon 323 and a textual description 324. The icon 323 is connected to and corresponds to the routable component 141. The textual description 324 indicates the textual routing diagram identifier 3 and the diagram count 4 for the routing diagram 38 (which is shown in FIG. 21).

Figure 21:
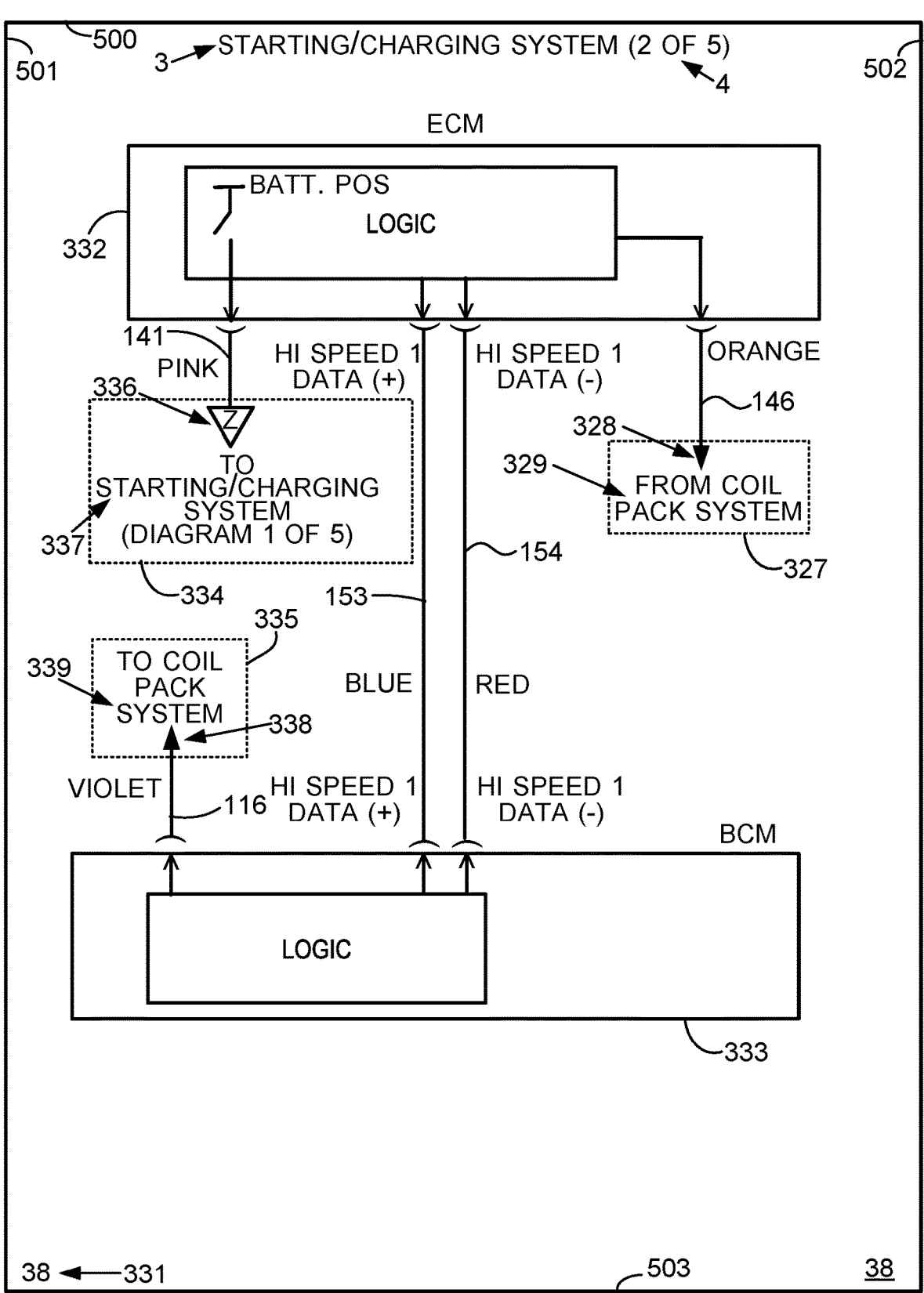

Next, FIG. 21 shows the routing diagram 38. The routing diagram 38 includes a routing diagram identifier 331. In some implementations, the routing diagram identifier 331 is visible on the display 84 while the routing diagram 38 is displayed on the display 84. In those or in other implementations, the routing diagram identifier 331 is stored within metadata corresponding to the routing diagram 38. The routing diagram identifier 331 is indicative of the routing diagram 38, which is a second of five routing diagrams corresponding to the starting/charging system. The textual routing diagram identifier 3 and the diagram count 4 within the routing diagram 38 indicate that the routing diagram 38 is the second of five routing diagrams corresponding to the starting/charging system.

The routing diagram 38 includes the routable component 116, 141, 146, 153, 154. In at least some implementations, those reference numbers correspond to routable component numbers (e.g., electrical circuit numbers) visually present on the routing diagram 38. Similar to other routing diagrams described above, the routing diagram 38 includes a textual description that describes a color of the routable component 116, 141, 146, 153, 154. The routing diagram 38 also includes a connectable component 332, 333 representative of an engine control module (ECM) ECU, and a body control module BCM ECU, respectively.

Additionally, the routing diagram 38 includes a hotspot 327, 334, 335. Although the hotspot 327, 334, 335 is represented using a dashed rectangular line, the hotspot 327, 334, 335 can cover a rectangular or non-rectangular area (e.g., a circular area) within the routing diagram 38 and a screen of the display 84.

The hotspot 327 includes an icon 328 and a textual description 329. The icon 328 is connected to and corresponds to the routable component 146. The textual description 329 indicates the textual routing diagram identifier 3 and the diagram count 4 for another routing diagram, such as the routing diagram 51 shown in FIG. 4 and FIG. 16. Metadata corresponding to the hotspot 327 can include an identifier of the routing diagram 51. In response to a selection of the hotspot 327, the processor 81 can output the routing diagram 51 on the display 84. Furthermore, in response to a selection of the hotspot 327, the processor 81 can display the routing diagram 51 on the display 84 with the routable component 146 highlighted and without highlighting the other routable components on the routing diagram 51.

The hotspot 334 includes an icon 336 and a textual description 337. The icon 336 is connected to and corresponds to the routable component 141. The textual description 337 indicates the textual routing diagram identifier 3 and the diagram count 4 for the routing diagram 37 (which is shown in FIG. 20).

The hotspot 335 includes an icon 338. The icon 338 is connected to and corresponds to the routable component 116. The hotspot 335 includes a textual description 339. The textual description 339 indicates the textual routing diagram identifier 3 and the diagram count 4 for another routing diagram, such as the routing diagram 52 shown in FIG. 4 and FIG. 16. Metadata corresponding to the hotspot 335 can include an identifier of the routing diagram 52. In response to a selection of the hotspot 335, the processor 81 can output the routing diagram 52 on the display 84. Furthermore, in response to a selection of the hotspot 335, the processor 81 can display the routing diagram 52 on the display 84 with the routable component 116 highlighted and without highlighting the other routable components on the routing diagram 52.

Figure 22:
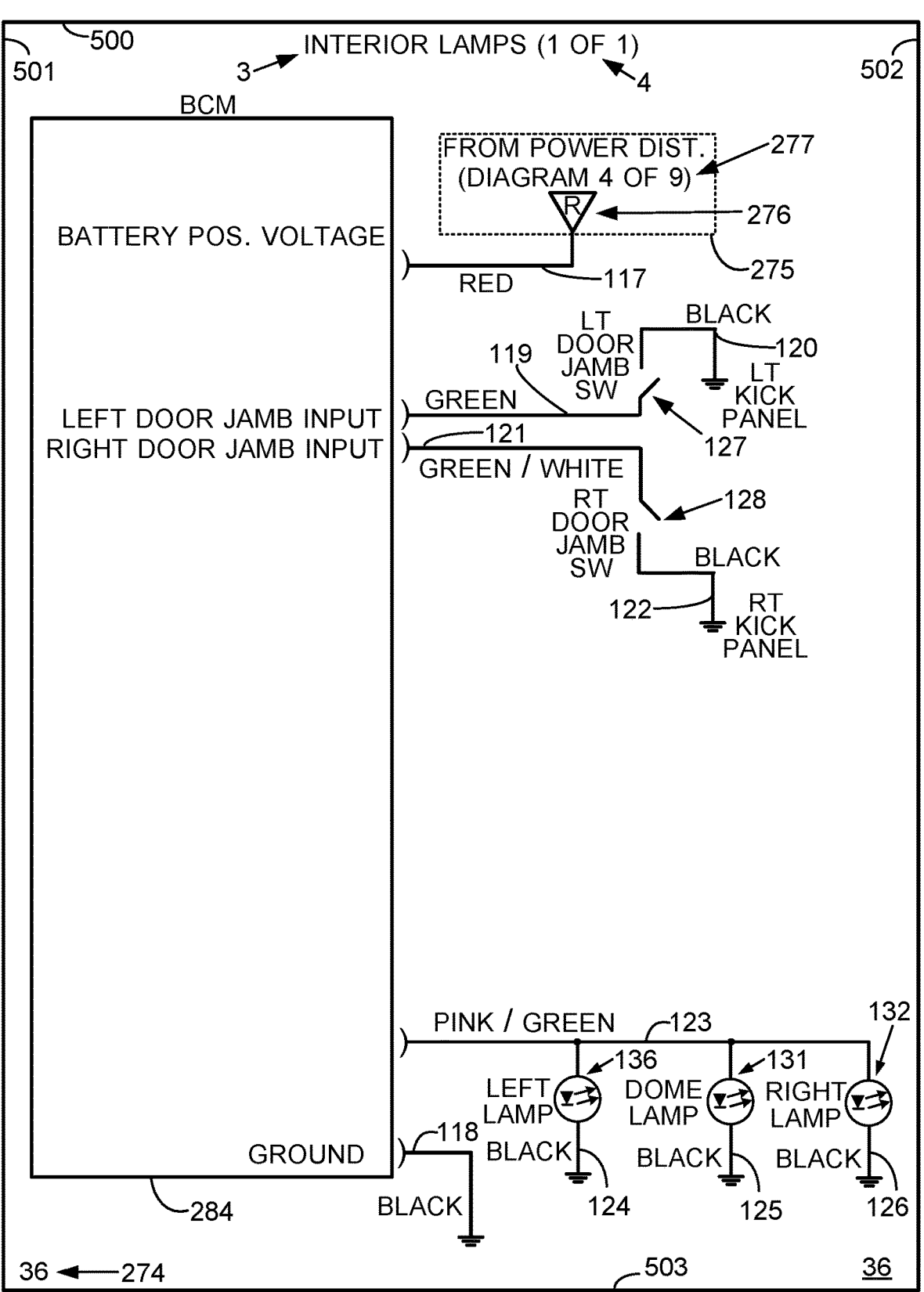

Next, FIG. 22 shows the routing diagram 36. The routing diagram 36 includes a routing diagram identifier 274. In some implementations, the routing diagram identifier 274 is visible on the display 84 while the routing diagram 36 is displayed on the display 84. In those or in other implementations, the routing diagram identifier 274 is stored within metadata corresponding to the routing diagram 36. The routing diagram identifier 274 is indicative of the routing diagram 36, which is a first of one routing diagram corresponding to interior lamps. The textual routing diagram identifier 3 and the diagram count 4 within the routing diagram 36 indicate that the routing diagram 36 is the first of one routing diagram corresponding to the interior lamps.

The routing diagram 36 includes the routable component 117, 118, 119, 120, 121, 122, 123, 124, 125, 126. In at least some implementations, those reference numbers correspond to routable component numbers (e.g., electrical circuit numbers) visually present on the routing diagram 36. The routing diagram 36 also includes a connectable component 127, 128, 136, 131, 132, 284 representative of a left-side door jamb switch, a right-side door jamb switch, a left-side lamp, a dome lamp, a right-side lamp, and a BCM ECU, respectively.

Additionally, the routing diagram 36 includes a hotspot 275. Although the hotspot 275 is represented using a dashed rectangular line, the hotspot 275 can cover a rectangular or non-rectangular area (e.g., a circular area) within the routing diagram 36 and a screen of the display 84.

The hotspot 275 includes an icon 276 and a textual description 277. The icon 276 is connected to and corresponds to the routable component 117. The textual description 277 indicates the textual routing diagram identifier and the diagram count for the routing diagram 45 shown in FIG. 4.

Figure 24:
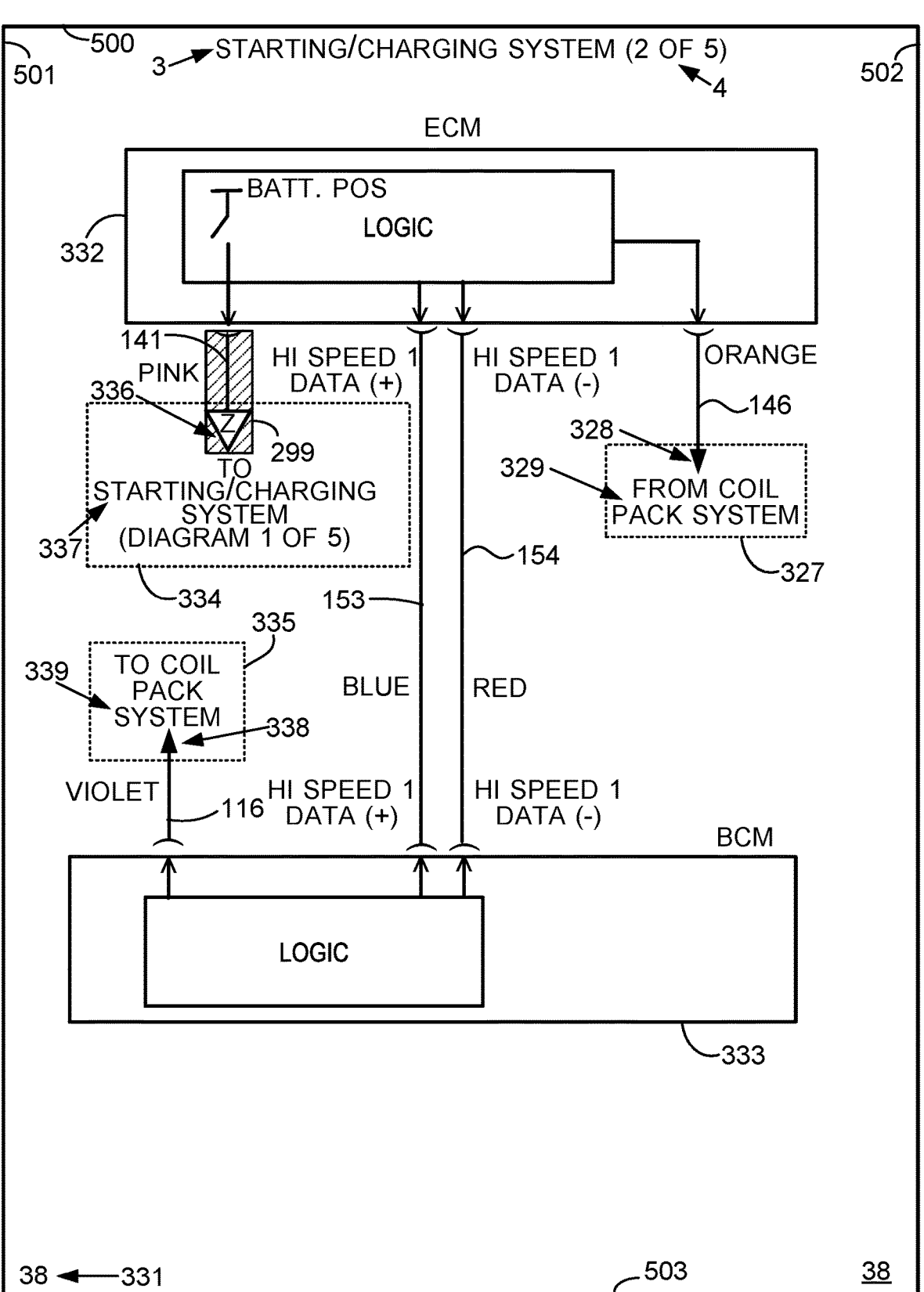
Figure 25:
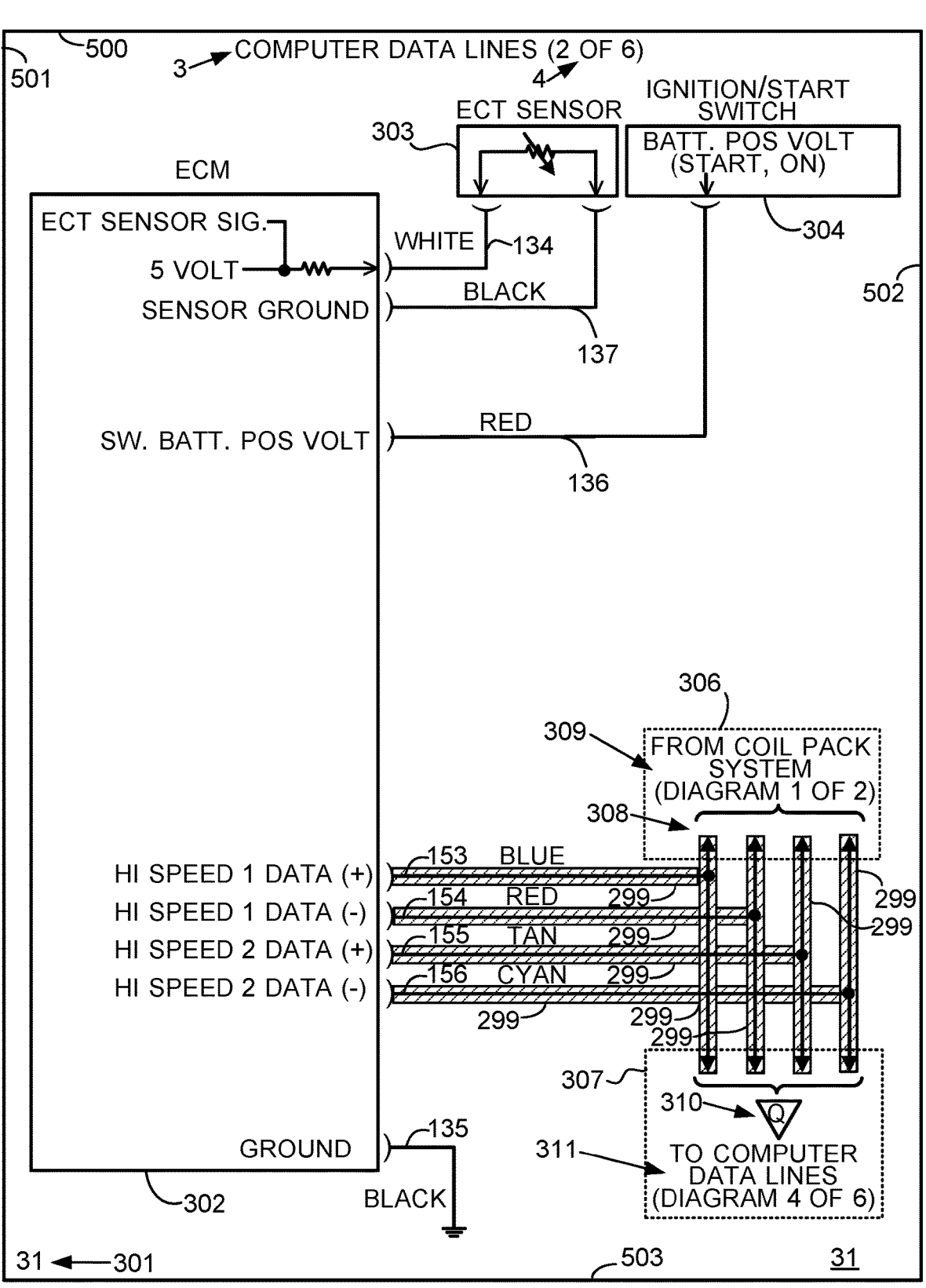

Next, FIG. 23, FIG. 24, and FIG. 25 show the routing diagram 37, 38, and 31, also shown in FIG. 20, FIG. 21, and FIG. 19, respectively, except that in FIG. 23, FIG. 24 and FIG. 25, the routing diagram 37, 38, and 31 include at least one routable component that is highlighted with highlighting 299.

For example, in FIG. 23, the routable component 141 is highlighted. The display 84 can show the routing diagram 37 with the routable component 141 highlighted in response to a selection of the hotspot 334 from the routing diagram 38 shown in FIG. 21 and FIG. 24. Displaying the routable component 141 in FIG. 23 highlighted after selecting the hotspot 334 from FIG. 21 represents that a routable component corresponding to a hotspot can be highlighted in a routing diagram displayed in response to a selection of the hotspot even if the routable component was not highlighted (in the routing diagram containing the hotspot) when the hotspot was selected. Displaying the routable component 141 in FIG. 23 highlighted after selecting the hotspot 334 from FIG. 24 represents that a routable component corresponding to a hotspot can be highlighted in a routing diagram displayed in response to a selection of the hotspot if the routable component was highlighted (in the routing diagram containing the hotspot) when the hotspot was selected and/or in response to a selection of the hotspot corresponding to the routable component.

As another example, in FIG. 24, the routable component 141 is highlighted. The display 84 can show the routing diagram 38 with the routable component 141 highlighted in response to a selection of the hotspot 322 from the routing diagram 37 shown in FIG. 20 and FIG. 23. Displaying the routable component 141 in FIG. 24 highlighted after selecting the hotspot 322 from FIG. 20 represents that a routable component corresponding to a hotspot can be highlighted in a routing diagram displayed in response to a selection of the hotspot even if the routable component was not highlighted (in the routing diagram containing the hotspot) when the hotspot was selected. Displaying the routable component 141 in FIG. 24 highlighted after selecting the hotspot 322 from FIG. 23 represents that a routable component corresponding to a hotspot can be highlighted in a routing diagram displayed in response to a selection of the hotspot if the routable component was highlighted (in the routing diagram containing the hotspot) when the hotspot was selected and/or in response to a selection of the hotspot corresponding to the routable component.

As another example, in FIG. 25, the routable component 153, 154, 155, 156 is highlighted. The display 84 can show the routing diagram 31 with the routable component 153, 154, 155, 156 highlighted in response to a selection of the hotspot 189 from the routing diagram 51 shown in FIG. 16, even if the routable component 153, 154, 155, 156 is not highlighted at the time of that selection. The routable component 153, 154, 155, 156 can also be displayed as highlighted in FIG. 25 because the routable component 153, 154, 155, 156 were highlighted at the time of the selection of the hotspot 189 and/or in response to a selection of a hotspot in routing diagram 33 (i.e., a routing diagram that corresponds to the hotspot 307 in the routing diagram 31).

VI. Example Operation

Next, FIG. 26 shows a flow chart 400 depicting a set of functions that can be carried out in accordance with the example implementations described in this description. The flow chart 400 includes a block 401, 402, 403. The following description of the flow chart 400 includes references to elements shown in other figures described in this description, but the functions of the flow chart 400 are not limited to being carried out only by the referenced elements. A variety of methods can be performed using all of the functions shown in the flow chart 400 or any proper subset of the functions shown in the flow chart 400. Any of those methods can be performed with other functions such as one or more of the other functions described in this description.

Block 401 includes displaying a first routing diagram on a display. The first routing diagram is a member of a first set of routing diagrams that includes multiple different routing diagrams. Displaying the first routing diagram includes displaying, within the first routing diagram, a first USC and a first portion of a particular routable component. The first user-selectable control indicates that the particular routable component continues on a second routing diagram. As an example displaying the first routing diagram can include displaying the first routing diagram within a GUI container such as the container 239 within the GUI 241 shown in FIG. 14. In accordance with the implementations corresponding to FIG. 4, the first set of routing diagrams can be one of the routing diagram set 20, 22, 23, 24, 25.

In at least some implementations, the first USC is arranged as and/or incudes a screen hotspot (or more simply, a "hotspot"). The first USC can define an area on the first routing diagram that selectable (e.g., selectable using a cursor 161). The defined area can include a graphical icon and/or a textual description. The textual description can include a description of the particular routable component.

In at least some implementations, the first routing diagram includes multiple user-selectable controls arranged as separate hotspots. Each of those user-selectable controls corresponds to a first portion of a particular routable component that continues on some other routing diagram. Two or more of those first portions of a particular routable component may continue on different routing diagrams. In at least some implementations, the first routing diagram and other routing diagram include an equal quantity of hotspots. In other implementations, the first routing diagram and other routing diagram include different quantities of hotspots.

In at least some implementations, the first routing diagram is displayed on the display 84 after selection of a device (e.g., a DUS, such as a vehicle). The device (e.g., the vehicle) can be selected from a GUI, such as the GUI 160 shown in FIG. 11. Additionally or alternatively, in at least some implementations, the first routing diagram is displayed on the display 84 after selection of a USC (e.g., the routing diagrams content selector 223 shown in FIG. 12) operable to signal a processor that displaying a routing diagram for the identified device is desired. Additionally or alternatively, in at least some implementations, the first routing diagram is displayed on the display 84 after selection of a USC (e.g., one of user-selectable controls 229 shown in FIG. 13) operable to signal a processor that displaying a routing diagram of a particular set of routing diagrams is desired.

Block 402 includes determining, by one or more processors, a selection of the first user-selectable control occurs while the first routing diagram is displayed on the display. A selection of the first user-selectable control can be made using the user interface 83. The processor 81 can execute the CRPI 91 to determine that the user-selectable control was selected using the user interface 83.

Block 403 includes displaying, on the display in response to determining the selection of the first user-selectable control occurs while the first routing diagram is displayed on the display, the second routing diagram. Displaying the second routing diagram includes displaying a second portion of the particular routable component. As an example displaying the second routing diagram can include displaying the second routing diagram within a GUI container such as the container 239 within the GUI 241 shown in FIG. 14 in place of the first routing diagram being displayed in that container.

In at least some implementations of a method including one or more or all of the functions shown in the flow chart 400, the second routing diagram is a member of the first set of routing diagrams. As an example, the first and second routing diagrams are any two routing diagrams of the routing diagram set 20, any two routing diagrams of the routing diagram set 22, any two routing diagrams of the routing diagram set 23, the two routing diagrams of the routing diagram set 24, or any two routing diagrams of the routing diagram set 25.

In at least some of the implementations described in the preceding paragraph or elsewhere in this description, the multiple different routing diagrams are arranged according to a sequence of multiple routing diagrams. Moreover, the sequence of multiple routing diagrams includes at least one routing diagram between the first routing diagram and the second routing diagram. As an example, the routing diagrams in the routing diagram set 20 are arranged in a sequence from a first routing diagram to a sixth routing diagram as follows: routing diagram 30, routing diagram 31, routing diagram 32, routing diagram 33, routing diagram 34, routing diagram 35, and routing diagram 36.

In at least some of the implementations described in the preceding paragraph or elsewhere in this description, the method further includes displaying, on the display, a second user-selectable control and a third user-selectable control. A selection of the second user-selectable control signals the one or more processors to display an earlier diagram in the sequence of multiple diagrams, if any, compared to a currently-displayed diagram of the sequence of multiple diagrams. A selection of the third user-selectable control signals the one or more processors to display a later diagram in the sequence of multiple diagrams, if any, compared to the currently-displayed diagram of the sequence of multiple diagrams. As an example, the second user-selectable control can be arranged like and/or operable like the routing diagram selector USC 253 shown in FIG. 14. As an example, the third user-selectable control can be arranged like and/or operable like the routing diagram selector USC 254 shown in FIG. 14.

In at least some of the implementations described in the preceding three paragraphs or elsewhere in this description, the first routing diagram includes a first electrical wiring diagram, the second routing diagram includes a second electrical wiring diagram, the first portion of the particular routable component represents a first portion of a particular electrical circuit, and the second portion of the particular routable component represents a second portion of the particular electrical circuit. Alternatively, the first routing diagram includes a first optical communication line diagram, the second routing diagram includes a second optical communication line diagram, the first portion of the particular routable component represents a first portion of a particular optical communication line, and the second portion of the particular routable component represents a second portion of the particular optical communication line. Further alternatively, the first routing diagram includes a first hydraulic line diagram, the second routing diagram includes a second hydraulic line diagram, the first portion of the particular routable component represents a first portion of a particular hydraulic line, and the second portion of the particular routable component represents a second portion of the particular hydraulic line. Still further alternatively, the first routing diagram includes a first pneumatic line diagram, the second routing diagram includes a second pneumatic line diagram, the first portion of the particular routable component represents a first portion of a particular pneumatic line, and the second portion of the particular routable component represents a second portion of the particular pneumatic line. Yet still further alternatively, the first routing diagram includes a first vacuum line diagram, the second routing diagram includes a second vacuum line diagram, the first portion of the particular routable component represents a first portion of a particular vacuum line, and the second portion of the particular routable component represents a second portion of the particular vacuum line.

In at least some of the implementations described four paragraphs above or elsewhere in this description, the first user-selectable control corresponds to first metadata, and the first metadata includes an identifier of the particular routable component within the second routing diagram. Moreover, the method of these implementations includes after determining the selection of the first user-selectable control occurs while the first routing diagram is displayed on the display, but before displaying the second routing diagram, determining, by the one or more processors based at least in part on the identifier of the particular routable component, the second portion of the particular routable component is within the second routing diagram.

In at least some implementations of a method including one or more or all of the functions shown in the flow chart 400, the second routing diagram is a member of a second set of routing diagrams. Furthermore, the second set of routing diagrams includes one or more routing diagrams not contained in the first set of routing diagrams. Furthermore still, the second routing diagram is not a member of the first set of routing diagrams. As an example, the first routing diagram is a routing diagram of the routing diagram set 24 (e.g., the routing diagram 51 shown in FIG. 4 and FIG. 16) and the second routing diagram is a routing diagram of the routing diagram set 20 (e.g., the routing diagram 31 shown in FIG. 4 and FIG. 17).

In at least some of the implementations described in the preceding paragraph or elsewhere in this description, the multiple different routing diagrams are arranged according to a first sequence of multiple routing diagrams and the second set of routing diagrams includes multiple different routing diagrams are arranged according to a second sequence of multiple routing diagrams.

In at least some of the implementations described in the preceding two paragraphs or elsewhere in this description, the first routing diagram includes a first electrical wiring diagram, the second routing diagram includes a second electrical wiring diagram, the first portion of the particular routable component represents a first portion of a particular electrical circuit, and the second portion of the particular routable component represents a second portion of the particular electrical circuit. Alternatively, the first routing diagram includes a first optical communication line diagram, the second routing diagram includes a second optical communication line diagram, the first portion of the particular routable component represents a first portion of a particular optical communication line, and the second portion of the particular routable component represents a second portion of the particular optical communication line. Further alternatively, the first routing diagram includes a first hydraulic line diagram, the second routing diagram includes a second hydraulic line diagram, the first portion of the particular routable component represents a first portion of a particular hydraulic line, and the second portion of the particular routable component represents a second portion of the particular hydraulic line. Still further alternatively, the first routing diagram includes a first pneumatic line diagram, the second routing diagram includes a second pneumatic line diagram, the first portion of the particular routable component represents a first portion of a particular pneumatic line, and the second portion of the particular routable component represents a second portion of the particular pneumatic line. Yet still further alternatively, the first routing diagram includes a first vacuum line diagram, the second routing diagram includes a second vacuum line diagram, the first portion of the particular routable component represents a first portion of a particular vacuum line, and the second portion of the particular routable component represents a second portion of the particular vacuum line.

In at least some of the implementations described in the preceding three paragraphs or elsewhere in this description, each routing diagram of the first set of routing diagrams and each routing diagram of the second set of routing diagrams is a different routing diagram.

In at least some of the implementations described two, three, or four paragraphs above or elsewhere in this description, each routing diagram of the first set of routing diagrams and each routing diagram of the second set of routing diagrams is a different routing diagram. Additionally, the first metadata includes an identifier of the second routing diagram, an identifier of the particular routable component on the second routing diagram, and an identifier of the second set of routing diagrams. Moreover, in response to determining the selection of the first user-selectable control occurs while the first routing diagram is displayed on the display, the method of these implementations also includes retrieving, by the one or more processors based at least in part on the identifier of the second routing diagram and the identifier of the second set of routing diagrams, the second routing diagram from a database. Also in response to determining the selection of the first user-selectable control occurs while the first routing diagram is displayed on the display, the method of these implementations includes determining, by the one or more processors, a path of the particular routable component on the second routing diagram, and displaying, on the display, the second routing diagram with the particular routable component on the second routing diagram highlighted along the path.

In at least some of the implementations described in the preceding paragraph or elsewhere in this description, the identifier of the particular routable component on the second routing diagram and the identifier of the second set of routing diagrams are distinct identifiers.

In at least some of the implementations described two paragraphs above or elsewhere in this description, the first metadata further includes an identifier of a connectable component corresponding to the particular routable component. Furthermore, the second routing diagram includes the connectable component. Furthermore still, displaying the second routing diagram in response to determining the selection of the first user-selectable control occurs further includes displaying the connectable component highlighted.

In at least some of the implementations described three paragraphs above or elsewhere in this description, second metadata corresponds to the connectable component. The second metadata includes an identifier of two or more routable components. Also, the two or more components are represented in the second routing diagram as being connected to the connectable component. Moreover, the two or more routable components include the particular routable component. Additionally, displaying the second routing diagram in response to determining the selection of the first user-selectable control occurs further includes displaying the two or more routable components highlighted.

In at least some implementations of a method including one or more or all of the functions shown in the flow chart 400, the first user-selectable control corresponds to first metadata. Furthermore, the first metadata includes an identifier of the particular routable component within the second routing diagram. Furthermore still, the method also includes after determining the selection of the first user-selectable control occurs while the first routing diagram is displayed on the display, but before displaying the second routing diagram, determining, by the one or more processors based at least in part on the identifier of the particular routable component, the second portion of the particular routable component is within the second routing diagram.

In at least some implementations of a method including one or more or all of the functions shown in the flow chart 400, the first user-selectable control corresponds to first metadata. Additionally, the first metadata includes an identifier of the second routing diagram and an identifier of the particular routable component on the second routing diagram. In accordance with these implementations, the method also includes after determining the selection of the first user-selectable control occurs while the first routing diagram is displayed on the display, but before displaying the second routing diagram, retrieving, by the one or more processors based at least in part on the identifier of the second routing diagram, the second routing diagram from a database. The method further includes searching, by the one or more processors, the second routing diagram to determine a path of the particular routable component on the second routing diagram. Even more, the method includes displaying, on the display, the second routing diagram with the particular routable component on the second routing diagram highlighted.

In at least some implementations of a method described in the preceding paragraph or elsewhere in this description, the second routing diagram includes a second user-selectable control. Also, the second user-selectable control includes an indicator that indicates the particular routable component continues on the first routing diagram. Moreover, the second user-selectable control corresponds to second metadata. Even more, the second metadata includes an identifier of the first routing diagram and an identifier of the particular routable component on the first routing diagram.

In at least some implementations of a method described in the preceding paragraph or elsewhere in this description, the identifier of the particular routable component on the first routing diagram is different than identifier of the particular routable component on the second routing diagram.

In at least some implementations of a method described two paragraphs above or elsewhere in this description, the method also includes determining, by one or more processors, a selection of the second user-selectable control occurs while the second routing diagram is displayed on the display. The method further includes after determining the selection of the second user-selectable control occurs while the second routing diagram is displayed on the display, but before displaying the first routing diagram again, retrieving, by the one or more processors based at least in part on the identifier of the first routing diagram, the first routing diagram from the database. Furthermore, the method includes searching, by the one or more processors, the first routing diagram to determine a path of the particular routable component on the first routing diagram. Furthermore still, the method includes displaying, on the display, the first routing diagram with the particular routable component on the first routing diagram highlighted.

In at least some implementations of a method described in the preceding paragraph or elsewhere in this description, the first routing diagram includes a third user-selectable control. The third user-selectable control includes an indicator that indicates the particular routable component continues on a third routing diagram. Additionally, the third routing diagram is a member of the first set of routing diagrams. Moreover, the third user-selectable control corresponds to third metadata. Furthermore, the third metadata includes an identifier of the third routing diagram and an identifier of the particular routable component on the third routing diagram. Furthermore still, the method includes determining, by one or more processors, a selection of the third user-selectable control occurs while the first routing diagram is displayed on the display. The method also includes after determining the selection of the third user-selectable control occurs while the first routing diagram is displayed on the display, but before displaying the third routing diagram, retrieving, by the one or more processors based at least in part on the identifier of the third routing diagram, the third routing diagram from the database. Even more, the method includes searching, by the one or more processors, the third routing diagram to determine a path of the particular routable component on the third routing diagram. Still even more, the method includes displaying, on the display, the third routing diagram with the particular routable component on the third routing diagram highlighted.

In at least some implementations of a method described in the preceding paragraph or elsewhere in this description, the identifier of the particular routable component on the first routing diagram is identical to the identifier of the particular routable component on the third routing diagram.

In at least some implementations of a method described five paragraphs above or elsewhere in this description, the second routing diagram is a member of a second set of routing diagrams. The second set of routing diagrams includes one or more routing diagrams not contained in the first set of routing diagrams. Moreover, the second routing diagram is not a member of the first set of routing diagrams. Additionally, the second routing diagram includes a third user-selectable control. The third user-selectable control includes an indicator that indicates the particular routable component continues on a third routing diagram. Moreover, the third routing diagram is contained within the second set of routing diagrams. Additionally, the third user-selectable control corresponds to third metadata. The third metadata includes an identifier of the third routing diagram and an identifier of the particular routable component on the third routing diagram. Furthermore, the method includes determining, by one or more processors, a selection of the third user-selectable control occurs while the second routing diagram is displayed on the display. The method also includes after determining the selection of the third user-selectable control occurs, but before displaying the third routing diagram, retrieving, by the one or more processors based at least in part on the identifier of the third routing diagram, the third routing diagram from the database. Even more, the method includes searching, by the one or more processors, the third routing diagram to determine a path of the particular routable component on the third routing diagram. Still even more, the method includes displaying, on the display, the third routing diagram with the particular routable component on the third routing diagram highlighted.

In at least some of the implementations described in the preceding paragraph or elsewhere in this description, the identifier of the particular routable component on the second routing diagram is identical to the identifier of the particular routable component on the third routing diagram.

In at least some implementations of a method described eight paragraphs above or elsewhere in this description, displaying the second routing diagram with the particular routable component on the second routing diagram highlighted includes displaying the particular routable component within the particular routable component defined by a first stroke width, a first color, and a path and displaying highlighting defined by a second stroke width, a second color, an opacity value, and the path.

In at least some implementations of a method including one or more or all of the functions shown in the flow chart 400, the first routing diagram includes a second routable component. Moreover, the method includes determining, by the one or more processors, a selection of the first portion of the particular routable component and a selection of the second routable component occur while the first routing diagram is displayed on the display. The method also includes displaying, in response to the selection of the first portion of the particular routable component, the first portion of the routable component as highlighted. Furthermore, the method includes displaying, in response to the selection of the second routable component, the second routable component as highlighted.

In at least some of the implementations described in the preceding paragraph or elsewhere in this description, a color of highlighting for the first portion of the particular routable component is different than a color of highlighting for the second routable component.

In at least some implementations of a method including one or more or all of the functions shown in the flow chart 400, the first routing diagram includes a second routable component. Moreover, a color of highlighting for the first portion of the particular routable component is different than a color of highlighting for the second routable component. Furthermore, the method includes determining, by the one or more processors, a selection of the first portion of the particular routable component and a selection of the second routable component occur while the first routing diagram is displayed on the display. The method also includes displaying, in response to the selection of the first portion of the particular routable component, the first portion of the routable component as highlighted. The method further includes displaying, in response to the selection of the second routable component, the second routable component as highlighted. Even more, the method includes determining, by the one or more processors, the color of highlighting for the first portion of the particular routable component and the color of highlighting for the second routable component based on an order the selection of the first portion of the particular routable component and the selection of the second routable component. A benefit of selecting highlighting in sequence is that some highlight colors may be preferable such that the preferable colors are used before using any less preferable colors to highlight components in the routing diagram.

In at least some implementations of a method including one or more or all of the functions shown in the flow chart 400, displaying the second routing diagram includes displaying the second routing diagram instead of the first routing diagram.

In at least some implementations of a method including one or more or all of the functions shown in the flow chart 400, the method further includes determining, by the one or more processors prior to determining the selection of the first user-selectable control occurs while the first routing diagram is displayed on the display, a selection of the particular routable component occurs while the first routing diagram is displayed on the display. The method also includes displaying, on the display in response to determining the selection of the particular routable component occurs while the first routing diagram is displayed on the display, the particular routable component highlighted instead of un-highlighted. Moreover, the particular routable component in the first routing diagram is highlighted when the selection of the first user-selectable control occurs. Even more, the particular routable component in the second routing diagram is highlighted when displaying the second routing diagram in response to determining the selection of the first user-selectable control occurs.

In at least some implementations of a method including one or more or all of the functions shown in the flow chart 400, displaying the first routing diagram includes displaying, within the first routing diagram, a second user-selectable control and a first portion of a second particular routable component. Additionally, the second user-selectable control indicates that the second particular routable component continues on a third routing diagram. Moreover, the second routing diagram is a member of the first set of routing diagrams or a second set of routing diagrams not including the first routing diagram. Furthermore, the third routing diagram is a member of the other of first set of routing diagrams or the second set of routing diagrams. Furthermore still, the first user-selectable control and the second user-selectable control include different symbols to distinguish the second routing diagram and the third routing diagram continue on routing diagrams contained in different sets of routing diagrams.

VII. Example Data

Next, FIG. 27 shows metadata corresponding to a routing diagram in accordance with one or more of the example implementations. In particular, FIG. 27 shows a metadata file 510. In FIG. 27, the metadata file 510 is arranged as an extensible markup language (XML) file, but the data within the metadata file 510 can be arranged in other file formats as well, such as a YAML (YAML Ain't Markup Language) file, a comma separated variable (CSV) file, a flat file, a JavaScript Object Notation (JSON) file, or some other file or data repository. The metadata file 510 includes file elements 511 to 530, which are described below.

The file element 511 includes a DUS identifier. The file element 511 thus provides context for other file elements in the metadata file 510 (e.g., which type of DUS corresponds to the other file elements).

The file element 512, 513, 514, 515, 516 517 represents file elements including metadata for the routing diagram set 20, 21, 22, 23, 24, 25 that pertain to the DUS identified by the file element 511. FIG. 27 shows the file element 512, 513, 514, 515, 517 includes a file element include a routing diagram set identifier. Each of the file element 512, 513, 514, 515, 517 can include other file elements, such as file elements shown in the file element 516 among others.

The file element 516 includes a file element 518 that includes a routing diagram set identifier for the routing diagram set 24. The file element 516 includes a file element 519 for the routing diagram 51 within the routing diagram set 24. The file element 516 can include separate file elements (similar to the file element 519) for each of the other routing diagrams within the routing diagram set 24, but those separate file elements are not shown in FIG. 27.

The file element 519 includes a file element 520 indicative of an identifier of the routing diagram 51 and a file element 521 indicative of a textual description and diagram count corresponding to the routing diagram 51.

The file element 519 includes a file element 522, 523, 524, 525, 526 that correspond to the hotspot 186, 187, 188, 189, 190, respectively, within the routing diagram 51. Each of the file element 522, 523, 525, 526 can include other file elements, such as file elements shown in the file element 524 among others.

The file element 524 includes a file element 527 indicative of an identifier of the hotspot 188 within the routing diagram 51. The file element 524 also includes a file element 528, 529 which include an identifier of the routing diagram set 23 and an identifier of the routing diagram 45, respectively. The file element 528 and the file element 529, in combination, can include information that can be used in and/or as a jump instruction within the CRPI 90 to cause the display 84 to display a routing diagram corresponding to the metadata within the file element 528, 529. The file element 530 includes an identifier of a component within the routing diagram 45 that is to be highlighted upon displaying the routing diagram in response to the hotspot 188 being selected. As an example, the jump instruction can include the metadata within the file element 528, 529. As another example, the jump instruction can include metadata indicating which routable component(s) and/or connectable component(s) is/are to be highlighted after jumping from the departure routing diagram to the routing diagram corresponding to a selected hotspot.

Next, FIG. 28 is a table 475 showing navigation sequence data and highlight status data pertaining to displaying routing diagrams in accordance with one or more of the example implementations. The table 475 includes a column 476, 477, 478, 479, 480 and a row 481, 482, 483, 484, 485. The column 476 includes routing diagram set identifiers for the routing diagram set 20, 23. The column 477 includes routing diagram identifiers for routing diagrams within a corresponding routing diagram set. A combination 486 includes the column 476, 477. The data in each of the bottom four rows of the combination 486 represents a routing diagram identifier of a previously displayed routing diagram. Other forms of a routing diagram identifier described in this description or otherwise can be used to represent a previously displayed routing diagram.

The column 478 includes DUS identifiers that correspond to the previously displayed routing diagram indicated by the data in the combination 486. In at least some implementations, the computing system 80 can store the DUS identifier in the device selection data 95 and/or the server 100 can store the DUS identifier within the device selection data 115 for the computing system 80. In this way, the computing system 80 and/or the server 100 does not have to store a separate instance of a DUS identifier for each previously displayed routing diagram because the computing system 80 and/or the server 100 know the identifier of a DUS currently selected for the computing system 80. The data within column 476, 477 and 478 represent the navigation sequence data upon which the computing system 80 and/or the server 100 can use to request, obtain, and/or provide a previously displayed routing diagram for displaying on the display 84.

The column 479 includes highlight status data that indicates which routable components and/or connectable components were highlighted upon departure from a particular routing diagram.

The column 480 includes an indication of which user-selectable control (e.g., a hotspot) was selected to cause the computing system to depart from showing the previously displayed routing diagram to a routing diagram corresponding to the user-selectable control in the column 480.

Next, FIG. 29 is a table 450 showing metadata corresponding to routing diagrams in accordance with one or more of the example implementations. The table 450 includes a column 451, 452, 453, 454. Each row in the column 451 (other than the first row) includes a reference number corresponding to one of the routing diagrams shown in FIG. 4. For each row within the column 452, 453, 454 (other than the first row) includes a routing diagram identifier of the routing diagram referenced by the reference number in column 451 of that same row.

The metadata within or corresponding to a routing diagram can include one or more routing diagram identifiers shown in the table 450 to indicate a destination routing diagram. The destination routing diagram corresponds to a hotspot within a routing diagram currently displayed on the display 84. In other words, if the processor 81 detects a selection of the hotspot from within the currently displayed routing diagram, the processor 81 refers to the metadata to determine the routing diagram identifier corresponding to the selected hotspot and the destination routing diagram.

The routing diagram identifiers in the column 452 are in a form of (X, Y), where X represents a routing diagram set identifier, and Y represents a drawing identifier within a routing diagram set indicated by X. The routing diagram identifiers in the column 453 are in a form of a textual routing diagram identifier and a diagram count (e.g., the textual routing diagram identifier 3 and a diagram count 4 shown in FIG. 16 to FIG. 22). The column 454 represents that a routing diagram identifier can be in a form of a hotspot index value. The hotspot index values shown in FIG. 29 that are numeric represent the reference numbers corresponding to hotspots shown in FIG. 16 to FIG. 22. The hotspot index values "N.S." shown in FIG. 29 indicate that hotspots corresponding to the routing diagram of that row are "Not Shown" in the application drawings. A quantity of N hotspots for all routing diagrams for a given DUS can correspond to a hotspot index value ranging from, for example, 1 to N. In at least some implementations, it may take less data to request a routing diagram from the server 71, 100 using a hotspot index value as compared to the data needed to request a routing diagram using a different form of a routing diagram identifier.

In at least some implementations, the processor 81 uses the routing diagram identifier determined from the metadata in the table 450 to obtain the destination routing diagram from the routing diagram 91.

In at least some other implementations, the processor 81 transmits to the server 71, 100 a request including the routing diagram identifier in order to obtain the destination routing diagram from the server 71, 100 (e.g., from the database 72 or the routing diagram 111). In response to receiving the routing diagram identifier (e.g., a routing diagram identifier in a form of: (20, 3), Computer Data Lines (3 of 6), or 307), the server 71, 100 can refer to data that maps the routing diagram identifier to a routing diagram (e.g., data including the data in column 451 and data in at least one of column 452, column 453 or column 454) to determine that routing diagram 32 corresponds to the routing diagram identifier in the request from the computing system 80.

VIII. Example Vehicle

In accordance with the example implementations, a routable component can be a routable component within a DUS arranged as a vehicle. Examples of a routable component within a vehicle include a wire within a wire harness, a hydraulic line for a transmission, an optical communication line for a communication system, a pneumatic line for an air brake system, and a vacuum line connecting an intake manifold and an EGR valve.

Similarly, in accordance with the example implementations, a connectable component can be a component within a DUS arranged as a vehicle. Such component can be referred to as a vehicle component. A vehicle component can include a computing system, such as an ECU manufactured by and/or for an OEM of a vehicle. A vehicle component can include a sensor manufactured by or for an original equipment manufacturer (OEM) of a vehicle. Other examples of a vehicle component are possible.

A vehicle is a mobile machine that can be used to transport a person, people, and/or cargo. Accordingly, a vehicle can be driven and/or otherwise guided along a path (e.g., a paved road or otherwise) on land, in water, in the air, and/or outer space. A vehicle can be wheeled, tracked, railed, and/or skied. A vehicle can include an automobile, a motorcycle (e.g., a two or three wheel motorcycle), an all-terrain vehicle (ATV) defined by ANSI/SVIA-1-2007, a snowmobile, a watercraft (e.g., a JET SKI® watercraft), a light-duty truck, a medium-duty truck, a heavy-duty truck, a semi-tractor, a drone, and/or a farm machine. A vehicle can include and/or use any appropriate voltage and/or current source, such as a battery, an alternator, a fuel cell, and the like, providing any appropriate current and/or voltage, such as about 12 volts, about 42 volts, 400 volts, 800 volts, or some other voltage level. A vehicle can, but need not necessarily, include and/or use any system and/or engine to provide its mobility. Those systems and/or engines can include vehicle components that use fossil fuels, such as gasoline, natural gas, propane, and the like, electricity, such as that generated by a battery, magneto, fuel cell, solar cell and the like, wind and hybrids and/or combinations thereof. A vehicle can, but need not necessarily, include an ECU, an on-board diagnostic connector (OBDC), and a vehicle network that connects the OBDC to the ECU. A vehicle can be operable to operate as an autonomous vehicle.

Some vehicles and types of vehicles can be identified by characteristics of the vehicle such as characteristics indicative of when the vehicle was built (e.g., a vehicle year), who built the vehicle (e.g., a vehicle make), marketing names associated with vehicle (e.g., a vehicle model name, or more simply "model"), and features of the vehicle (e.g., an engine type). This description uses an abbreviation YMME and/or Y/M/M/E, where each letter in the order shown represents a model year, vehicle make, vehicle model name, and engine type, respectively. This description uses an abbreviation YMM and/or Y/M/M, where each letter in the order shown represents a model year, vehicle make, and vehicle model name, respectively. An example Y/M/M/E is 2020/Toyota/Camry/4Cyl, in which "2020" represents the model year the vehicle was built, "Toyota" represents the name of the vehicle manufacturer Toyota Motor Corporation, Aichi Japan, "Camry" represents a vehicle model built by that manufacturer, and "4Cyl" represents a an engine type (i.e., a four cylinder internal combustion engine) within the vehicle. A person skilled in the art will understand that other features in addition to or as an alternative to "engine type" can be used to identify a vehicle. These other features can be identified in various manners, such as a regular production option (RPO) code, such as the RPO codes defined by the General Motors Company LLC, Detroit Michigan.

Some vehicles, such as automobiles, are associated with a unique vehicle identification number (VIN). Some VINs include seventeen alpha-numeric characters. For at least some seventeen character VINs, the last six characters represent a unique serial number associated with a particular type of vehicle represented by the first eleven alpha-numeric characters of those VINs. The first eleven alpha-numeric characters typically represent at least a YMME or a YMM. In some instances, a vehicle includes a one dimensional bar code indicative of a VIN associated with that vehicle.

A vehicle network can include one or more conductors (e.g., copper wire conductors) and/or can be wireless. As an example, a vehicle network can include one or two conductors for carrying vehicle data messages in accordance with a vehicle data message (VDM) protocol, such as a bi-directional VDM protocol. A bi-directional VDM protocol can include a SAE® J1850 (PWM or VPW) VDM protocol, an SAE® J1939 VDM protocol based on the SAE® J1939_201808 serial control and communications heavy duty vehicle network—top level document, and/or any other core J1939 standard, an ISO® 15764-4 controller area network (CAN) VDM protocol, an ISO® 9141-2 K-Line VDM protocol, an ISO® 14230-4 KWP2000 K-Line VDM protocol, an ISO® 17458 (e.g., parts 1-5) FlexRay VDM protocol, an ISO® 17987 local interconnect network (LIN) VDM protocol, a CAN 2.0 VDM protocol, standardized in part using an ISO® 11898-1:2015 road vehicle—CAN—Part I: data link layer and physical signaling protocol, a CAN FD VDM protocol (i.e., CAN with flexible data rate VDM protocol), a MOST® Cooperation VDM protocol (such as the MOST Specification Rev. 3.0 E2, or the MOST® Dynamic Specification, Rev. 3.0.2), an Ethernet VDM protocol (e.g., an Ethernet 802.3 protocol using a BROADR-REACH® physical layer transceiver specification for Automotive Applications by Broadcom Inc., San Jose, California), or some other VDM protocol defined for performing communications with or within a vehicle (e.g., the DUS 67). Each and every VDM discussed in this description is arranged according to a VDM protocol.

Instead of being bidirectional, a VDM protocol can be a unidirectional. For example, a SENT VDM protocol (i.e., a single-edge nibble transmission VDM protocol) is a unidirectional VDM protocol. The SENT VDM protocol has been standardized as the SAE J2716 VDM protocol. A sensor in a vehicle can include a transmitter operable to communicate using the SENT VDM protocol (i.e., a SENT VDM transmitter). A vehicle communication bus can operatively connect the SENT VDM transmitter and an ECU within the vehicle. The communication interface 85 can include a SENT VDM receiver connectable to the vehicle communication bus operatively connected to the SENT VDM transmitter. The SENT VDM receiver can receive SENT VDM protocol messages representing sensor values output by the sensor with the SENT VDM transmitter. These vehicle communication bus is an example of a routing component that can be shown in a routing diagram, such as a wiring diagram.

An OBDC can include an on-board diagnostic (OBD) II connector. An OBD II connector can include slots for retaining up to sixteen connector terminals, but can include a different number of slots or no slots at all. As an example, an OBDC can include an OBD II connector that meets the SAE J1962 specification such as a connector 16M, part number 12110252, available from Aptiv LLC of Dublin, Ireland. An OBDC can include conductor terminals that connect to a conductor in a vehicle. For instance, an OBDC can include connector terminals that connect to conductors that respectively connect to positive and negative terminals of a battery or battery pack. An OBDC can include one or more conductor terminals that connect to a conductor of a vehicle communication bus such that the OBDC is operatively connected to one or more ECUs. A computing system, such as the client 74 or computing system 80 can operatively connect to an OBDC in order to receive VDM from the vehicle including that OBDC. A VDM can carry VDM data. The VDM data can, but need not necessarily, include a parameter-identifier (PID) and parameter values associated with the PID. The VDM data can, but need not necessarily, include a DTC. The operative connection between the OBDC and the client 74 or computing system 60, 80 can occur via the communication link 68, 76 shown in FIG. 5 and FIG. 6 respectively or via some other arrangement. The communication link 68, 76 are shown using dashed lines to represent that the computing system 60 and portions of the network architecture other than the DUS 67, respectively, can operate without the DUS being connected thereto.

An ECU can control various aspects of vehicle operation and/or components within a vehicle system. For example, an ECU can include a powertrain (PT) system ECU, an engine control module (ECM) ECU, a supplemental inflatable restraint (SIR) system (i.e., an air bag system) ECU, an entertainment system ECU, or some other ECU. An ECU can receive an electrical or optical input from an ECU-connected input device (e.g., a sensor input), control an ECU-connected output device (e.g., a solenoid) via an electrical or optical signal output by the ECU, generate a vehicle data message (VDM) (such as a VDM based on a received input or a controlled output), and set a diagnostic trouble code (DTC) to a state (such as active or history). An ECU can perform a functional test in response to receiving a VDM requesting performance of the functional test. The functional test can be used to test an ECU-connected output device. In at least some implementations, the ECU is operable to perform the functional test and/or provide the diagnostic trouble code in accordance with an industry standard, such as the SAE J1979_201202 and/or ISO 15031-5 standards for E/E diagnostic test modes. These components are examples of connectable components that can be shown in a routing diagram, such as a wiring diagram.

IX. Conclusion

It should be understood that the arrangements described herein and/or shown in the drawings are for purposes of example only and are not intended to be limiting. As such, those skilled in the art will appreciate that other arrangements and elements (e.g., machines, interfaces, functions, orders, and/or groupings of functions) can be used instead, and some elements can be omitted altogether. Furthermore, various functions described and/or shown in the drawings as being performed by one or more elements can be carried out by a processor executing computer-readable program instructions or by a combination of hardware, firmware, and/or software. For purposes of this description, execution of CRPI contained in some computer-readable medium to perform some function can include executing all of the program instructions of those CRPI or only a portion of those CRPI.

While various aspects and implementations are described herein, other aspects and implementations will be apparent to those skilled in the art. The various aspects and implementations disclosed herein are for purposes of illustration and are not intended to be limiting, with the true scope being indicated by the claims, along with the full scope of equivalents to which such claims are entitled. It is also to be understood that the terminology used herein for the purpose of describing particular implementations only, and is not intended to be limiting.

This application incorporates by reference United States Patent Application Publication No. US 2021/0004585-A1, which has a Jan. 7, 2021 publication date and the following title: Method and system for displaying routing diagram with highlighted routable components. This application also incorporates by reference U.S. patent application Ser. No. 16/460,736, which a Jul. 2, 2019 filing date and the following title: Method and system for displaying routing diagram with highlighted routable components.

In this description, the articles "a," "an," and "the" are used to introduce elements and/or functions of the example implementations. The intent of using those articles is that there is one or more of the introduced elements and/or functions.

In this description, the intent of using the term "and/or" within a list of at least two elements or functions and the intent of using the terms "at least one of," "at least one of the following," "one or more of," and "one or more of the following" immediately preceding a list of at least two components or functions is to cover each implementation including a listed component or function independently and each implementation including a combination of the listed components or functions. For example, an implementation described as including A, B, and/or C, or at least one of A, B, and C, or at least one of: A, B, and C, or at least one of A, B, or C, or at least one of: A, B, or C, or one or more of A, B, and C, or one or more of: A, B, and C, or one or more of A, B, or C, or one or more of: A, B, or C is intended to cover each of the following possible implementations: (i) an implementation including A, but not B and not C, (ii) an implementation including B, but not A and not C, (iii) an implementation including C, but not A and not B, (iv) an implementation including A and B, but not C, (v) an implementation including A and C, but not B, (v) an implementation including B and C, but not A, and/or (vi) an implementation including A, B, and C. For the implementations including component or function A, the implementations can include one A or multiple A. For the implementations including component or function B, the implementations can include one B or multiple B. For the implementations including component or function C, the implementations can include one C or multiple C. The use of ordinal numbers such as "first," "second," "third" and so on is to distinguish respective elements rather than to denote a particular order of those elements unless the context of using those terms explicitly indicates otherwise. The use of the symbol "$" as prefix to a number indicates the number is a hexadecimal number.

Implementations of the present disclosure may thus relate to one of the enumerated example embodiments (EEEs) listed below.

EEE 1 is a method comprising displaying, on a display, a first routing diagram, wherein: the first routing diagram is a member of a first set of routing diagrams that includes multiple different routing diagrams, displaying the first routing diagram includes displaying, within the first routing diagram, a first user-selectable control and a first portion of a particular routable component, and the first user-selectable control indicates that the particular routable component continues on a second routing diagram; determining, by one or more processors, a selection of the first user-selectable control occurs while the first routing diagram is displayed on the display; and displaying, on the display in response to determining the selection of the first user-selectable control occurs while the first routing diagram is displayed on the display, the second routing diagram, wherein displaying the second routing diagram includes displaying a second portion of the particular routable component.

EEE 2 is a method according to EEE 1, wherein the second routing diagram is a member of the first set of routing diagrams.

EEE 3 is a method according to EEE 2, wherein: the multiple different routing diagrams are arranged according to a sequence of multiple routing diagrams, and the sequence of multiple routing diagrams includes at least one routing diagram between the first routing diagram and the second routing diagram.

EEE 4 is a method according to EEE 3, further comprising: displaying, on the display, a second user-selectable control and a third user-selectable control, wherein: a selection of the second user-selectable control signals the one or more processors to display an earlier diagram in the sequence of multiple diagrams, if any, compared to a currently-displayed diagram of the sequence of multiple diagrams, a selection of the third user-selectable control signals the one or more processors to display a later diagram in the sequence of multiple diagrams, if any, compared to the currently-displayed diagram of the sequence of multiple diagrams.

EEE 5 is a method according to any one of EEE 2 to 4, wherein (i) the first routing diagram includes a first electrical wiring diagram, the second routing diagram includes a second electrical wiring diagram, the first portion of the particular routable component represents a first portion of a particular electrical circuit, and the second portion of the particular routable component represents a second portion of the particular electrical circuit, (ii) the first routing diagram includes a first optical communication line diagram, the second routing diagram includes a second optical communication line diagram, the first portion of the particular routable component represents a first portion of a particular optical communication line, and the second portion of the particular routable component represents a second portion of the particular optical communication line, (iii) the first routing diagram includes a first hydraulic line diagram, the second routing diagram includes a second hydraulic line diagram, the first portion of the particular routable component represents a first portion of a particular hydraulic line, and the second portion of the particular routable component represents a second portion of the particular hydraulic line, (iv) the first routing diagram includes a first pneumatic line diagram, the second routing diagram includes a second pneumatic line diagram, the first portion of the particular routable component represents a first portion of a particular pneumatic line, and the second portion of the particular routable component represents a second portion of the particular pneumatic line, or (v) the first routing diagram includes a first vacuum line diagram, the second routing diagram includes a second vacuum line diagram, the first portion of the particular routable component represents a first portion of a particular vacuum line, and the second portion of the particular routable component represents a second portion of the particular vacuum line.

EEE 6 is a method according to any one of EEE 2 to 4, wherein the first routing diagram includes a first electrical wiring diagram, the second routing diagram includes a second electrical wiring diagram, the first portion of the particular routable component represents a first portion of a particular electrical circuit, and the second portion of the particular routable component represents a second portion of the particular electrical circuit.

EEE 7 is a method according to any one of EEE 2 to 4, wherein the first routing diagram includes a first optical communication line diagram, the second routing diagram includes a second optical communication line diagram, the first portion of the particular routable component represents a first portion of a particular optical communication line, and the second portion of the particular routable component represents a second portion of the particular optical communication line.

EEE 8 is a method according to any one of EEE 2 to 4, wherein the first routing diagram includes a first hydraulic line diagram, the second routing diagram includes a second hydraulic line diagram, the first portion of the particular routable component represents a first portion of a particular hydraulic line, and the second portion of the particular routable component represents a second portion of the particular hydraulic line.

EEE 9 is a method according to any one of EEE 2 to 4, wherein the first routing diagram includes a first pneumatic line diagram, the second routing diagram includes a second pneumatic line diagram, the first portion of the particular routable component represents a first portion of a particular pneumatic line, and the second portion of the particular routable component represents a second portion of the particular pneumatic line.

EEE 10 is a method according to any one of EEE 2 to 4, wherein the first routing diagram includes a first vacuum line diagram, the second routing diagram includes a second vacuum line diagram, the first portion of the particular routable component represents a first portion of a particular vacuum line, and the second portion of the particular routable component represents a second portion of the particular vacuum line.

EEE 11 is a method according to any one of EEE 2 to 10, wherein: the first user-selectable control corresponds to first metadata, the first metadata includes an identifier of the particular routable component within the second routing diagram, and the method further comprises: after determining the selection of the first user-selectable control occurs while the first routing diagram is displayed on the display, but before displaying the second routing diagram, determining, by the one or more processors based at least in part on the identifier of the particular routable component, the second portion of the particular routable component is within the second routing diagram.

EEE 12 is a method according to EEE 1, wherein: the second routing diagram is a member of a second set of routing diagrams, the second set of routing diagrams includes one or more routing diagrams not contained in the first set of routing diagrams, and the second routing diagram is not a member of the first set of routing diagrams, and optionally, the multiple different routing diagrams are arranged according to a first sequence of multiple routing diagrams and the second set of routing diagrams includes multiple different routing diagrams are arranged according to a second sequence of multiple routing diagrams.

EEE 13 is a method according to EEE 12, wherein: (i) the first routing diagram includes a first electrical wiring diagram, the second routing diagram includes a second electrical wiring diagram, the first portion of the particular routable component represents a first portion of a particular electrical circuit, and the second portion of the particular routable component represents a second portion of the particular electrical circuit, (ii) the first routing diagram includes a first optical communication line diagram, the second routing diagram includes a second optical communication line diagram, the first portion of the particular routable component represents a first portion of a particular optical communication line, and the second portion of the particular routable component represents a second portion of the particular optical communication line, (iii) the first routing diagram includes a first hydraulic line diagram, the second routing diagram includes a second hydraulic line diagram, the first portion of the particular routable component represents a first portion of a particular hydraulic line, and the second portion of the particular routable component represents a second portion of the particular hydraulic line, (iv) the first routing diagram includes a first pneumatic line diagram, the second routing diagram includes a second pneumatic line diagram, the first portion of the particular routable component represents a first portion of a particular pneumatic line, and the second portion of the particular routable component represents a second portion of the particular pneumatic line, or (v) the first routing diagram includes a first vacuum line diagram, the second routing diagram includes a second vacuum line diagram, the first portion of the particular routable component represents a first portion of a particular vacuum line, and the second portion of the particular routable component represents a second portion of the particular vacuum line.

EEE 14 is a method according to EEE 12, wherein the first routing diagram includes a first electrical wiring diagram, the second routing diagram includes a second electrical wiring diagram, the first portion of the particular routable component represents a first portion of a particular electrical circuit, and the second portion of the particular routable component represents a second portion of the particular electrical circuit.

EEE 15 is a method according to EEE 12, wherein the first routing diagram includes a first optical communication line diagram, the second routing diagram includes a second optical communication line diagram, the first portion of the particular routable component represents a first portion of a particular optical communication line, and the second portion of the particular routable component represents a second portion of the particular optical communication line.

EEE 16 is a method according to EEE 12, wherein the first routing diagram includes a first hydraulic line diagram, the second routing diagram includes a second hydraulic line diagram, the first portion of the particular routable component represents a first portion of a particular hydraulic line, and the second portion of the particular routable component represents a second portion of the particular hydraulic line.

EEE 17 is a method according to EEE 12, wherein the first routing diagram includes a first pneumatic line diagram, the second routing diagram includes a second pneumatic line diagram, the first portion of the particular routable component represents a first portion of a particular pneumatic line, and the second portion of the particular routable component represents a second portion of the particular pneumatic line.

EEE 18 is a method according to EEE 12, wherein the first routing diagram includes a first vacuum line diagram, the second routing diagram includes a second vacuum line diagram, the first portion of the particular routable component represents a first portion of a particular vacuum line, and the second portion of the particular routable component represents a second portion of the particular vacuum line.

EEE 19 is a method according to any one of EEE 12 to 18, wherein each routing diagram of the first set of routing diagrams and each routing diagram of the second set of routing diagrams is a different routing diagram.

EEE 20 is a method according to any one of EEE 12 to 19, wherein: the first user-selectable control corresponds to first metadata, the first metadata includes an identifier of the second routing diagram, an identifier of the particular routable component on the second routing diagram, and an identifier of the second set of routing diagrams, and the method further comprises in response to determining the selection of the first user-selectable control occurs while the first routing diagram is displayed on the display: retrieving, by the one or more processors based at least in part on the identifier of the second routing diagram and the identifier of the second set of routing diagrams, the second routing diagram from a database; determining, by the one or more processors, a path of the particular routable component on the second routing diagram; and displaying, on the display, the second routing diagram with the particular routable component on the second routing diagram highlighted along the path.

EEE 21 is a method according to EEE 20, wherein the identifier of the particular routable component on the second routing diagram and the identifier of the second set of routing diagrams are distinct identifiers.

EEE 22 is a method according to any one of EEE 20 to 21, wherein: the first metadata further includes an identifier of a connectable component corresponding to the particular routable component, the second routing diagram includes the connectable component, and displaying the second routing diagram in response to determining the selection of the first user-selectable control occurs further includes displaying the connectable component highlighted.

EEE 23 is method according to any one of EEE 20 to 22, wherein: second metadata corresponds to the connectable component, the second metadata includes an identifier of two or more routable components, the two or more components are represented in the second routing diagram as being connected to the connectable component, the two or more routable components include the particular routable component, and displaying the second routing diagram in response to determining the selection of the first user-selectable control occurs further includes displaying the two or more routable components highlighted.

EEE 24 is a method according to any one of EEE 1 to 23, wherein: the first user-selectable control corresponds to first metadata, the first metadata includes an identifier of the particular routable component within the second routing diagram, and the method further comprises after determining the selection of the first user-selectable control occurs while the first routing diagram is displayed on the display, but before displaying the second routing diagram, determining, by the one or more processors based at least in part on the identifier of the particular routable component, the second portion of the particular routable component is within the second routing diagram.

EEE 25 is a method according to any one of EEE 1 to 23, wherein: the first user-selectable control corresponds to first metadata, the first metadata includes an identifier of the second routing diagram and an identifier of the particular routable component on the second routing diagram, and the method further comprises: after determining the selection of the first user-selectable control occurs while the first routing diagram is displayed on the display, but before displaying the second routing diagram, retrieving, by the one or more processors based at least in part on the identifier of the second routing diagram, the second routing diagram from a database; searching, by the one or more processors, the second routing diagram to determine a path of the particular routable component on the second routing diagram; and displaying, on the display, the second routing diagram with the particular routable component on the second routing diagram highlighted.

EEE 26 is a method according to EEE 25, wherein: the second routing diagram includes a second user-selectable control, the second user-selectable control includes an indicator that indicates the particular routable component continues on the first routing diagram, the second user-selectable control corresponds to second metadata, and the second metadata includes an identifier of the first routing diagram and an identifier of the particular routable component on the first routing diagram.

EEE 27 is a method according to EEE 26, wherein the identifier of the particular routable component on the first routing diagram is different than identifier of the particular routable component on the second routing diagram.

EEE 28 is a method according to any one of EEE 26 to 27, further comprising: determining, by one or more processors, a selection of the second user-selectable control occurs while the second routing diagram is displayed on the display; after determining the selection of the second user-selectable control occurs while the second routing diagram is displayed on the display, but before displaying the first routing diagram again, retrieving, by the one or more processors based at least in part on the identifier of the first routing diagram, the first routing diagram from the database; searching, by the one or more processors, the first routing diagram to determine a path of the particular routable component on the first routing diagram; and displaying, on the display, the first routing diagram with the particular routable component on the first routing diagram highlighted.

EEE 29 is a method according to EEE 28, wherein: the first routing diagram includes a third user-selectable control, the third user-selectable control includes an indicator that indicates the particular routable component continues on a third routing diagram, the third routing diagram is a member of the first set of routing diagrams, the third user-selectable control corresponds to third metadata, the third metadata includes an identifier of the third routing diagram and an identifier of the particular routable component on the third routing diagram, and the method further comprises: (i) determining, by one or more processors, a selection of the third user-selectable control occurs while the first routing diagram is displayed on the display; (ii) after determining the selection of the third user-selectable control occurs while the first routing diagram is displayed on the display, but before displaying the third routing diagram, retrieving, by the one or more processors based at least in part on the identifier of the third routing diagram, the third routing diagram from the database; (iii) searching, by the one or more processors, the third routing diagram to determine a path of the particular routable component on the third routing diagram; and (iv) displaying, on the display, the third routing diagram with the particular routable component on the third routing diagram highlighted; and optionally, the identifier of the particular routable component on the first routing diagram is identical to the identifier of the particular routable component on the third routing diagram.

EEE 30 is a method according to EEE 26, wherein: the second routing diagram is a member of a second set of routing diagrams, the second set of routing diagrams includes one or more routing diagrams not contained in the first set of routing diagrams, the second routing diagram is not a member of the first set of routing diagrams, the second routing diagram includes a third user-selectable control, the third user-selectable control includes an indicator that indicates the particular routable component continues on a third routing diagram, the third routing diagram is contained within the second set of routing diagrams, the third user-selectable control corresponds to third metadata, the third metadata includes an identifier of the third routing diagram and an identifier of the particular routable component on the third routing diagram, and the method further comprises: (i) determining, by one or more processors, a selection of the third user-selectable control occurs while the second routing diagram is displayed on the display; (ii) after determining the selection of the third user-selectable control occurs, but before displaying the third routing diagram, retrieving, by the one or more processors based at least in part on the identifier of the third routing diagram, the third routing diagram from the database; (iii) searching, by the one or more processors, the third routing diagram to determine a path of the particular routable component on the third routing diagram; and (iv) displaying, on the display, the third routing diagram with the particular routable component on the third routing diagram highlighted; and optionally, the identifier of the particular routable component on the second routing diagram is identical to the identifier of the particular routable component on the third routing diagram.

EEE 31 is a method according to any one of EEE 15 to 30, wherein displaying the second routing diagram with the particular routable component on the second routing diagram highlighted includes displaying the particular routable component within the particular routable component defined by a first stroke width, a first color, and a path and displaying highlighting defined by a second stroke width, a second color, an opacity value, and the path.

EEE 32 is a method according to any one of EEE 20 to 23 or 25 to 31, wherein the identifier of the second routing diagram includes a routing diagram set identifier and a drawing identifier within a routing diagram set indicated by the routing diagram set identifier.

EEE 33 is a method according to any one of EEE 20 to 23 or 25 to 31, wherein the identifier of the second routing diagram includes a textual routing diagram identifier and a diagram count.

EEE 34 is a method according to any one of EEE 20 to 23 or 25 to 31, wherein the identifier of the second routing diagram includes an index value corresponding to the first user-selectable control.

EEE 35 is a method according to any one of EEE 1 to 34, wherein: the first routing diagram includes a second routable component, the method further comprises: (i) determining, by the one or more processors, a selection of the first portion of the particular routable component and a selection of the second routable component occur while the first routing diagram is displayed on the display, (ii) displaying, in response to the selection of the first portion of the particular routable component, the first portion of the routable component as highlighted; and (iii) displaying, in response to the selection of the second routable component, the second routable component as highlighted; and optionally, a color of highlighting for the first portion of the particular routable component is different than a color of highlighting for the second routable component.

EEE 36 is a method according to any one of EEE 1 to 34, wherein: the first routing diagram includes a second routable component, a color of highlighting for the first portion of the particular routable component is different than a color of highlighting for the second routable component, and the method further comprises: (i) determining, by the one or more processors, a selection of the first portion of the particular routable component and a selection of the second routable component occur while the first routing diagram is displayed on the display; (ii) displaying, in response to the selection of the first portion of the particular routable component, the first portion of the routable component as highlighted; (iii) displaying, in response to the selection of the second routable component, the second routable component as highlighted; and (iv) determining, by the one or more processors, the color of highlighting for the first portion of the particular routable component and the color of highlighting for the second routable component based on an order the selection of the first portion of the particular routable component and the selection of the second routable component.

EEE 37 is a method according to any one of EEE 1 to 36, wherein displaying the second routing diagram includes displaying the second routing diagram instead of the first routing diagram.

EEE 38 is a method according to any one of EEE 1 to 37, further comprising: determining, by the one or more processors prior to determining the selection of the first user-selectable control occurs while the first routing diagram is displayed on the display, a selection of the particular routable component occurs while the first routing diagram is displayed on the display; and displaying, on the display in response to determining the selection of the particular routable component occurs while the first routing diagram is displayed on the display, the particular routable component highlighted instead of un-highlighted, wherein: the particular routable component in the first routing diagram is highlighted when the selection of the first user-selectable control occurs; and the particular routable component in the second routing diagram is highlighted when displaying the second routing diagram in response to determining the selection of the first user-selectable control occurs.

EEE 39 is a method according to any one of EEE 1 to 38, wherein: displaying the first routing diagram includes displaying, within the first routing diagram, a second user-selectable control and a first portion of a second particular routable component, the second user-selectable control indicates that the second particular routable component continues on a third routing diagram, the second routing diagram is a member of the first set of routing diagrams or a second set of routing diagrams not including the first routing diagram, the third routing diagram is a member of the other of first set of routing diagrams or the second set of routing diagrams, and the first user-selectable control and the second user-selectable control include different symbols to distinguish the second routing diagram and the third routing diagram continue on routing diagrams contained in different sets of routing diagrams.

EEE 40 is a method according any one of EEE 1 to 39, wherein the first routing diagram includes a graphics file.

EEE 41 is a method according to EEE 40, wherein the graphics file includes a vector graphics file.

EEE 42 is a method according to EEE 41 wherein the vector graphics file is formatted as an SVG (Scalable Vector Graphics) file, an EPS (Encapsulated PostScript) file, a PDF (Portable Document Format) file, an AI (Adobe Illustrator Artwork) file, or a DXF (Drawing eXchange Format) file.

EEE 43 is a method according to EEE 40, wherein the graphics file includes a raster graphics file.

EEE 44 is a method according to EEE 43, wherein the raster graphics file is formatted as a BMP (bitmap) file, a TIF (Tagged Image File) file, a JPG (Joint Photographic Group) file, a JPEG (Joint Photographic Experts Group) file, a GIF (Graphical Interchange Format) file, or a PNG (Portable Network Graphic) file.

EEE 45 is a method according to any one of EEE 1 to 44, wherein the first routing diagram includes a first edge, a second edge, a third edge, a fourth edge, and a border area within the first routing diagram and adjacent the first edge, the second edge, the third edge, and the fourth edge.

EEE 46 is a method according to EEE 45, wherein the border area extends a first distance away from the first edge, a second distance away from the second edge, a third distance away from the third edge, and a fourth distance away from the fourth edge.

EEE 47 is a method according to EEE 46, wherein the first distance is defined as a first number of pixels, the second distance is defined as a second number of pixels, the third distance is defined as a third number of pixels, and the fourth distance is defined as a fourth number of pixels.

EEE 48 is a method according to EEE 46, wherein the first distance is defined as a percentage of a width dimension of the first routing diagram, the second distance is defined as a percentage of a height dimension of the first routing diagram, the third distance is defined as the percentage of the width dimension of the first routing diagram, and the fourth distance is defined as the percentage of the height dimension of the first routing diagram.

EEE 49 is a method according to any one of EEE 45 to 47, wherein the first user-selectable control is not located within the border area.

EEE 50 is a method according to any one of EEE 1 to 49, wherein first user-selectable control defines an area within the first routing diagram that is selectable by a user interface, and wherein the area within the first routing diagram includes a graphical icon and/or a textual description.

EEE 51 is a computing system comprising: one or more processors; and a non-transitory computer readable medium configured to store at least executable instructions, wherein the executable instructions, when executed by the one or more processors, cause the computing system to perform functions comprising: (i) displaying, on a display, a first routing diagram, wherein: the first routing diagram is a member of a first set of routing diagrams that includes multiple different routing diagrams, displaying the first routing diagram includes displaying, within the first routing diagram, a first user-selectable control and a first portion of a particular routable component, and the first user-selectable control indicates that the particular routable component continues on a second routing diagram; (ii) determining, by one or more processors, a selection of the first user-selectable control occurs while the first routing diagram is displayed on the display; and (iii) displaying, on the display in response to determining the selection of the first user-selectable control occurs while the first routing diagram is displayed on the display, the second routing diagram, wherein displaying the second routing diagram includes displaying a second portion of the particular routable component.

EEE 52 is a computing system comprising: one or more processors; and a non-transitory computer readable medium configured to store at least executable instructions, wherein the executable instructions are executable by the one or more processors to cause a computing system to perform functions comprising a method according to any one of EEE 1 to 50.

EEE 53 is a non-transitory computer readable medium having stored therein instructions executable by one or more processors to cause a computing system to perform functions comprising: (i) displaying, on a display, a first routing diagram, wherein: the first routing diagram is a member of a first set of routing diagrams that includes multiple different routing diagrams, displaying the first routing diagram includes displaying, within the first routing diagram, a first user-selectable control and a first portion of a particular routable component, and the first user-selectable control indicates that the particular routable component continues on a second routing diagram; (ii) determining, by one or more processors, a selection of the first user-selectable control occurs while the first routing diagram is displayed on the display; and (iii) displaying, on the display in response to determining the selection of the first user-selectable control occurs while the first routing diagram is displayed on the display, the second routing diagram, wherein displaying the second routing diagram includes displaying a second portion of the particular routable component.

EEE 54 is a non-transitory computer readable medium having stored therein instructions executable by one or more processors to cause a computing system to perform functions comprising a method according to any one of EEE 1 to 50.

65

What is claimed is:

1. A method comprising:

receiving, at one or more processors, a first routing diagram file and a second routing diagram file, wherein:

the first routing diagram file includes a first routing diagram and first metadata internal to the first routing diagram file, the first routing diagram is a member of a first set of routing diagrams that includes multiple different routing diagrams, the first routing diagram includes a first user-selectable control, a first portion of a particular circuit or line, and a first textual destination diagram identifier, the first textual destination diagram identifier indicates the particular circuit or line continues on a second routing diagram, the first user-selectable control and the first textual destination diagram identifier are distinct from the particular circuit or line on the first routing diagram, the first metadata includes an identifier of the first user-selectable control and a destination identifier of the second routing diagram, the first user-selectable control contacts the particular circuit or line on the first routing diagram, the second routing diagram file includes the second routing diagram, the second routing diagram includes a second user-selectable control, a second portion of the particular circuit or line, and a second destination diagram identifier, the second destination diagram identifier indicates the particular circuit or line continues on the first routing diagram, the second user-selectable control and the second destination diagram identifier are distinct from the particular circuit or line on the second routing diagram, and the second user-selectable control contacts the particular circuit or line on the second routing diagram;

displaying, on a display, the first routing diagram, wherein displaying the first routing diagram includes displaying, within the first routing diagram, the first user-selectable control, the first portion of the particular circuit or line, and the first textual destination diagram identifier;

determining, by one or more processors, a selection of the first user-selectable control occurs while the first routing diagram is displayed on the display;

determining, by the one or more processors in response to the selection of the first user-selectable control while the first routing diagram is displayed on the display, the destination identifier of the second routing diagram by referring to the first metadata of the first routing diagram; and displaying, on the display in response to determining the destination identifier of the second routing diagram by referring to the first metadata of the first routing diagram, the second routing diagram instead of the first routing diagram, wherein displaying the second routing diagram includes displaying, within the second routing diagram, the second user-selectable control, the second portion of the particular circuit or line, and the second destination diagram identifier, wherein:

the second user-selectable control is selectable to cause the first routing diagram to be displayed on the display again, and

the particular circuit or line represents a circuit or line within a vehicle.

2. A method according to claim 1, wherein the second routing diagram is a member of the first set of routing diagrams.

3. A method according to claim 2, wherein:

the multiple different routing diagrams are arranged according to a sequence of multiple routing diagrams, and the sequence of multiple routing diagrams includes at least one routing diagram between the first routing diagram and the second routing diagram.

4. A method according to claim 3, further comprising:

displaying, on the display, a second user-selectable control and a third user-selectable control, wherein:

a selection of the second user-selectable control signals the one or more processors to display an earlier diagram in the sequence of multiple routing diagrams compared to a currently-displayed diagram of the sequence of multiple routing diagrams, a selection of the third user-selectable control signals the one or more processors to display a later diagram in the sequence of multiple routing diagrams compared to the currently-displayed diagram of the sequence of multiple routing diagrams.

5. A method according to claim 2, wherein the first routing diagram includes one of the following: a first electrical wiring diagram, a first optical communication line diagram, a first hydraulic line diagram, a first pneumatic line diagram, or a first vacuum line diagram, wherein if the first routing diagram includes the first electrical wiring diagram, then the second routing diagram includes a second electrical wiring diagram, the first portion of the particular circuit or line represents a first portion of a particular electrical circuit, and the second portion of the particular circuit or line represents a second portion of the particular electrical circuit, wherein if the first routing diagram includes the first optical communication line diagram, then the second routing diagram includes a second optical communication line diagram, the first portion of the particular circuit or line represents a first portion of a particular optical communication line, and the second portion of the particular circuit or line represents a second portion of the particular optical communication line, wherein if the first routing diagram includes the first hydraulic line diagram, then the second routing diagram includes a second hydraulic line diagram, the first portion of the particular circuit or line represents a first portion of a particular hydraulic line, and the second portion of the particular circuit or line represents a second portion of the particular hydraulic line, wherein if the first routing diagram includes the first pneumatic line diagram, then the second routing diagram includes a second pneumatic line diagram, the first portion of the particular circuit or line represents a first portion of a particular pneumatic line, and the second portion of the particular circuit or line represents a second portion of the particular pneumatic line, or wherein if the first routing diagram includes the first vacuum line diagram, then the second routing diagram includes a second vacuum line diagram, the first portion of the particular circuit or line represents a first portion of a particular vacuum line, and the second portion of the particular circuit or line represents a second portion of the particular vacuum line.

6. A method according to claim 2, wherein:

the first user-selectable control corresponds to first metadata, the first metadata includes an identifier of the particular circuit or line circuit or line within the second routing diagram, and the method further comprises:

after determining the selection of the first user-selectable control occurs while the first routing diagram is displayed on the display, but before displaying the second routing diagram, determining, by the one or more processors based at least in part on the identifier of the particular circuit or line, the second portion of the particular circuit or line is within the second routing diagram.

7. The method of claim 6, further comprising:

receiving, at the one or more processors, a first vector graphics file including the first routing diagram and a second vector graphics file including the second routing diagram, wherein the first metadata is contained within the first vector graphics file.

8. A method according to claim 1, wherein:

the second routing diagram is a member of a second set of routing diagrams, the second set of routing diagrams includes one or more routing diagrams not contained in the first set of routing diagrams, and the second routing diagram is not a member of the first set of routing diagrams.

9. A method according to claim 8, wherein the first routing diagram includes one of the following: a first electrical wiring diagram, a first optical communication line diagram, a first hydraulic line diagram, a first pneumatic line diagram, or a first vacuum line diagram, wherein if the first routing diagram includes the first electrical wiring diagram, then the second routing diagram includes a second electrical wiring diagram, the first portion of the particular circuit or line represents a first portion of a particular electrical circuit, and the second portion of the particular circuit or line represents a second portion of the particular electrical circuit, wherein if the first routing diagram includes the first optical communication line diagram, then the second routing diagram includes a second optical communication line diagram, the first portion of the particular circuit or line represents a first portion of a particular optical communication line, and the second portion of the particular circuit or line represents a second portion of the particular optical communication line, wherein if the first routing diagram includes the first hydraulic line diagram, then the second routing diagram includes a second hydraulic line diagram, the first portion of the particular circuit or line represents a first portion of a particular hydraulic line, and the second portion of the particular circuit or line represents a second portion of the particular hydraulic line, wherein if the first routing diagram includes the first pneumatic line diagram, then the second routing diagram includes a second pneumatic line diagram, the first portion of the particular circuit or line represents a first portion of a particular pneumatic line, and the second portion of the particular circuit or line represents a second portion of the particular pneumatic line, or wherein if the first routing diagram includes the first vacuum line diagram, then the second routing diagram includes a second vacuum line diagram, the first portion of the particular circuit or line represents a first portion of a particular vacuum line, and the second portion of the particular circuit or line represents a second portion of the particular vacuum line.

10. A method according to claim 8, wherein each routing diagram of the first set of routing diagrams and each routing diagram of the second set of routing diagrams is a different routing diagram.

11. A method according to claim 8, wherein:

the first user-selectable control corresponds to first metadata, the first metadata includes an identifier of the second routing diagram, an identifier of the particular circuit or line on the second routing diagram, and an identifier of the second set of routing diagrams, and the method further comprises in response to determining the selection of the first user-selectable control occurs while the first routing diagram is displayed on the display:

requesting, by the one or more processors based at least in part on the identifier of the second routing diagram and the identifier of the second set of routing diagrams, the second routing diagram from a database;

determining, by the one or more processors, a path of the particular circuit or line on the second routing diagram; and displaying, on the display, the second routing diagram with the particular circuit or line on the second routing diagram highlighted along the path, and receiving the second routing diagram occurs in response to requesting the second routing diagram from the database.

12. A method according to claim 11, wherein the identifier of the particular circuit or line on the second routing diagram and the identifier of the second set of routing diagrams are distinct identifiers.

13. A method according to claim 11, wherein:

the first metadata further includes an identifier of a connectable component corresponding to the particular circuit or line, the second routing diagram includes the connectable component, and displaying the second routing diagram in response to determining the selection of the first user-selectable control occurs further includes displaying the connectable component highlighted.

14. A method according to claim 13, wherein:

second metadata corresponds to the connectable component, the second metadata includes an identifier of two or more circuits or lines, the two or more circuits or lines are represented in the second routing diagram as being connected to the connectable component, the two or more circuits or lines include the particular circuit or line, and displaying the second routing diagram in response to determining the selection of the first user-selectable control occurs further includes displaying the two or more circuits or lines highlighted.

15. A method according to claim 8, wherein the multiple different routing diagrams are arranged according to a first sequence, and wherein the second set of routing diagrams includes a plurality of different routing diagrams arranged according to a second sequence.

16. A method according to claim 1, wherein:

the first user-selectable control corresponds to first metadata, the first metadata includes an identifier of the particular circuit or line within the second routing diagram, and the method further comprises:

after determining the selection of the first user-selectable control occurs while the first routing diagram is displayed on the display, but before displaying the second routing diagram, determining, by the one or more processors based at least in part on the identifier of the particular circuit or line, the second portion of the particular circuit or line is within the second routing diagram.

17. A method according to claim 1, wherein:

the first user-selectable control corresponds to first metadata, the first metadata includes an identifier of the second routing diagram and an identifier of the particular circuit or line on the second routing diagram, and the method further comprises:

after determining the selection of the first user-selectable control occurs while the first routing diagram is displayed on the display, but before displaying the second routing diagram, requesting, by the one or more processors based at least in part on the identifier of the second routing diagram, the second routing diagram from a database;

searching, by the one or more processors, the second routing diagram to determine a path of the particular circuit or line on the second routing diagram; and displaying, on the display, the second routing diagram with the particular circuit or line on the second routing diagram highlighted, and receiving the second routing diagram occurs in response to requesting the second routing diagram from the database.

18. A method according to claim 17, wherein:

the second routing diagram includes a second user-selectable control, the second user-selectable control includes an indicator that indicates the particular circuit or line continues on the first routing diagram, the second user-selectable control corresponds to second metadata, and the second metadata includes an identifier of the first routing diagram and an identifier of the particular circuit or line on the first routing diagram.

19. A method according to claim 18, wherein the identifier of the particular circuit or line on the first routing diagram is different than the identifier of the particular circuit or line on the second routing diagram.

20. A method according to claim 18, further comprising:

determining, by one or more processors, a selection of the second user-selectable control occurs while the second routing diagram is displayed on the display;

after determining the selection of the second user-selectable control occurs while the second routing diagram is displayed on the display, but before displaying the first routing diagram again, retrieving, by the one or more processors based at least in part on the identifier of the first routing diagram, the first routing diagram from the database;

searching, by the one or more processors, the first routing diagram to determine a path of the particular circuit or line on the first routing diagram; and displaying, on the display, the first routing diagram with the particular circuit or line on the first routing diagram highlighted.

21. A method according to claim 20, wherein:

the first routing diagram includes a third user-selectable control, the third user-selectable control includes an indicator that indicates the particular circuit or line continues on a third routing diagram, the third routing diagram is a member of the first set of routing diagrams, the third user-selectable control corresponds to third metadata, the third metadata includes an identifier of the third routing diagram and an identifier of the particular circuit or line on the third routing diagram, and the method further comprises:

determining, by one or more processors, a selection of the third user-selectable control occurs while the first routing diagram is displayed on the display;

after determining the selection of the third user-selectable control occurs while the first routing diagram is displayed on the display, but before displaying the third routing diagram, retrieving, by the one or more processors based at least in part on the identifier of the third routing diagram, the third routing diagram from the database;

searching, by the one or more processors, the third routing diagram to determine a path of the particular circuit or line on the third routing diagram; and displaying, on the display, the third routing diagram with the particular circuit or line on the third routing diagram highlighted.

22. A method according to claim 21, wherein the identifier of the particular circuit or line on the first routing diagram is identical to the identifier of the particular circuit or line on the third routing diagram.

23. A method according to claim 18, wherein:

the second routing diagram is a member of a second set of routing diagrams, the second set of routing diagrams includes one or more routing diagrams not contained in the first set of routing diagrams, the second routing diagram is not a member of the first set of routing diagrams, the second routing diagram includes a third user-selectable control, the third user-selectable control includes an indicator that indicates the particular circuit or line continues on a third routing diagram, the third routing diagram is contained within the second set of routing diagrams, the third user-selectable control corresponds to third metadata, the third metadata includes an identifier of the third routing diagram and an identifier of the particular circuit or line on the third routing diagram, and the method further comprises:

determining, by one or more processors, a selection of the third user-selectable control occurs while the second routing diagram is displayed on the display;

after determining the selection of the third user-selectable control occurs, but before displaying the third routing diagram, retrieving, by the one or more processors based at least in part on the identifier of the third routing diagram, the third routing diagram from the database;

searching, by the one or more processors, the third routing diagram to determine a path of the particular circuit or line on the third routing diagram; and displaying, on the display, the third routing diagram with the particular circuit or line on the third routing diagram highlighted.

24. A method according to claim 23, wherein the identifier of the particular circuit or line on the second routing diagram is identical to the identifier of the particular circuit or line on the third routing diagram.

25. A method according to claim 17, wherein displaying the second routing diagram with the particular circuit or line on the second routing diagram highlighted includes displaying the particular circuit or line on the second routing diagram defined by a first stroke width, a first color, and a path and displaying highlighting defined by a second stroke width, a second color, an opacity value, and the path.

26. A method according to claim 1, wherein:

the first routing diagram includes a second circuit or line, the method further comprises:

determining, by the one or more processors, a selection of the first portion of the particular circuit or line and a selection of the second circuit or line occur while the first routing diagram is displayed on the display, displaying, in response to the selection of the first portion of the particular circuit or line, the first portion of the particular circuit or line as highlighted, and displaying, in response to the selection of the second circuit or line, the second circuit or line as highlighted.

27. A method according to claim 26, wherein a color of highlighting for the first portion of the particular circuit or line is different than a color of highlighting for the second circuit or line.

28. A method according to claim 1, wherein:

the first routing diagram includes a second circuit or line, a color of highlighting for the first portion of the particular circuit or line is different than a color of highlighting for the second circuit or line, and the method further comprises:

determining, by the one or more processors, a selection of the first portion of the particular circuit or line and a selection of the second circuit or line occur while the first routing diagram is displayed on the display;

displaying, in response to the selection of the first portion of the particular circuit or line, the first portion of the particular circuit or line as highlighted;

displaying, in response to the selection of the second circuit or line, the second circuit or line as highlighted; and determining, by the one or more processors, the color of highlighting for the first portion of the particular circuit or line and the color of highlighting for the second circuit or line based on an order of the selection of the first portion of the particular circuit or line and the selection of the second circuit or line.

29. A method according to claim 1, wherein displaying the second routing diagram includes displaying the second routing diagram instead of the first routing diagram.

30. A method according to claim 1, further comprising:

determining, by the one or more processors prior to determining the selection of the first user-selectable control occurs while the first routing diagram is displayed on the display, a selection of the particular circuit or line occurs while the first routing diagram is displayed on the display; and displaying, on the display in response to determining the selection of the particular circuit or line occurs while the first routing diagram is displayed on the display, the particular circuit or line highlighted instead of un-highlighted, wherein:

the particular circuit or line in the first routing diagram is highlighted when the selection of the first user-selectable control occurs; and the particular circuit or line in the second routing diagram is highlighted when displaying the second routing diagram in response to determining the selection of the first user-selectable control occurs.

31. A method according to claim 1, wherein:

displaying the first routing diagram includes displaying, within the first routing diagram, a second user-selectable control and a first portion of a second particular circuit or line, the second user-selectable control indicates that the second particular circuit or line continues on a third routing diagram, the second routing diagram is a member of the first set of routing diagrams or a second set of routing diagrams not including the first routing diagram, the third routing diagram is a member of the first set of routing diagrams or the second set of routing diagrams, whichever does not include the second routing diagram as a member and the first user-selectable control and the second user-selectable control include different symbols to distinguish the second routing diagram and the third routing diagram continue on routing diagrams contained in different sets of routing diagrams.

32. A method according to claim 1, wherein the first user-selectable control includes a graphical icon and one or more alphanumeric characters.

33. A method according to claim 32, wherein the one or more alphanumeric characters include a textual description of the second routing diagram, and/or wherein the graphical icon defines an area of the display that is selectable when the first routing diagram is displayed on the display.

34. A method according to claim 1, further comprising:

searching a computer-readable database for routing diagrams based on one or more search terms, wherein:

the one or more search terms include a vehicle identifier corresponding to a group of vehicles, the first set of routing diagrams correspond to the group of vehicles, and each vehicle of the group of vehicles includes separate instances of a circuit or line represented by the particular circuit or line within the first routing diagram and the second routing diagram, and separate instances of a component represented by a first vehicle component within the first routing diagram.

35. The method of claim 1, wherein displaying the second routing diagram further includes displaying a second vehicle component of the vehicle, and wherein the second portion of the particular circuit or line extends towards the second vehicle component of the vehicle.

36. The method of claim 1, wherein the first textual destination diagram identifier is contained within the first user-selectable control and the second destination diagram identifier is contained within the second user-selectable control.

37. A computing system comprising:

one or more processors; and a non-transitory computer-readable memory configured to store executable instructions, wherein the executable instructions, when executed by the one or more processors, cause the computing system to perform functions comprising:

receiving, at the one or more processors, a first routing diagram file and a second routing diagram file, wherein:

the first routing diagram file includes a first routing diagram and first metadata internal to the first routing diagram file, the first routing diagram is a member of a first set of routing diagrams that includes multiple different routing diagrams, the first routing diagram includes a first user-selectable control, a first portion of a particular circuit or line, and a first textual destination diagram identifier, the first textual destination diagram identifier indicates the particular circuit or line continues on a second routing diagram, the first user-selectable control and the first textual destination diagram identifier are distinct from the particular circuit or line on the first routing diagram, the first metadata includes an identifier of the first user-selectable control and a destination identifier of the second routing diagram, the first user-selectable control contacts the particular circuit or line on the first routing diagram, the second routing diagram file includes the second routing diagram, the second routing diagram includes a second user-selectable control, a second portion of the particular circuit or line, and a second destination diagram identifier, the second destination diagram identifier indicates the particular circuit or line continues on the first routing diagram, the second user-selectable control and the second destination diagram identifier are distinct from the particular circuit or line on the second routing diagram, and the second user-selectable control contacts the particular circuit or line on the second routing diagram;

displaying, on a display, the first routing diagram, wherein displaying the first routing diagram includes displaying, within the first routing diagram, the first user-selectable control, the first portion of the particular circuit or line, and the first textual destination diagram identifier;

determining, by one or more processors, a selection of the first user-selectable control occurs while the first routing diagram is displayed on the display; and determining, by the one or more processors in response to the selection of the first user-selectable control while the first routing diagram is displayed on the display, the destination identifier of the second routing diagram by referring to the first metadata of the first routing diagram;

displaying, on the display in response to determining the destination identifier of the second routing diagram by referring to the first metadata of the first routing diagram, the second routing diagram instead of the first routing diagram, wherein displaying the second routing diagram includes displaying, within the second routing diagram, the second user-selectable control, the second portion of the particular circuit or line, and the second destination diagram identifier, wherein:

the second user-selectable control is selectable to cause the first routing diagram to be displayed on the display again, and the particular circuit or line represents a circuit or line within a vehicle.

38. A non-transitory computer-readable memory having stored therein instructions executable by one or more processors to cause a computing system to perform functions comprising:

receiving, at the one or more processors, a first routing diagram file and a second routing diagram file, wherein:

the first routing diagram file includes a first routing diagram and first metadata internal to the first routing diagram file, the first routing diagram is a member of a first set of routing diagrams that includes multiple different routing diagrams, the first routing diagram includes a first user-selectable control, a first portion of a particular circuit or line, and a first textual destination diagram identifier, the first textual destination diagram identifier indicates the particular circuit or line continues on a second routing diagram, the first user-selectable control and the first textual destination diagram identifier are distinct from the particular circuit or line on the first routing diagram, the first metadata includes an identifier of the first user-selectable control and a destination identifier of the second routing diagram, the first user-selectable control contacts the particular circuit or line on the first routing diagram, the second routing diagram file includes the second routing diagram, the second routing diagram includes a second user-selectable control, a second portion of the particular circuit or line, and a second destination diagram identifier, the second destination diagram identifier indicates the particular circuit or line continues on the first routing diagram, the second user-selectable control and the second destination diagram identifier are distinct from the particular circuit or line on the second routing diagram, and the second user-selectable control contacts the particular circuit or line on the second routing diagram;

displaying, on a display, the first routing diagram, wherein displaying the first routing diagram includes displaying, within the first routing diagram, the first user-selectable control, the first portion of the particular circuit or line, the first textual destination diagram identifier;

determining, by one or more processors, a selection of the first user-selectable control occurs while the first routing diagram is displayed on the display; and determining, by the one or more processors in response to the selection of the first user-selectable control while the first routing diagram is displayed on the display, the destination identifier of the second routing diagram by referring to the first metadata of the first routing diagram;

displaying, on the display in response to determining the destination identifier of the second routing diagram by referring to the first metadata of the first routing diagram, the second routing diagram instead of the first routing diagram, wherein displaying the second routing diagram includes displaying, within the second routing diagram, the second user-selectable control, the second portion of the particular circuit or line, and the second destination diagram identifier, wherein:

the second user-selectable control is selectable to cause the first routing diagram to be displayed on the display again, and the particular circuit or line represents a circuit or line within a vehicle.

\* \* \* \* \*